(12) United States Patent
Savoye

(10) Patent No.: US 6,489,992 B2
(45) Date of Patent: Dec. 3, 2002

(54) LARGE FIELD OF VIEW CCD IMAGING SYSTEM

(75) Inventor: Eugene D. Savoye, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/731,259

(22) Filed: Dec. 6, 2000

(65) Prior Publication Data

US 2001/0019361 A1 Sep. 6, 2001

Related U.S. Application Data

(62) Division of application No. 09/263,433, filed on Mar. 4, 1999, which is a division of application No. 08/632,746, filed on Apr. 15, 1996, now Pat. No. 5,880,777.

(51) Int. Cl.[7] .................................................. H04N 5/225
(52) U.S. Cl. ........................................ 348/340; 348/373
(58) Field of Search ................................. 348/222, 241, 348/243, 244, 207, 311, 340, 315, 373, 374; 250/208.1, 208.2

(56) References Cited

U.S. PATENT DOCUMENTS 4,467,361 A * 8/1984 Ohno et al. ................. 348/340
6,122,009 A * 9/2000 Ueda .......................... 348/373
6,285,400 B1 * 9/2001 Hokari ........................ 348/374

OTHER PUBLICATIONS

Verly, Jacques G., Synthetic vision for Vechicle Guidance and Control, SPIE– The International Society for Optical Engineering, vol. 2463, p. 58–64.*

Barclay, Herbert T., The Swat Wavefront Sensor, The Lincoln Laboratory Journal, vol. 5 No. 1, p. 115–130.*

* cited by examiner

Primary Examiner—Andrew Christensen
Assistant Examiner—Rashawn N. Tillery
(74) Attorney, Agent, or Firm—Theresa A. Lober

(57) ABSTRACT

A CCD imaging system is provided, including a short focal length lens for accepting light from the scene to be imaged and a charge storage medium having a charge storage substrate that is curved in a selected nonplanar focal surface profile and located a selected distance from the lens with the focal surface facing the lens, the focal surface profile and the lens-to-substrate distance selected such that the light accepted by the lens is in focus at the position of the substrate. There is provided a support substrate on which the nonplanar charge storage substrate is supported to maintain the selected surface profile of the charge storage substrate. An array of pixels defined in the charge storage substrate by pixel interconnections is supported on the front side of the substrate, such that exposure of the substrate to light from the scene through the lens produces charge packets in the pixels, with the pixel interconnection providing selective electronic temporal control of transfer of charge packets from one pixel to another in the substrate. The invention provides a technique for suppressing dark current charge packet generation in the substrate pixels. An output circuit converts the charge packets in the pixels to an electrical pixel signal of output pixel values based on the light from the scene. A plurality of pixel values together form an image frame, the output pixel values being produced at a rate corresponding to the image frame rate, R.

3 Claims, 22 Drawing Sheets

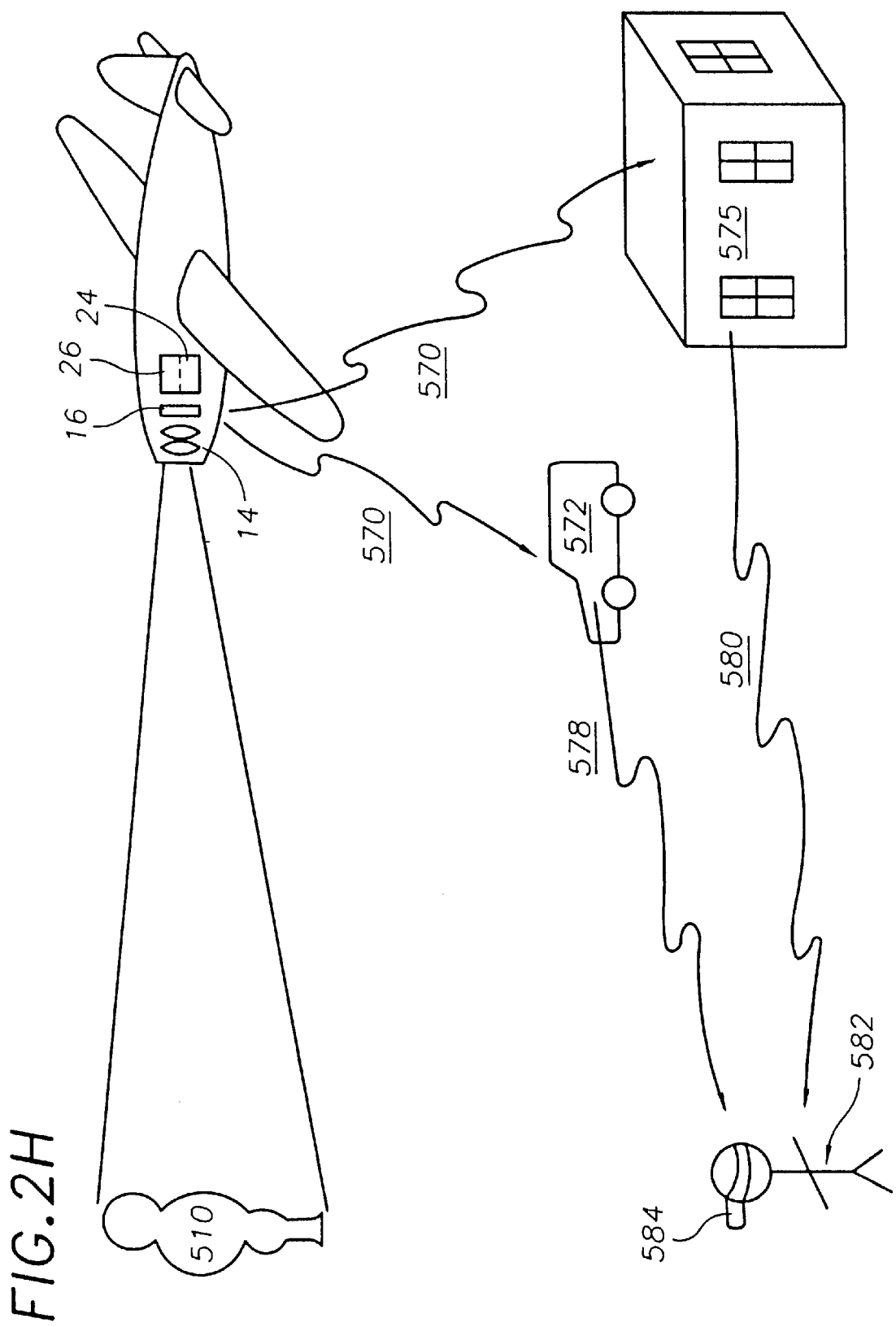

n-BURIED CHANNEL
p-SILICON SUBSTRATE

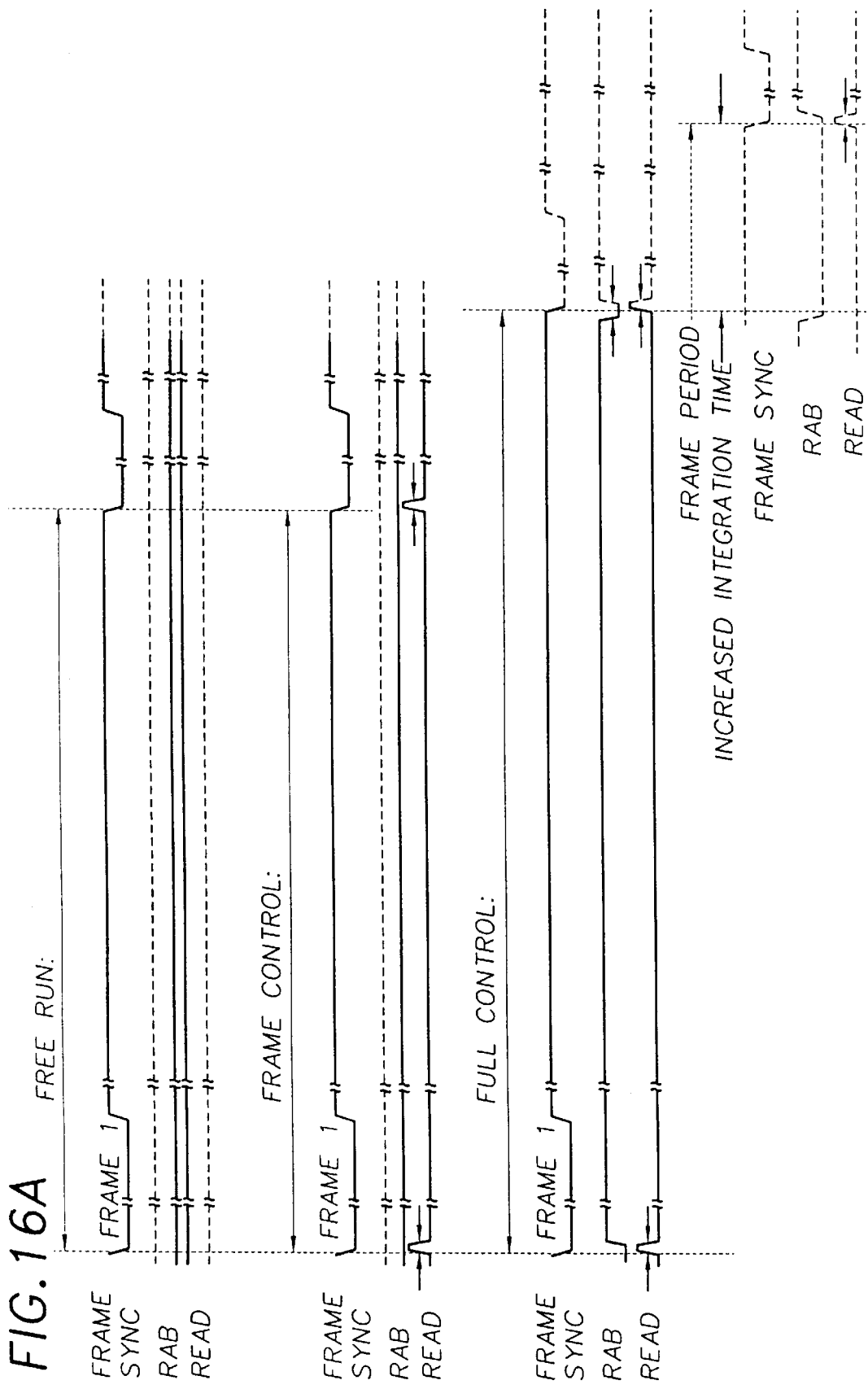

$G_S = \frac{1}{256}$

| 1 | 4 | 6 | 4 | 1 |
|---|---|---|---|---|
| 4 | 16 | 24 | 16 | 4 |
| 6 | 24 | 36 | 24 | 6 |
| 4 | 16 | 24 | 16 | 4 |
| 1 | 4 | 6 | 4 | 1 |

$G_S = \frac{1}{256}$ | 1 | 7 | 26 | 57 | 74 | 57 | 26 | 7 | 1 |

LARGE FIELD OF VIEW CCD IMAGING SYSTEM

This application is a divisional of application Ser. No. 09/263,433, filed Mar. 4, 1999, which in turn is a divisional of application Ser. No. 08/632,746, filed Apr. 15, 1996, now issued as U.S. Pat. No. 5,880,777.

GOVERNMENT RIGHTS IN THE INVENTION

This invention was made with support under Contract Number F19628-95-C-0002 awarded by the Air Force. The U.S. Government has certain rights in this invention.

FIELD OF THE INVENTION

This invention relates to digital imaging and image processing techniques, and more particularly relates to digital imaging of low-light-level scenes at real time video image display speeds.

BACKGROUND OF THE INVENTION

Imaging of low-light-level environments is an important capability for enabling military and law enforcement surveillance, aviation and automotive navigation, and for numerous industrial and consumer manufacturing and production processes, among other applications. For example, the conventional low-light-level imaging systems known as so-called night vision scopes are routinely employed as a principal means for enabling night time mobility and navigation by military personnel wearing helmet-mounted scopes while traveling on foot or navigating in a vehicle, e.g., a jeep, truck, helicopter or jet.

Historically, low-light-level imaging systems, including conventional night vision scopes, have been based on use of an electro-optic image sensor that provides a gain mechanism for amplifying ambient input light to produce an output image signal level that is adequate for visual display, e.g., either by a direct view display or, with the addition of an electronic imaging system, a remote view display. For example, in a typical electro-optic system such as a so-called intensifier tube imager, a lens is used to focus ambient light, such as moonlight or starlight reflected off of a scene, onto a photocathode in a vacuum tube, the photocathode being sensitive to, e.g., light from the yellow through near-infrared portion of the electromagnetic spectrum. Under application of a high voltage between the photocathode and a micro-channel plate also located in the vacuum tube, an input ambient photon incident on the photocathode causes emission of a single electron from the photocathode and acceleration of the electron toward the micro-channel plate. Upon striking the micro-channel plate, the single electron creates a cascade of many electrons, which together are accelerated toward a phosphor screen by a second applied voltage. The kinetic energy of the electrons striking the phosphor causes the phosphor to glow. This electron cascade mechanism results in amplification of the input ambient light, typically by about four orders of magnitude, to produce a visible image on the phosphor screen. The phosphor image exists only momentarily in the glow of the phosphor screen, and does not exist in a storable or readable form.

To produce a real-time electronic video image, which typically is set at a frame rate of about 30 frames/second, based on the optical images formed by an intensifier tube on a phosphor screen, it is common practice to optically couple the phosphor screen to a conventional charge-coupled-device (CCD) electronic imaging camera. Optical coupling is typically achieved using an intermediate coupling lens or an optical fiber taper bonded to the CCD and either bonded or integrally-connected to the intensifier tube phosphor screen. The resulting low-light video camera, or so-called intensified-CCD camera, relies entirely on the cascade gain mechanism of the intensifier tube to provide a phosphor image that is adequately amplified to be sensed by the conventional CCD imager.

Intensified-CCD cameras like the one described above, while capable of producing a real time low-light-level video sequence, have historically been severely restricted with regard to other performance criteria. In particular, the intra-scene dynamic range of an image produced by an intensified-CCD imaging system is severely limited by the image intensifier tube. Furthermore, image resolution is severely degraded at low light levels due to electronic noise associated with the intensifier tube cascading gain mechanism. This electronic noise adds background image intensity noise and can even "swamp" low intensity images, resulting in an output image that is a poor rendition of the imaged scene. Intensifier tube imagers not including a CCD electronic camera are of course also subject to the resolution and intra-scene dynamic range limitations imposed by the intensifier tube gain mechanism.

These limitations are exacerbated in imaging low-light-level scenes because the same scene may contain very low brightness areas as well as dramatic intra-scene intensity fluctuations due, e.g., to man-made light. But because intensifier tube imagers and intensified-CCD imaging systems intrinsically rely on the vacuum tube cascading gain mechanism for production of a viable phosphor image, the dynamic range limitation imposed by the gain mechanism must be accepted, resulting in either loss of darker areas in the scene or excessive blooming in the brighter areas of the scene. Blooming is here meant as a localized brightness saturation that spills over to other nearby areas. As a result, intensifier tube imagers and intensified-CCD imaging systems are restricted to relatively small dynamic range imaging; typically no more than about 200 gray levels can be enabled by even the best vacuum tube-based systems, and generally, far fewer gray levels span the restricted intra-scene dynamic range.

Additional inherent limitations of intensifier vacuum tube technology limit the overall performance of intensifier tube imagers and intensified-CCD imaging systems. For example, the finite time required for a phosphor image produced by an intensifier tube to dissipate from the phosphor results in deleterious image artifacts in a temporal sequence of images when there is motion in the scene. In addition, vacuum tubes, being formed of glass, are fragile, and therefore require special handling considerations for the image system in which they are incorporated. The photocathode and micro-channel plate used in the intensifier tube have relatively short life cycles, requiring frequent replacement and repair. Furthermore, vacuum tubes are relatively large in size, limiting the minimum overall imaging system size. Vacuum tubes are also relatively expensive, adding significant cost to the overall cost of the imaging system. Many other performance, handling, and packaging limitations are additionally imposed by the intensifier vacuum tube technology.

Another class of low-light-level imaging systems, known as so-called slow-scan or frame-integrating cameras, do not rely on a gain mechanism to amplify ambient light for producing a viable electronic image. Instead, a slow-scan camera typically includes only a CCD imager that in operation is exposed to a low-light-level scene for an extended period of time, i.e., seconds or longer, during which time the device accumulates a large number of photoelectrons; after a time period sufficient to accumulate an adequate photoelectron count, a viable electronic image can be produced by the CCD camera. This technique overcomes some of the practical limitations of intensifier tube imagers and intensified-CCD image systems, but is inherently limited to extremely slow image capture speeds. Slow-scan cameras thus cannot accommodate real time imaging for production of video sequences at rates even close to about 25–30 frames per second. Indeed, slow-scan cameras are typically used in applications that are not primarily time-sensitive; for example, being used in astronomical applications as an electronic substitute for long-exposure film photography through telescopes.

Many critical low-light-level surveillance and mobility applications require real time digital video imaging of night time scenes, e.g., air-land scenes, characterized by a large intra-scene dynamic range. But like the systems described above, conventional low-light-level imaging systems developed heretofore have provided only suboptimal performance under such complex conditions and are further restricted by additional performance and practical limitations that impede or inhibit a high level of operational performance in applications for which real time low-light-level imaging is critical.

SUMMARY OF THE INVENTION

The invention overcomes limitations of past low-light-level imagers to provide an imaging system that attains superior performance at real time speeds. In a first aspect, the invention provides an imaging system for imaging a scene to produce a sequence of image frames of the scene at a frame rate, R. The imaging system includes an optical input port for accepting input light from the scene and a charge-coupled imaging device including pixels configured in a charge storage medium, the charge-coupled imaging device located in relation to the input port such that input light from the scene impinges device pixels. The charge-coupled imaging device produces an electrical pixel signal of analog pixel values based on the input light. In the invention, an analog signal processor is connected to the charge-coupled imaging device for amplifying the pixel signal, and an analog-to-digital processor is connected to the analog signal processor for digitizing the amplified pixel signal to produce a digital image signal formatted as a sequence of image frames each of a plurality of digital pixel values and having a dynamic range of digital pixel values represented by a number of digital bits, B. Finally, the imaging system includes a digital image processor connected to the analog-to-digital processor for processing digital pixel values in the sequence of image frames to remap the dynamic range of the frames to a compressed dynamic range of remapped pixel values represented by a number of digital bits, D, where D is less than the number, B. A sequence of output image frames of remapped pixel values representative of the imaged scene are thereby produced at the frame rate, R, with a latency time of no more than about 1/R.

In preferred embodiments, the imaging system includes a display connected to receive the output image frame sequence and to display the sequence at the frame rate, R. Preferably, the digital image processor of the imaging system consists of a center-surround-shunt processor for adaptively enhancing contrast of digital pixel values from the analog-to-digital processor based on values of neighboring pixels in an image frame, and for adaptively normalizing the enhanced pixel values such that the enhanced pixel values are within a compressed and normalized dynamic range. The digital image processor further preferably includes a statistics processor for acquiring pixel value statistics about the digital pixel values from the analog-to-digital processor and for acquiring pixel value statistics about the enhanced and normalized pixel values from the center-surround-shunt processor, and a remapping function processor for constructing a pixel value remapping function based on the pixel value statistics acquired by the statistics processor, the remapping function constituting a rule for remapping the enhanced and normalized pixel values from the center-surround-shunt processor to a selected output dynamic range represented by the number of digital bits D. The digital image processor further preferably includes a remap processor for applying the remapping function from the remapping function processor to the enhanced and normalized pixel values from the center-surround-shunt processor to produce a sequence of output image frames of remapped pixel values representative of the imaged scene. Preferably, the remapping function processor constructs a pixel value remapping function for a given image frame before pixel values in that frame are processed by the center-surround-shunt processor.

In other preferred embodiments, the number of digital bits, B, representing the dynamic range of digital pixel values produced by the analog-to-digital processor is greater than 8 and the number of digital bits, D, representing the compressed dynamic range of remapped pixel values is no larger than 8; preferably the frame rate, R, is at least about 25 frames per second.

In another aspect, the invention provides an imaging system for imaging a scene to produce a sequence of image frames of the scene at a frame rate, R, of at least about 25 image frames per second. The imaging system includes an optical input port for accepting input light from the scene and a charge-coupled imaging device having an array of pixels configured in a charge storage medium. The charge-coupled imaging device is located in relation to the input port such that input light from the scene impinges device pixels, such that the charge-coupled imaging device produces an electrical pixel signal of analog pixel values based on the input light. An analog signal processor is connected to the charge-coupled imaging device for amplifying the pixel signal, and an analog-to-digital processor is connected to the analog signal processor for digitizing the amplified pixel signal to produce a digital image signal formatted as a sequence of image frames each of a plurality of digital pixel values and having a dynamic range of digital pixel values represented by a number of digital bits, B, where B is greater than 8. A digital image processor is connected to the analog-to-digital processor for processing digital pixel values in the sequence of image frames to produce an output image frame sequence at the frame rate, R, representative of the imaged scene, with a latency of no more than about 1/R.

In the invention, the output image frame sequence is characterized by noise-limited resolution of at least a minimum number, $N_M$, of line pairs per millimeter, referred to the charge-coupled imaging device pixel array, in an imaged scene as a function of illuminance of the input light impinging the charge-coupled imaging device pixels. For a scene characterized by a contrast of about 0.3, for a human observation time of about 0.05 seconds, and for an image scene frame rate of about 30 frames per second, $N_M$ is given as $N_M = 1900 \, L^{0.51}$, where L is the value of illuminance of the input light impinging the charge-coupled imaging device pixels, for at least one illuminance value between a range of illuminance values of about $1 \times 10^{-2}$ LUX and $5 \times 10^{-7}$ LUX.

In preferred embodiments of the invention, L, the illuminance of the input light impinging the charge-coupled imaging device pixels, ranges between about $1\times10^{-3}$ LUX and $1\times10^{-6}$ LUX. Preferably, the frame rate, R, is at least about 30 frames per second. In preferred embodiments, the optical input port comprises a lens, and a display is connected to receive the output image frame sequence and to display the sequence at the frame rate, R. In other embodiments, the digital image processor and the display are in communication with but located remote from the charge-coupled imaging device and the analog-to-digital processor; alternatively, the charge-coupled imaging device, the analog-to-digital processor, and the display are in communication with but located remote from the digital image processor and a power supply. In other embodiments, a communication link is connected to the digital image processor for transmitting to a remotely located receiver the sequence of output image frames; a user controller is preferably included for controlling the frame rate, R, and resolution of the imaging system, within operational limits of the imaging system.

In other embodiments, the charge-coupled imaging device pixels are configured in a charge storage substrate having a front side supporting pixel interconnections and a back side having no substantial topology, with buried channels in the substrate defining charge packet storage wells for the pixels. Preferably the charge-coupled imaging device is located in relation to the optical input port such that input light from the scene impinges the back side of the substrate. In other preferred embodiments, the substrate is a silicon substrate characterized by a resistivity of at least about 1000 $\Omega$-cm.

Preferably, the electrical pixel signal of pixel values has a dynamic range of at least about 1000 distinct pixel value levels and most preferably a dynamic range of at least about 3000 distinct pixel value levels.

In other embodiments, the configuration of pixels in the charge storage substrate is configured as an imaging pixel array on which input light impinges to produce charge packets in the buried channels of the imaging array pixels and a frame storage pixel array shielded from impinging input light, charge packets in the imaging pixel array being transferred to the frame storage pixel array for producing an electrical pixel signal of analog pixel values based on the input light. Preferably, the imaging pixel array consists of an array of electronically-shuttered pixels, each pixel in the array being selectively electronically controllable by the pixel interconnections to inhibit storage of charge packets in the buried channel of that pixel while input light impinges the charge-coupled imaging device.

In other preferred embodiments, the pixel interconnections supported on the front side of the charge storage medium define a three-phase clocking configuration for transferring charge packets in the buried channels; and the pixel interconnections supported on the front side of the charge storage substrate provide interconnections for selective electronic transfer of a charge packet in a given pixel of the imaging pixel array to an adjacent pixel located in a different row of the imaging pixel array, and provide interconnections for selective electronic transfer of a charge packet in a given pixel in the imaging array to an adjacent pixel located in a different column of the imaging pixel array. In other embodiments, charge packets resident in a portion of the pixels in the frame storage pixel array are summed prior to production of an electrical pixel signal of analog pixel values.

In other preferred embodiments, the pixels of the charge-coupled imaging device are configured in a charge storage medium comprising a substrate that is curved in a selected nonplanar focal surface profile and located a selected distance from the lens with the focal surface facing the lens, the focal surface profile and lens-to-substrate distance selected such that the input light is in focus at the location of the substrate. Preferably, a cooling device is provided in contact with the charge storage substrate to suppress dark current charge packet generation in pixels of the charge-coupled imaging device. The cooling device preferably consists of a thermo-electric cooling device.

In another aspect, the invention provides an imaging system having optical input port for accepting input light from the scene, a first charge-coupled imaging device having pixels configured in a charge storage medium and located in relation to the input port such that at least a central field-of-view region of the input light impinges device pixels to produce an electrical central field-of-view pixel signal of analog pixel values based on the input light, and a second charge-coupled imaging device having pixels configured in a charge storage medium and located in relation to the input port such that at least a peripheral field-of-view region of the input light impinges device pixels to produce an electrical peripheral field-of-view pixel signal of analog pixel values based on the input light. An image processor is connected to receive the central field-of-view pixel values and peripheral field-of-view pixel values to amplify and digitize the pixel values and to blend the central field-of-view pixel values with the peripheral field-of-view pixel values to produce a sequence of composite image frames, each composite image frame having digital central field-of-view pixel values in a central region of the composite image frame and having digital peripheral field-of-view pixel values surrounding the central region to form a peripheral region of the composite image frame. The sequence of composite image frames is produced at the frame rate, R, with a latency time of no more than about 1/R.

In preferred embodiments, a display is connected to receive the sequence of composite image frames and display the sequence at the frame rate, R, with the central image region of each composite image frame displayed at unity magnification and the peripheral image region of each composite image frame displayed at a magnification less than unity. Preferably, the display subtends a field of view, with respect to a display viewer, that exceeds the field of view subtended by the central image region, and preferably, the central image region subtends an angle of at least about 30 degrees and the peripheral image region subtends an angle of at least about 80 degrees.

In preferred embodiments, the system includes a field-of-view separator aligned with the optical input port for directing the central field-of-view region of the input light to the first charge coupled imaging device and for directing the peripheral field-of-view region of the input light to the second charge coupled imaging device; the system also preferably includes a long focal length lens located between the field-of-view separator and the first charge-coupled imaging device to focus the central field-of-view region of the input light onto the first charge-coupled imaging device; and a short focal length lens located between the field-of-view separator and the second charge-coupled imaging device to focus the peripheral field-of-view region of the input light onto the second charge-coupled imaging device.

The invention provides, in another aspect, a charge-coupled imaging device for imaging a wide field-of-view scene to produce a sequence of image frames of the scene at an image frame rate, R, the imaging device consists of a short focal length lens for accepting light from the scene to be imaged and a charge storage medium consisting of a charge storage substrate having a front side and a back side, the charge storage substrate being curved in a selected nonplanar focal surface profile and located a selected distance from the lens with the focal surface facing the lens, the focal surface profile and lens-to-substrate distance selected such that the light accepted by the lens is in focus at the position of the substrate. A support substrate is provided on which the nonplanar charge storage substrate is supported to maintain the selected surface profile of the charge storage substrate. An array of pixels is defined in the charge storage substrate by pixel interconnections supported on the front side of the substrate, exposure of the substrate to light from the scene through the lens producing charge packets in the pixels, the pixel interconnections providing selective electronic temporal control of transfer of charge packets from one pixel to another in the substrate. Means for suppressing generation of dark current charge packet generation in the substrate pixels is provided, as well as an output circuit for converting the charge packets in the pixels to an electrical pixel signal of output pixel values based on the light from the scene, a plurality of pixel values together forming an image frame, the output pixel values being produced at a rate corresponding to the image frame rate, R.

The invention further provides a charge-coupled imaging device consisting of a charge storage medium comprising a substrate having a front side and a backside, pixels defined in an array of pixel rows and pixel columns in the charge storage substrate by a plurality of columns of buried channels in the substrate and by a plurality of rows of pixel gates on the substrate over the buried channel columns. A channel stop region is provided in the substrate between and at the periphery of the columns of buried channels, and a serial output register is defined by a row of register gates on the substrate over the buried channels and adjacent to the last pixel row in the pixel array. The output register includes an output stage defined by an output stage gate at the end of the register gate row and a corresponding output stage buried channel comprising an end column of the plurality of buried channel columns, the output stage buried channel extending to the output stage gate. A charge-collection junction is provided adjacent to the output stage gate and defined by a p/n junction in the substrate for collecting charge generated in the array of pixels and output at the output stage gate.

An output stage charge funnel is located between the output stage gate and the charge-collection junction for funneling charge in the output stage buried channel to the charge-collection junction. The output stage charge funnel is defined by a buried implant having a first width at the end of the buried channel and a second width at the charge-collection junction, the first width being larger than the second width.

Preferably, an output circuit is connected to the charge-collection junction for converting the collected charge to an electronic representation of a scene being imaged, the output circuit including a capacitor, an output transistor, and a reset transistor all located in the substrate. The capacitor is connected to the charge-collection junction for producing a voltage corresponding to a given amount of charge collected at the charge-collection junction. The reset transistor is defined by a reset gate and a reset buried channel in the substrate and extends between a reset transistor bias contact and the reset gate. A charge funnel is located between the reset gate and the charge-collection junction for draining charge from the output stage capacitor after the output circuit has produced an electronic representation for a given amount of charge collected at the charge-collection junction.

The reset charge funnel is defined by a buried implant having a first width at the end of the reset buried channel and a second width at the charge-collection junction, the first width being larger than the second width. Preferably, the charge-collection junction consists of a dopant region in the substrate, dopant in the region provided by diffusion of dopant from a doped conducting layer deposited over the charge-collection junction location into the substrate under the conducting layer at the charge-collection junction location.

BRIEF DESCRIPTION OF THE DRAWINGS

FIG. 2H shows a diagrammatic representation of a multi-site embodiment of the imaging system of the invention;

FIG. 16A shows timing diagrams for controlling the CCD imager of the invention;

DETAILED DESCRIPTION

Figure 1:
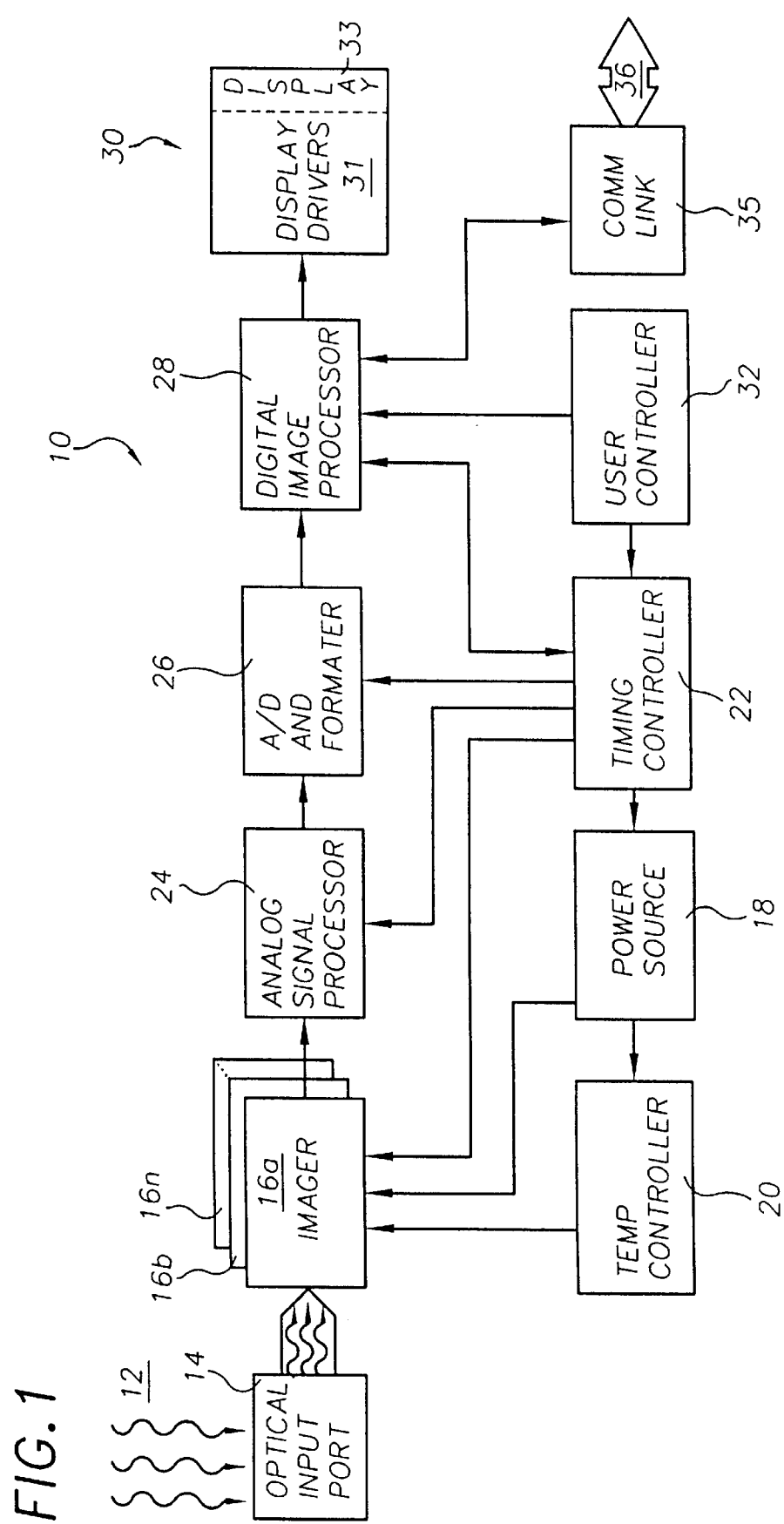
FIG. 1 shows an operational block diagram of an imaging system in accordance with the invention.

A low-light-level imager in accordance with the invention provides high performance imaging of low-light-level scenes such that a high degree of image data can be perceived by human viewing of the scenes, and does so without the limitations imposed by prior low-light-level imagers. Referring to FIG. 1, this is accomplished in the invention by an imaging system 10 that inherently does not require a gain mechanism to adequately image a low-light-level scene and that can image such a scene at speeds commensurate with real time digital video rates. Real time digital video rates are here meant to correspond to video frame rates of greater than about 25 frames/second, and preferably to correspond to rates at least as high as the U.S. standard television frame rate, which is about 30 frames/ second. The low-light-levels accommodated by the imaging system of the invention can correspond to low brightness, low contrast, scenes such as night time scenes illuminated primarily by moonlight, starlight, or even overcast starlight, or day time scenes in foggy, smoky, hazy, or other such low contrast environments.

As shown in FIG. 1, the imaging system 10 accepts ambient input light 12 from a scene. The input light 12 is accepted at an optical input port 14 that admits the light and directs the light to one or more imagers 16a, 16b, . . . 16n. As explained below, the optical input can consist of a lens, transparent window, beam splitter, mirror, or other optical element.

Each imager 16 consists of a solid-state charge-coupled-device (CCD) that provides high optical sensitivity, low image noise generation, and quite large intra-scene dynamic range capabilities, among a host of other important features, that together enable the imager to sense the input light 12 without first amplifying the input light and to image the input light at real time frame speeds. Details of the imager and its operation will be described later in the discussion. The imager 16 is powered by a power source 18, which can consist of a battery or other portable power supply or a fixed power supply. The power source 18 also provides power to a temperature controller 20 connected to the imager 16 for controlling the temperature of the imager. Power can be supplied to the remaining components of the system from those components having direct connection to the power supply, or can be directly connected to the power supply.

The power source 18 additionally provides power to a timing controller 22, which controls the initiation and synchronization of the various functions of the imaging system. The timing controller sets the speed of the input light acquisition operations conducted by the imager 16, as well as the other imaging functions.

Once input light is acquired by the imager 16, one or more analog electronic signals corresponding to the input light are produced by an analog signal processor 24 connected to the output of the imager. The one or more analog electronic signals are then converted to corresponding digital electronic signals by one or more analog-to-digital converters (A/D) and image formatters 26, which also multiplex and/or format the signal or signals, which represent pixel values, into a two dimensional image frame of pixel values. A digital image processor 28 accepts the digital electronic signal and processes the signal to enhance and further format the signal for electronically displaying an image, e.g., a two-dimensional image, of the acquired input light on a display 33 connected to the digital image processor by way of suitable display drivers 31. The timing controller 22 coordinates the sequential processing of the acquired input light through the processors based on input to the timing controller from the digital image processor.

Optionally, a user controller 32 is provided to enable a user to set various operational parameters of the imaging system. For example, the user controller can provide user control of the imager frame rate and spatial resolution, the brightness and contrast of the display, processing parameters of the digital image processor, as well as other processing parameters. Finally, a communications link 35 is provided for, e.g., sending acquired images as image data 36 to a remote location, as well as for receiving image data to be locally displayed. Each of the interconnected imaging system components will be described in turn in detail below.

The imaging system of the invention can be embodied in a wide range of component and portable housing configurations that enable many local- and remote-access low-lightlevel imaging scenarios, thereby accommodating a wide number of custom requirements for various specific imaging applications. In particular, the components of the imaging system can be segmented into local and remote components, depending on the intended imaging application.

Figure 2A:
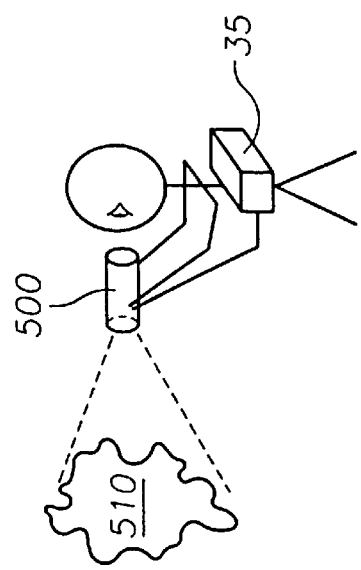
FIG. 2A shows a diagrammatic representation of a hand-held embodiment of the imaging system of the invention.
Figure 2B:
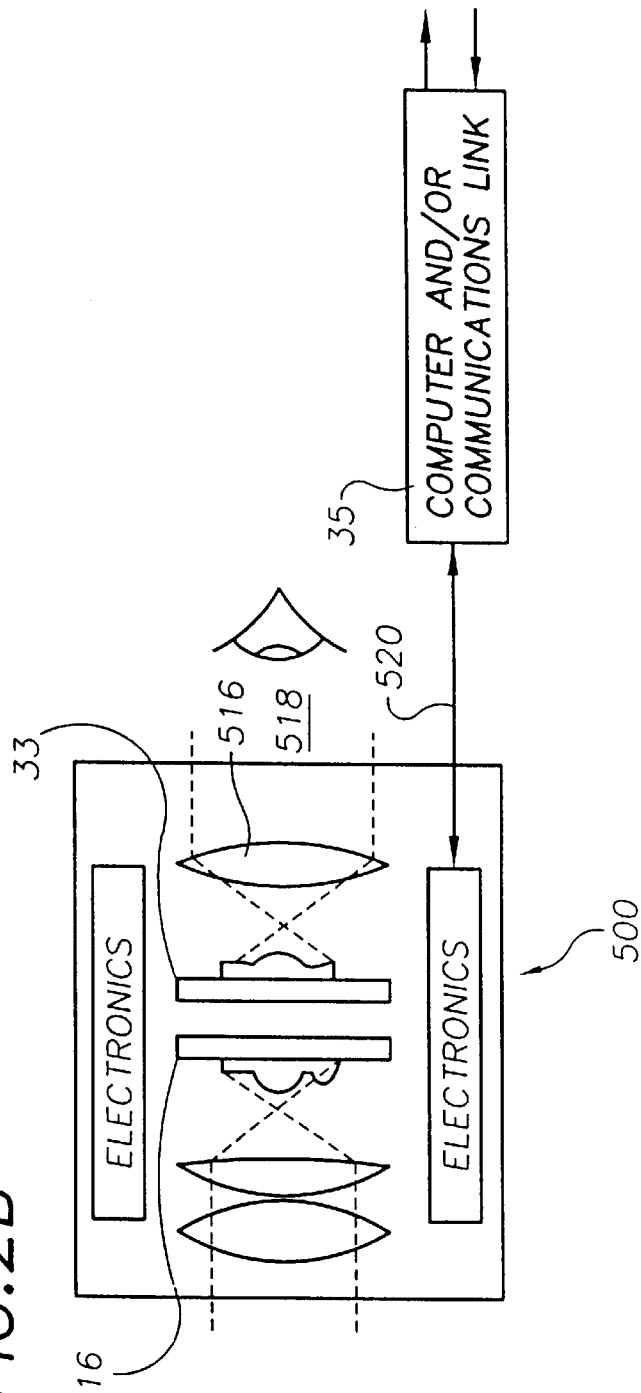
FIG. 2B shows an operational block diagram of the embodiment of the imaging system of FIG. 2A.

Referring to FIG. 2A, in a first example configuration of the imaging system of the invention, the system is embodied as a hand-held imaging scope 500. Here the operator holds the scope to image a scene 510 that may not be visible to the naked eye due to low-light-level conditions. Referring also to FIG. 2B, the scope 500 includes all electronics and an imager 16, as well as the display 33 and an output lens 516 for allowing the operator to focus his gaze 518 on the display. The scope unit is connected by way of, e.g., a wire 520 to the communications link unit 35 for sending and receiving image data.

Figure 2C:
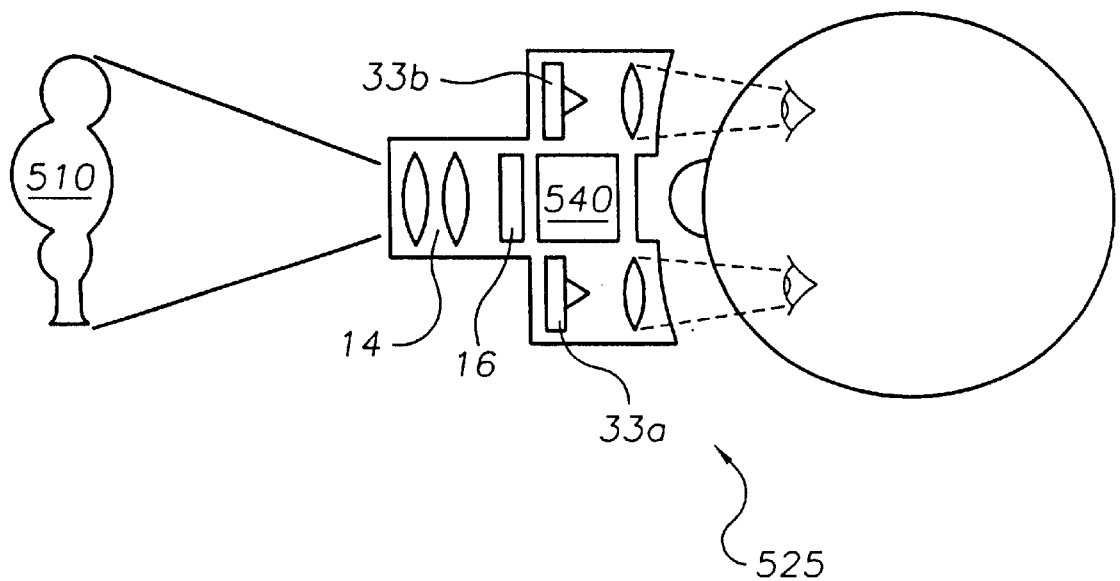
FIGS. 2C–2D show diagrammatic representations of biocular and binocular embodiments of the imaging system of the invention, respectively.
Figure 2D:
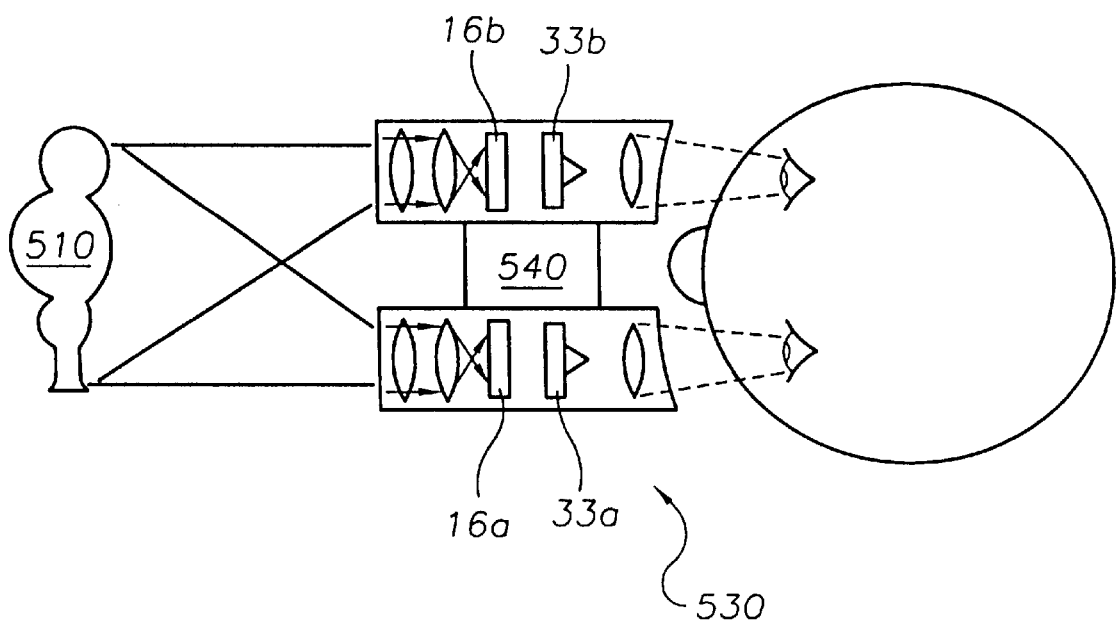

In two similar configurations, shown in the top-down views of FIGS. 2C and 2D, the imaging system can be housed as a head or helmet-mounted scope or goggle. For example, the system can be configured with one imager (16a in FIG. 1) as a monocular system, or as in FIG. 2C, a biocular system 525 having one imager 16 and two displays 33a, 33b, or finally, as in FIG. 2D, configured with two imagers 16a, 16b and two displays 33a, 33b, as a binocular system 530. In these two examples, the minimum required electronics 540 are included in the scope housings to minimize weight; other electronics, power, and other components can in these examples be housed in, e.g., a belt pack, body pack, or remotely, as discussed below.

Figure 2E:
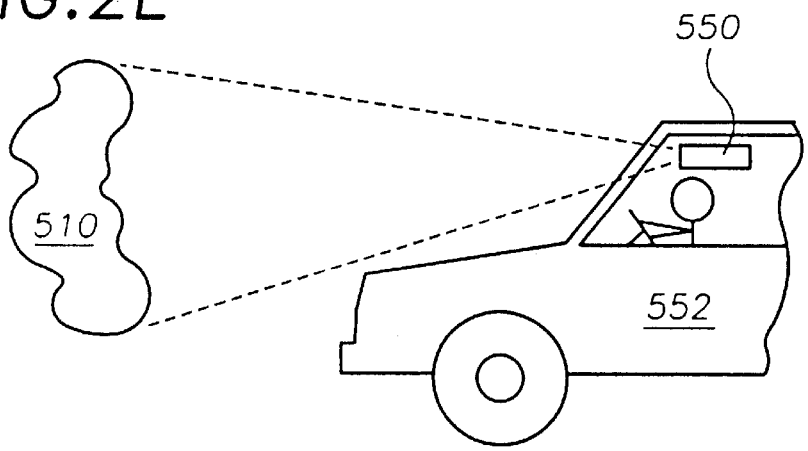
FIG. 2E shows a diagrammatic representation of a first vehicle-mounted embodiment of the imaging system of the invention.
Figure 2F:
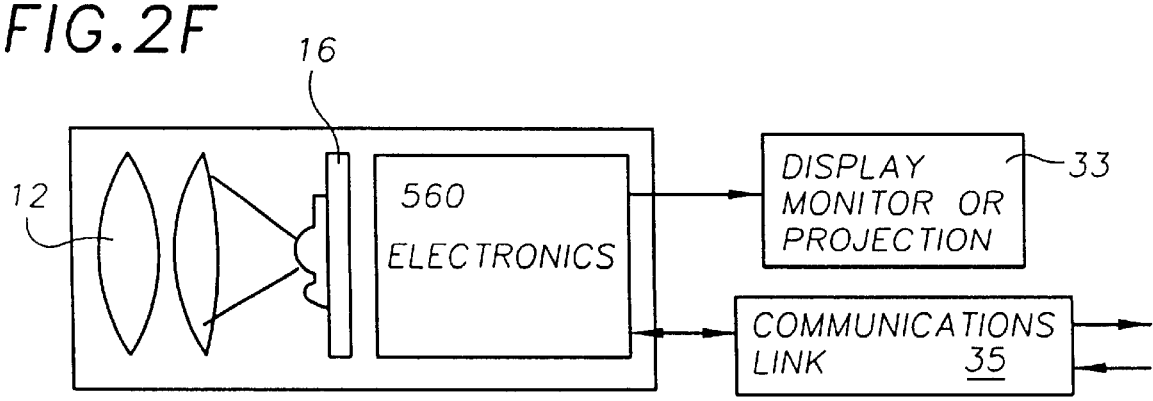
FIG. 2F shows an operational block diagram of the embodiment of the imaging system of FIG. 2E.

The imaging system can also be configured and housed for mounting on objects. For example, the system can be mounted for use as a sight on a weapon or other object for which viewing of a scene is employed to enable functioning of the object. Referring to FIG. 2E, the imaging system can be configured as a vehicle-mounted system 550, wherein the system is mounted internal to the vehicle 552 behind a transparent window that allows ambient external light to be acquired by the imaging system located, e.g., behind a vehicle windscreen such as the front window. As shown in FIG. 2F, the system here is configured with the optical input 12, imager 16, and electronics 560 in a single housing, with the display 33 and communications link 35 possibly located at other points in the vehicle. For example, the display 33 can be configured as a monitor mounted, e.g., in the fashion of a conventional rear view mirror or other configuration, or as a monitor that projects the displayed image onto the front window, or as a heads-up display or a head-mounted display. The communication link can be employed here for transmitting an acquired image to, e.g., one or more other vehicles or stationary command and control centers for display on those vehicles' and centers' display hardware. Examples of other vehicles contemplated by the invention include all types of ground vehicles, maritime vessels or submersible underwater vessels, air or space vehicles, or other vehicular means.

Figure 2G:
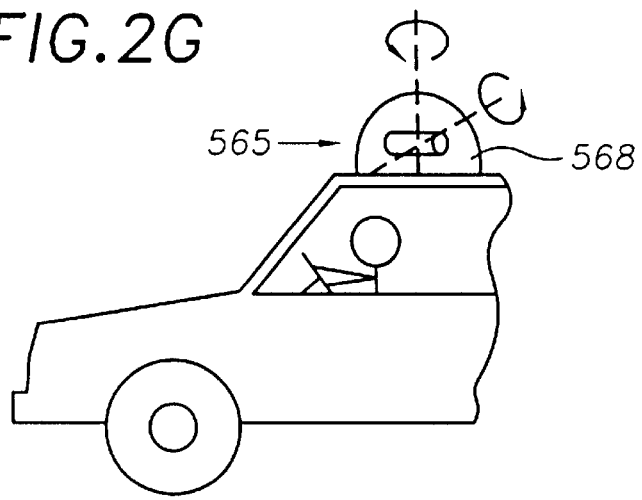
FIG. 2G shows a diagrammatic representation of a second vehicle-mounted embodiment of the imaging system of the invention.

In an alternative vehicle mounting scheme, as shown in FIG. 2G, the system can be configured as a gimbaled system 565 mounted in, e.g., a pod 568 or turret external to a vehicle, with the display and communications link located at other points, e.g., inside the vehicle. In this configuration, the display consists of, e.g., a head-mounted display and the imager is mounted on a motorized gimbal apparatus which in turn is slaved to the users' head orientation as a function of movement of the head-mounted display. The display can also be embodied as a helmet-mounted or other suitable display configuration.

As illustrated by the examples just described, various components of the imaging system can be partitioned and remotely located from other of the system components; this affords great flexibility in configuring the system for various applications. In general, only the optical input 14 of the system, such as a lens, and the system imager 16 need be in a fixed spatial relationship relative to each other, that relationship being one which accommodates acceptance of ambient light through the optical input 14 and focusing of it onto the imager 16. The remaining components can be housed in any convenient fashion. Of the other components, only the one or more analog signal processors 24 and one or more A/D converters need be relatively close to the imager 16 to accept the electronic image data from the imager. All other components can be located and housed remotely from the imager and remotely from each other, with the restriction that the method and type of interconnection between the components maintain sufficient signal integrity between the components to preserve operability of the overall system. Wires, optical fibers and accompanying electro-optic converters, transceiver systems supporting radio signal transmission, or other signal transmission and reception interconnection modes can be employed to interconnect remote components of the imager system.

Considering examples of other remote image system configurations in accordance with the invention, in one scenario, an unmanned, remotely-controlled vehicle is outfitted with a housing that supports the optical input, imager, analog signal processor, and A/D converter in forward position or external to the vehicle, with the power source, controllers, and other processors located internal to the vehicle. One or more displays are remotely connected to the internal-vehicle processors by, e.g., radio transmission. This configuration enables real time navigation of an unmanned vehicle from a remote location as the vehicle traverses an environment that is imaged by the imaging system to produce a view of the navigation scene to a human operator at a distant location. In a configuration similar to that shown in FIG. 2E, all system components except the display are located inside a manned or unmanned vehicle behind a transparent window, and the displayable image produced by the system is transmitted to one or more remote displays that can each be fixed or themselves roving. In this configuration, the digital image processor can be employed to provide adaptive local control of the imaging system without the need for local human control.

In another configuration, the optical input, imager, analog signal processor and A/D components of the imaging system are together located in a manned or unmanned land, air, water, or space vehicle, with the remaining components located remotely at a fixed ground station position. Digital image data acquired by the vehicular imager is sent to the processing components at the ground station, where a displayable image is produced. A display may be located at the ground station, but one or more displays can also be located remote from the ground station and connected to the processing equipment in a suitable manner. With this configuration, a roving vehicle can facilitate imaging with a minimum of on-board weight and space dedicated to the imaging components, while the remote processing station provides processing and distribution of the corresponding image to one or more display locations.

An example of this scenario is shown in FIG. 2H. Here, an unmanned air vehicle acquires an image of a scene 510 using the optical input 14, imager 16, analog signal processor 24, and A/D converter 26. The resulting digital data 570 is transmitted to a ground vehicle 572 and command station 575, for digital image processing and display; each location might, in one scenario, perform different digital processing to obtain different kinds of image data. The two digitally processed signals 578, 580 might then be transmitted to a remote operator 582, wearing a head-mounted display 584, or employing another suitable display mechanism to facilitate his actions.

As is apparent from this discussion, the invention contemplates many system configurations and is not limited to a particular system configuration or component segmentation scenario. All that is required of a given component configuration is adequate intra-system component interconnection that supports operability and cooperation of the components to produce a viable displayed image. Whatever component and housing configuration is used, the housing preferably is compact and light-weight, and preferably consists of strong, rugged material that is impervious to the environment, e.g., by being water resistant. The housing should also preferably provide good shielding from atmospheric electrical noise. These various housing characteristics are provided by, e.g., conventional military-grade housing materials. Electrical wiring, optical fiber, and other interconnections are also preferably shielded by suitable cabling to render the interconnections impervious to the environment.

A wide range of display hardware is contemplated by the invention. The real time digital video images produced by the imaging system are suitable for any display system that is compatible with standard electronic image data. For example, grayscale monitors, color monitors, cathode ray tubes, solid-state displays such as liquid crystal, electroluminescent, or other solid-state displays, projection displays, microelectromechanical displays, or other suitable displays, of any size, can be employed in the imaging system. In any case, the display can be located near and possibly in alignment with the optical input and imager components of the imaging system, as in a hand-held, head-mounted, goggle, or weapon sight configuration. Alternatively, as discussed above, the display can be located remotely from the imager and possibly also remotely from the other system components. Whatever spatial configuration is selected, any number of local and any number of remote displays can be connected in parallel for simultaneous and parallel viewing on multiple displays.

Turning now to a detailed discussion of the other components provided in the imaging system of the invention, the first of those components, the optical input 14 (FIG. 1) is embodied as a suitable transparent window or lens based on a given optical specification for the system and a given housing configuration. A lens input can consist of a planar or curved geometry or multi-element lens system. For example, in the imaging systems described above, the optical input preferably consists of a high-quality lens with a focal length that is sufficient to accommodate a field of view of interest. An example lens suitable for the imaging system is characterized by a focal length of about 25 mm, a T-number of about 1.35, subtending about a 40 degree central field of view.

The field of view of the imaging system of the invention is set by the field of view of the optical input of the system. For example, a relatively wide field of view, e.g., 100 degrees of view, can be obtained with a corresponding 100 degree field of view simple lens of suitable focal length. Although a wide field of view simple lens compromises various performance aspects of the imaging system and may require a multi-element lens system to correct for any field distortions that are incurred by the simple lens, such a lens can be used with the system if necessary. It is preferred, however, that a curved, short focal length lens be employed for enabling imaging of a wide field of view. An embodiment of the imaging system of the invention tailored to a wide field of view application through use of a curved lens and curved imager will be described in detail later in the discussion.

Referring back to FIG. 1, the ambient input light acquired by the imaging system optical input port 14 is directed to the one or more imagers 16. Each imager preferably consists of a CCD that is a thinned, back-illuminated, multi-ported frame transfer device employing narrow-trough buried channel MOS structures and buried contact interconnections. This CCD configuration, as provided by the invention and in conjunction with the analog signal processor described below, enables the imaging system of the invention to achieve significantly better low-light-level imaging performance than conventional electro-optic intensifier tube-based imaging systems. The imaging system CCD provides a peak quantum efficiency greater than about 90%, imaging speeds compatible with real time video sequence speeds of about 30 frames/second, broad spectral sensitivity of about 0.3 $\mu$m–1.1 $\mu$m, high spatial resolution, and optical sensitivity even in overcast starlight. Importantly, the imaging system CCD enables viable low-light-level imaging with an enormous intra-scene dynamic range, e.g. of about 60,000 grayscale levels for a 16 bit digital image signal. The imaging system CCD also provides electronic shuttering and anti-blooming capability as well as near-ideal modulation transfer function characteristics.

Figure 3A:
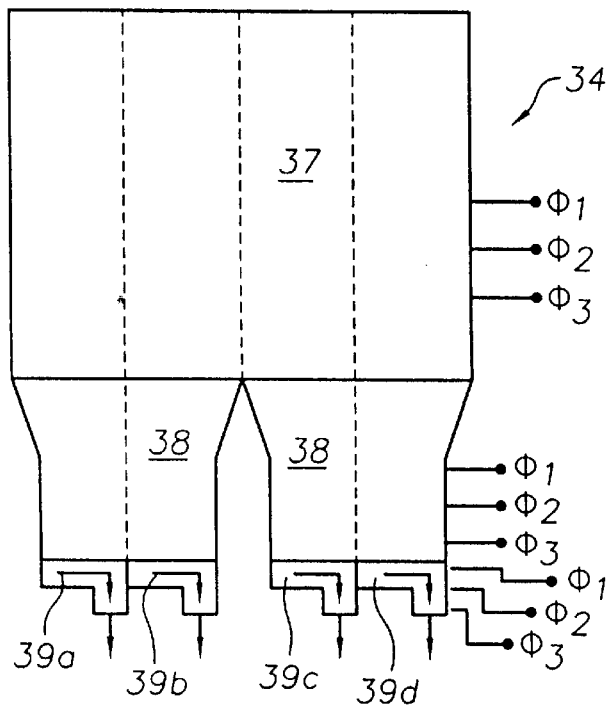
FIG. 3A shows a diagrammatic representation of a CCD imager in accordance with the invention.

As shown in FIG. 3A, the CCD imager 34 includes an image area 37 of imaging pixels and an adjacent frame-store area 38 of frame charge storage pixels. Imaging pixels in the imaging area 37 and frame storage pixels in the frame-store area 38 are aligned in rectangular arrays as is conventional; in an example of a particularly advantageous CCD imager configuration in accordance with the invention, the imaging array and frame-store array each include a 640×480 array of pixels that are segmented into four vertical regions, one for each of four outputs ports, as described below. It is the CCD imaging array 37 to which ambient input light is directed by the imaging system optical input; the imaging array 37 is thus preferably in corresponding and unobstructed alignment with the optical input port. The frame storage array is covered by an opaque light shield, e.g., a layer of metal, as described below, to prevent input light from impinging the frame storage array 38. A number of extra rows of pixels (not shown), for example, four extra pixel rows, are preferably included between the imaging and frame storage arrays to compensate for any lateral alignment mismatch between the light shield and the underlying frame storage pixel array. A number of extra columns of pixels (not shown), for example, two extra pixel columns, are preferably included on each side of the imaging array to collect edge-generated dark current, i.e., current generated due to ambient thermal conditions rather than an optical input.

Briefly describing the general operation of the CCD imager, photons that enter the low-light-level imaging system through the optical input port and are incident on pixels of the imaging pixel array generate packets of photoelectrons, in the silicon of each image array pixel, that are collected in a conventional manner based on the three clocked voltages. After a period of time provided for integration of the collected photoelectron charge packets, the charge packets are rapidly transferred from the imaging pixel array columns to the frame-store pixel array columns in parallel. Then during a next sequential integration period, during which incident light generates fresh photoelectron charge packets, charge packets already in the frame storage pixel array are transferred into output registers, described below.

The extra rows of pixels preferably provided between the imaging and frame storage pixel array compensate for so-called transfer smear that can occur as charge packets are transferred from the imaging array to the frame storage array. Transfer smear occurs when the charge packets are transferred through a pixel located in correspondence with a very bright region in the image area on their way to the frame storage array. The bright region generates additional charge, so-called transfer smear charge, in the charge packets of all pixels moving through the given pixel. The extra rows of pixels enables the transfer smear charge to be sampled from each pixel column, thereby providing the ability to detect and cancel the transfer smear in later signal processing stages.

Figure 3B:
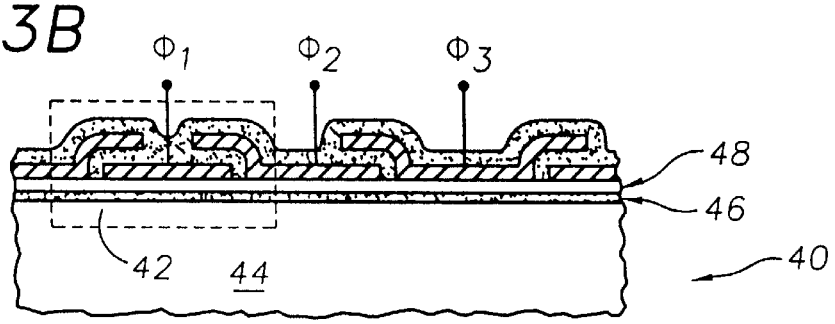
FIG. 3B shows a cross-sectional view of a three-phase CCD pixel in accordance with the invention.

Both the imaging pixels and frame storage pixels preferably are each defined by three adjacent conducting gate structures, e.g., a polysilicon gate structures, as is conventionally provided in a so-called metal-oxide-semiconductor (MOS) structure, in a three-phase configuration that is controlled by three clocked voltages, $\phi_1$, $\phi_2$, and $\phi_3$, in the usual manner. An example pixel configuration for a CCD imager in accordance with the invention is shown in FIG. 3B. The pixel 40 is defined by three adjacent MOS structures, like the left-most structure 42, each MOS structure including a gate electrode for connection to a corresponding phase voltage, $\phi_1$, $\phi_2$, and $\phi_3$, for controlling the potential well in the silicon substrate 44 under the gate electrodes. Preferably, the substrate region is adapted, as described in the fabrication sequence below, to provide a buried channel region, rather than a surface channel region, in which charge packets are held in the MOS structures. Also, the gate electrodes are preferably insulated from the substrate by a layer of silicon dioxide 46 and a layer of silicon nitride 48, as described in the fabrication sequence below.

Preferably, the buried channel regions of the pixels are isolated by channel stop implant regions that run parallel to the direction of charge flow in the buried channels and define the edges of the channels. In one suitable configuration in accordance with the invention, the channel stop regions are defined by a configuration that also provides blooming control of the imaging array pixels. Blooming is the well-known phenomenon in which an image of a bright object, under pixel overload conditions, results in an apparent size increase of the object in the resulting image. This is a result of accumulation of an amount of charge in a given pixel that exceeds the charge packet well capacity of the buried channel of the pixel. When this occurs, the charge in excess of the well capacity spreads into adjacent pixel wells, thereby increasing the apparent size of the bright object that produced the excess charge. In severe cases, blooming can affect a large fraction or even all of an image, making it impossible to view faint imagery in the same scene. Blooming control is thus important for enabling viable imaging of a low-light-level scene that includes a wide intra-scene dynamic range.

Figure 4A:
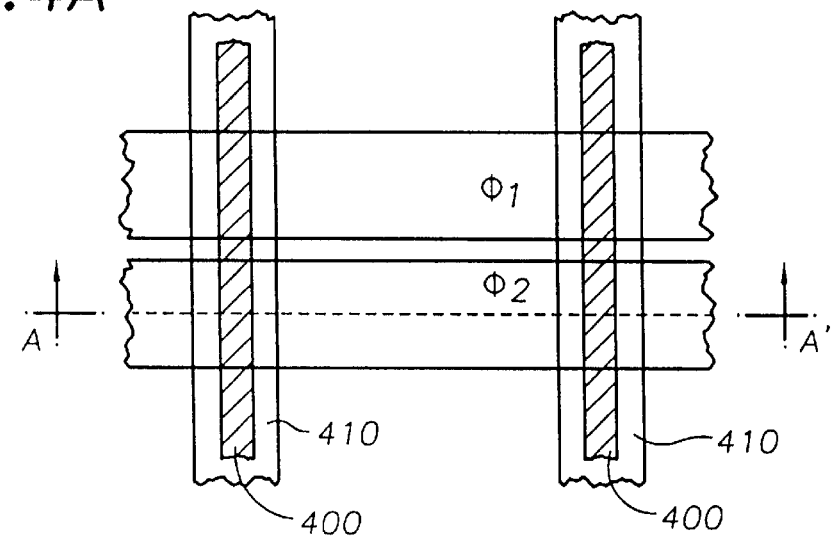
FIGS. 4A–4C show a top plan view, a cross-sectional view along line A-A', and a potential well diagram corresponding to the cross-sectional view, respectively, for a blooming drain configuration in accordance with the invention.
Figure 4B:
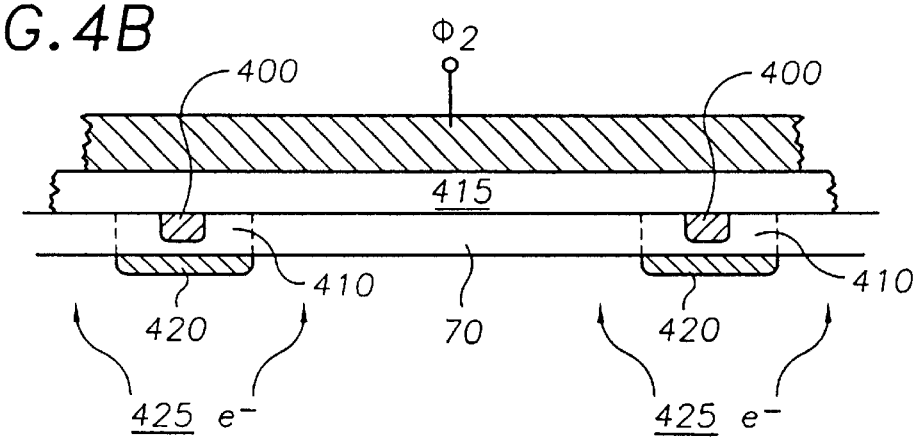
Figure 4C:
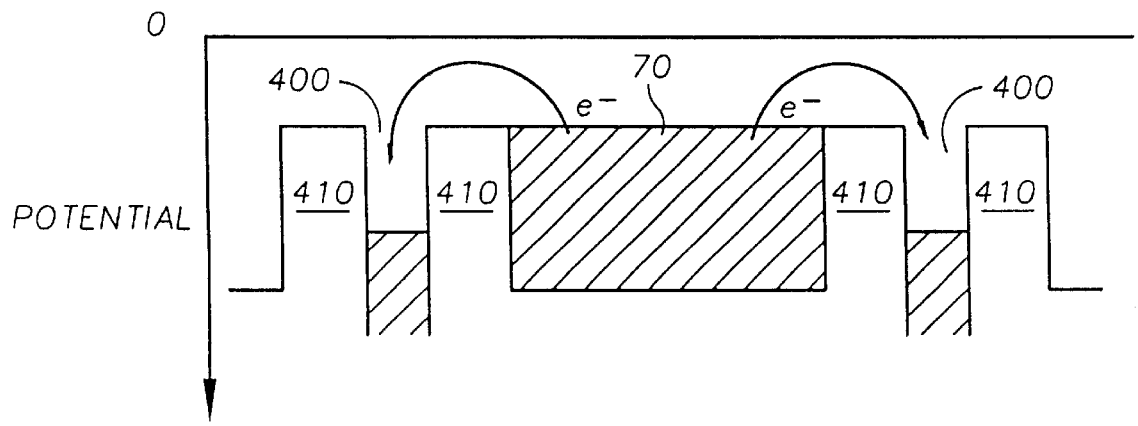

Referring to FIGS. 4A, 4B, and 4C, there is shown a pixel blooming control configuration employed in the invention to also provide channel stop functionality. This particular configuration accommodates back side illumination of the pixels, which as mentioned above, is the preferable mode of imager illumination. Details of the back side illumination mode will be presented below. FIG. 4A shows two MOS gates, $\phi_1$ and $\phi_2$, of a three-phase pixel on the front side of a substrate. In place of conventional channel stops, blooming drains 400, each flanked on both sides by blooming barriers 410 are provided. In an example case of an n-channel CCD imager, the blooming drains are heavily doped n-type regions. The blooming barriers are regions of doping different from that of the buried channel 70, and the barrier doping is selected based on a desired mode of operation, as explained below.

FIG. 4B, a cross section taken along A-A' in FIG. 4A, shows the insulating layer 415 separating the $\phi_2$ phase gate, as well as the blooming drains and blooming barriers defined along the buried channel 70. Continuing with the n-channel example, a heavily-doped p-type region 420 is provided underneath the blooming drains and blooming barriers. In operation, these p-type regions deflect photoelectrons $e^-$ 425 flowing from the illuminated back side of the substrate toward the buried channel. In the absence of this barrier the blooming drains could collect a significant number of photoelectrons; this of course is undesirable because it would reduce the quantum efficiency of the imager.

FIG. 4C is a potential diagram corresponding to the cross sectional view of FIG. 4B for illustrating the operation of the blooming drains and blooming barriers. In operation, the blooming drain is set to some positive bias, e.g., several volts. For a given pixel gate voltage, the potential well in the substrate will be deeper, i.e., more positive, in the buried channel region 70 than in the blooming barrier regions 410, whereby the blooming barriers serve as channel stops. In other words, the blooming barriers define the walls of the charge packet potential well in the buried channel.

As the buried channel potential well fills with charge, a point can be reached at which the well is effectively "full" and no additional charge can be stored in the well; in this case, as shown in FIG. 4C, the excess charge flows over the blooming barriers 410 and into the blooming drain 400. Connections to the blooming drains at the periphery of the imager provide a means for collecting this excess charge. Thus, the blooming drain configuration provides both channel stop and anti-blooming functionality. As will be recognized by those skilled in the art, other channel stop and anti-blooming configurations are also suitable.

Turning back to the pixel configuration, the pixel dimensions can be of any suitable size, with the caveat that smaller sizes limit the size of charge packets produced by a given pixel. In one example, the image pixels are about 12.7 $\mu$m×12.7 $\mu$m, and the rows of frame storage pixels decrease in both horizontal and vertical dimensions, say by about 10% smaller; this is schematically shown in FIG. 3A, where the two left-most frame storage array segments branch out from the two right-most frame storage array segments due to increasingly smaller frame storage pixel sizes. This shrinking of the frame storage array pixels provides especially good accommodation of four output registers and ports, as discussed below. Other pixels sizes and output porting schemes are within the scope of the invention, however, and no particular pixel sizing or output porting configuration is required.

Returning to the CCD imager configuration, in one example configuration, as shown in FIG. 3A, four output registers 39a, 39b, 39c, and 39d, are employed. A portion of the charge packets in a full width of each frame-store pixel row is loaded into each register during one output transfer, based on the number of stages provided in each register. In the example scenario given above of a 640×480 image pixel array size, each register includes 160 stages and thus each vertical pixel array segment includes 160 charge packets. 160 pixel-wide packet rows in each segment are therefore transferred into the corresponding output register at one time. As explained in detail below, the design of the registers includes several specific features to limit the amount of noise generated during the charge transfer process.

Each of the registers comprises a row of gates in alignment with the last row of frame storage pixel gates in the pixel array segment just above a given register. A row of frame storage pixel charge packets clocked vertically into a given serial register is then shifted horizontally to output the charge packets in sequence. In a preferable design, the so-called configuration of binning is accommodated by the output registers. Vertical binning entails accumulation of two or more charge packets from adjacent pixel rows in a given pixel column in each register stage to form, e.g., a double-sized register stage charge packet before the charge packets are delivered serially to the output circuit; this effectively sums the two or more pixel rows in the charge domain. To enable this operation, the register preferably consists of a buried channel region that is twice or more the channel width of that of the image and frame storage pixels. The binning operation is inherently free of noise generation because the summing occurs in the charge domain, and provides the ability to greatly increase the frame speed of the CCD imager.

As will be understood by those skilled in the art, horizontal binning can also be accommodated to sum adjacent pixel charge packets in a given pixel row of a register. In this case, no special structure is needed to sum the charge packets; instead, the output circuit, described below, is controlled such that two or more adjacent charge packets are dumped onto the output node of the register before the output circuit accepts the charge. In a more flexible and in some cases preferable method of horizontal binning, a summing gate is provided between the last serial register stage and the output gate. The summing gate is biased to collect two or more consecutive charge packets transferred to it by the serial register. After the last charge packet is summed, the summing gate is clocked to deliver the summed charge packet past the output gate to the output circuit.

Horizontal and vertical binning of an image array can be employed to improve the resolution capability of the imager under low light level conditions in which the resolution is limited by the noise of the system rather than the geometry of the pixels. Even with a double-width register channel for accommodating vertical binning, the CCD imager can be operated in a normal mode without the charge summing process.

Figure 3C:
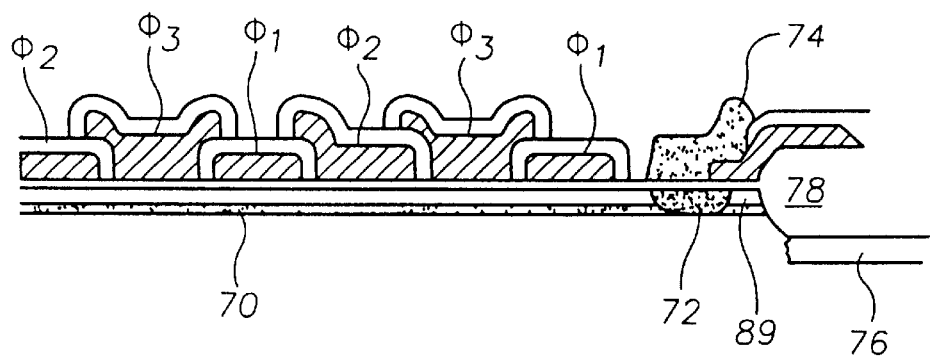
FIG. 3C shows a cross-sectional view of a CCD charge collection node and its vicinity in accordance with the invention.

Turning to output operation of the imager, charge packets in a given register stage are clocked, e.g., in a three-phase manner, out of the register and directly to an output circuit located on the substrate with the image pixel array and frame storage pixel array. This is accomplished using an output diode, as shown in FIG. 3C, which illustrates the three-phase register stages at the end of a register. The buried channel 70, defined by a dopant implant as described below, is aligned with an output diode 72 formed of an additional dopant region of the same dopant type to form a p/n junction at a point beyond the last serial register stage. A metal interconnection 74 makes contact to the p/n junction region for transferring the charge to a sense node of the output circuit, described below. At the end of the row, a channel stop implant 76 and field oxide region 78 provide isolation of the buried channel.

Figure 5:
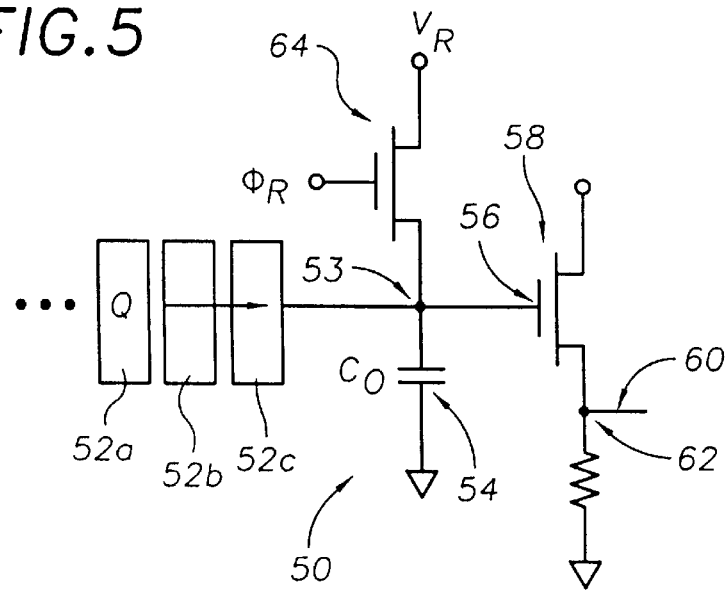
FIG. 5 is a circuit diagram for a CCD imager output circuit in accordance with the invention.

Referring also to FIG. 5, an output circuit 50 at the output of each output register converts the transferred charge to a voltage, thereby producing four parallel analog electronic pixel signals that represent the light input to the imaging system. This output circuit is preferably fabricated on the same silicon substrate as the pixel arrays. The charge-to-voltage conversion process proceeds as follows. A charge packet Q is transferred through the register stages; the last three register gate stages 52a, 52b, 52c, are shown in the figure. The last register stage gate provides an output from the register to the sense node 53 of the circuit, which has a capacitance, $C_o$, 54; this node 53 is also connected to the gate 56 of an output field effect transistor (FET) 58 preferably operated in a source-follower mode. The charge packet Q delivered to the capacitance 54 produces a voltage corresponding to the amount of charge in the packet, thereby producing an analog output signal 60 at a node 62 of the FET that corresponds to the input charge packet. The output signal 60 is then delivered to the analog signal processor of the imaging system.

Once an output signal 60 has been developed for a given packet of charge, the charge is drained from the node capacitance 54 to reset the capacitor for the next incoming charge packet. This reset is controlled by a reset FET 64, the gate of which is controlled by a clocked reset voltage, $\phi_r$, and the drain of which is connected to a dc bias voltage $V_R$.

The design and fabrication of the output circuit, output registers, and pixel arrays of the CCD imager are customized to significantly limit the noise and boost the imaging performance of the CCD imager. Two primary results of the design features are very high quantum efficiency and very low output signal noise; these two conditions enable operation of the imaging system of the invention at significantly improved performance levels and frame speeds compared to conventional low-light-level imaging systems. In a first of the customizations, mentioned previously, all of the pixel MOS structures and output circuit FETs are fabricated with a buried channel. A buried channel, as opposed to a conventional surface channel, can be biased by the gate electrodes into an electronic potential regime where the current flowing through the channel is kept away from the surface. This limits the amount of trapping of charge carriers in the channel due to interaction of the carriers with surface states of the substrate in which the channel is formed. The buried channel configuration is also exploited to allow for spacing of the gate away from the drain in the FETs to limit gate-drain capacitance, as described in detail below.

In a further enhancement, an additional implant step, described below, can be employed in the fabrication sequence to define a narrow trough region in the center of the buried channel along its length to further limit the exposure of a charge packet to the surrounding silicon substrate. In this case, the trough implant preferably consists of a narrow implant of the buried channel species, thereby producing a narrow charge confinement channel. This trough provides a deeper potential well than the surrounding channel region, resulting in a tendency for the charge to spatially remain in the area of the trough. In this configuration, the probability of encounters between the photoelectronic charges and trap sites in the substrate is reduced. This is particularly beneficial for very small charge packets that without the channel trough would tend to spread across the full width of the channel and generate trap-related noise charge.

In a next preferred design configuration, the image pixels are provided with electronic shutter mechanisms that eliminate image degradation caused by smearing of an acquired image, in which, as explained previously, charge packets acquire additional charge as they are transferred through one or more pixels corresponding to a very bright region of an image on their way from the imaging array to the frame storage array. The shutter mechanism also enables resolution of incident optical pulses that are closely spaced in time. In addition, the electronic shutter can provide real time acquisition of images of fast-moving objects, with reduced blurring, by enabling a very short exposure time.

Electronic shutters are employed in the CCD imager of the invention to effectively close off the image pixel array to the collection of photoelectrons generated by the incident light during a portion or the entire duration of the time required to transfer all of the charge packets from the image pixel array to the frame storage pixel array. This limits the amount of charge that is integrated into the image pixel charge packets to eliminate the possibility of smearing of an image and to enable very high speed image capture.

Figure 6A:
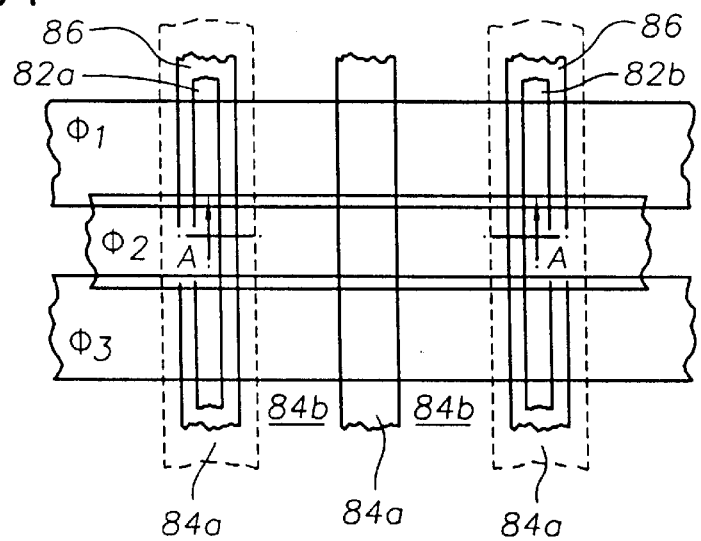
FIGS. 6A and 6B show a top plan view and cross-sectional view along line A-A', respectively, for an electronic pixel shutter in accordance with the invention.
Figure 6B:
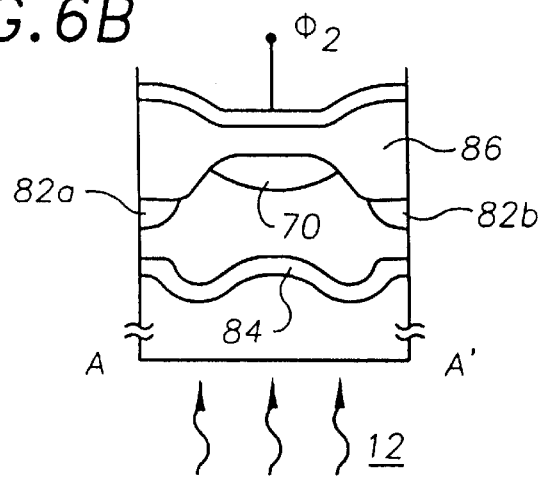

Referring to FIGS. 6A and 6B, two structures are employed in the invention to provide electronic shuttering of the image pixels. These structures are based on the back side-illuminated CCD mode mentioned previously.

As shown in FIGS. 6A and 6B, the three-phase pixel includes, e.g., an n-type buried channel 70 over which the three phase gate electrodes, designated as $\phi_1$, $\phi_2$, and $\phi_3$ run in a perpendicular fashion. The additional shutter structures include an $n^+$ shutter drain 82a, 82b, on each side of the buried channel, and a stepped p-type buried layer 84 extending across the width of the pixel. In FIG. 6A, the three relatively shallow regions of the buried layer are designated as 84a and the two relatively deep regions of the buried layer are designated as 84b. Blooming barrier channel stops 86 are also shown; these define the extent of one pixel along the three gates. Shutter drain electrodes are preferably provided to enable setting the shutter drains to a desired potential. A shutter drain connection to the CCD imager is thereby required, not shown in the example of FIG. 6A.

In operation, to open the shutter of the CCD image pixel array during one of the three clock phase periods, a voltage is applied to the corresponding phase gate electrode such that a depletion region extends from the surface through the buried channel 70 and shallow region of the buried layer 84 into the substrate. At the same time, a voltage is applied to the shutter drain 82 to reverse bias the shutter drain/substrate junction, but is held low enough such that there is no depletion through the buried layer under the shutter drain. Photoelectrons generated by the incident light in the substrate are attracted by the depletion region electric field to the buried channel, toward which they enter through the shallow buried layer region, then being stored in the channel. The undepleted shallow region of the buried layer creates a potential barrier that repels the photoelectrons away from the shutter drain. A similar potential barrier stops the photoelectrons from entering the buried channel at deep buried layer regions.

The potential well formed in the buried channel adjacent to the deep buried layer is more positive than that in the channel adjacent to the shallow buried layer. As a result, the photoelectrons that enter through the shallow buried layer are transferred to the buried channel region above the deep buried layer. The depletion region under the central part of the channel, where a trough, as described above, can be incorporated, is therefore insensitive to the number of photoelectrons that have been captured up to some maximum amount. Additional photoelectrons beyond this amount are shared between the central and outer regions of the pixel channel, and cause a gradual collapse of the depletion region.

When the electronic shutter is closed, the voltage applied to a given pixel gate electrode is not sufficient to deplete the substrate through the buried layers, but is adequate to transfer charge from one pixel to the next. A large voltage is applied to the shutter drain 82 to cause a depletion region to spread beyond the shallow buried layer and deep into the substrate. Photoelectrons generated by incident light in the substrate are attracted by the electric field of this deep depletion region, and move toward the shutter drain rather than the buried channel. As a result, no substantial charge is additionally acquired in the channel.

The stepped buried layer of the electronic shutter structure effectively creates a central channel collection region and side storage regions in the channel. This provides a depletion region that is independent of the signal accumulated in the channel well up to some maximum amount, whereby the response of a given pixel is linearly dependent on integration time. Also, at high signal levels, the shutter devices provide a sublinear integration response, thereby increasing the dynamic range of the pixel. Other features and advantages of the electronic shutter design are provided by Reich et al., in U.S. Pat. No. 5,270,558, issued Dec. 14, 1993, the entirety of which is hereby incorporated by reference.

As explained above, the CCD imager is preferably configured such that the back side of the substrate, rather than the front side on which the pixel MOS gates and interconnections are supported, is that side on which input light to be imaged is incident. In this configuration, incident light generates photoelectrons toward the back side of the substrate, the photoelectrons then migrate toward the pixel buried channel under the influence of the channel depletion region electric field. It is thus preferable in many cases that the CCD imaging substrate be thinned to minimize recombination as well as lateral spreading of the photoelectrons as they traverse the wafer. A fabrication process for accommodating back-side illumination of a thinned CCD structure will be described later in the discussion.

The main advantages attained by the back-side illumination scheme are extremely high quantum efficiency, very broad spectral response, excellent spatial uniformity, and superior inter-pixel and intra-pixel response. Indeed, the quantum efficiency of a back-side illumination imager in accordance with the invention is almost reflection limited throughout the visible spectrum and is highly uniform across a pixel array. In the back-side illumination configuration, incident light impinges a uniform, substantially flat substrate field, rather than the cluttered area on the front surface of the substrate. Front-side illuminated CCD imagers are limited by, among other things, absorption of incident light by the pixel gate electrodes and other interconnections; this absorption is entirely eliminated in the back-side scheme. Optical absorption is particularly important for imaging in the UV and short visible wavelengths, all of which are characterized by very short absorption lengths. The back-side illuminated CCD imager achieves a broad imaging spectrum by eliminating this optical absorption.

In addition, the substantially flat imaging surface attained by the back-side illumination configuration enables custom matching to a desired imaging wavelength by deposition of a corresponding anti-reflection coating on the back surface. Furthermore, the modulation transfer function of the back-side illuminated imager is more benign than that of a front-illuminated imager. The response of a front-illuminated device to a point source is known to be very rough; this roughness is caused by the overlapping pixel gating structures. Wherever the gates overlap, the incident light is attenuated upon passing through the structure by as much as a factor of two over that passing through a non-overlapping gate region. In contrast, the back-side illuminated imager provides a smooth, unobstructed entry surface over the entire span of the imaging pixel array.

It is important to note that in a back-side illumination scheme, the back substrate surface must be passivated to stabilize any surface states present at that surface. If the surface is not passivated, an electric field can be produced by trapped charges in the native oxide that is inherently present on the substrate; this could result in acceleration of generated photoelectrons to the back surface, where they could recombine with the trapped charge, rather than moving toward the pixel channel. Passivation of the back surface also reduces generation of parasitic dark current in the imaging pixels. The CCD imager fabrication sequence presented below will discuss additional considerations of the back-side illumination configuration.

Beyond passivation of the back surface of the substrate, various pixel configurations can be employed to further limit dark current generation in the CCD imager. One such configuration employs a three-phase pixel operation in which a charge packet stored in the potential well of a given pixel's buried channel is transferred and retransferred under the three phase gates at a rate that prevent dark current from being generated under any one of the phase gates. This technique is described by Burke in U.S. Pat. No. 5,008,758, issued Apr. 16, 1991, the entirety of which is hereby incorporated by reference.

Although a back-illuminated CCD imager is preferred in the invention, it is possible to achieve high sensitivity that can approach, but not typically equal, that of the back-illuminated configuration using a front-illuminated configuration in which there is provided a localized open region of each pixel on the front of the substrate that is kept free of overlying material, using a suitable gate design. In such a case, only that fraction of the pixel comprising the open region has high photosensitivity; the fill factor is thus less than unity, typically on the order of about 30%. While in the open area the sensitivity can be equivalent to that of the back-illuminated configuration, the over-all sensitivity obviously is reduced by the less-than-unity fill factor. The effective fill factor can be improved, by about a factor of two, through the use of an array of micro-lenses, one for each pixel, arranged so as to concentrate the light incident onto each pixel principally into the open area of the pixel. Through the use of these techniques, the sensitivity of the front-illuminated imager can be made to approach that of the back-illuminated imager to within about 60%.

Figure 7:
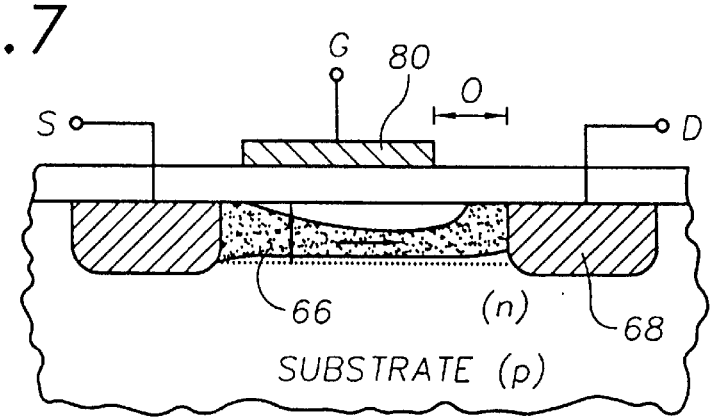
FIG. 7 is a cross-sectional view of a CCD imager output circuit FET in accordance with the invention.

The design and layout of the output circuit (FIG. 5) of the CCD imager is also customized to limit noise and boost overall operational performance of the low-light-level imager. To a large degree, the minimum attainable noise of the overall imaging system is limited by the amount of noise generated with the analog output signal of the CCD output circuit. Indeed, it is well accepted that the output circuit for a given CCD system sets the minimum noise level generated by the overall system. Several features are provided by the CCD imager of the invention to limit the amount of noise generated by the circuit. First, as with the MOS structures of the CCD imaging and charge storage pixels, the output circuit FETs (56, 64 of FIG. 5) are preferably fabricated to provide a buried channel rather than surface channel. As shown in the example output FET of FIG. 7A, a buried channel 66 is provided under the gate region. As stated above, this configuration limits the noise generated by the FET.

In the CCD imager of the invention, noise generated by the output circuit is dramatically limited by a combination of design features that reduce the capacitance of the circuit. In general, as the capacitance of the circuit is decreased, the corresponding voltage generated by the output FET is increased, because the magnitude of charge packets dumped into the output circuit is directly proportional to the product of the circuit capacitance and developed voltage. Thus, a lower capacitance circuit produces a larger voltage change for a given number of electrons in a charge packet; in the output circuit of the invention, this raises the output signal voltage above the inherent noise voltage of the source-follower FET.

The dramatically low noise level of the CCD imager of the invention, in combination with the high quantum efficiency achieved with the back-side illumination configuration, enable the imager to produce a viable low-light-level image without the use of a gain mechanism to first amplify low-level input light. With this low-level imaging capability, the imaging system of the invention can eliminate the various mechanisms known to limit the performance of conventional low-light-level imagers such as conventional intensifier tube imagers and intensified-CCD imagers.

Referring again to FIG. 7, the output FET of the output circuit is preferably designed to minimize the circuit's capacitances, including the drain-to-gate capacitance. In the invention, the edge of the drain region 68 in the substrate is separated from the edge of the gate 80 by a minimum offset distance, O, to decrease the drain-to-gate capacitance. Measurements made on various test structures have shown that the drain-to-gate capacitance continually decreases as the drain is moved out to about 1.5 $\mu$m away from the edge of the gate and remains constant as the drain is moved further away. Thus, it is preferable that the drain offset distance, O, be about 1.5 $\mu$m. This offset has been verified experimentally to result in an increase in the responsivity of the charge-to-voltage conversion of the output circuit by a factor of about 1.5 to 2. Similarly, the source-to-gate capacitance can preferably be minimized by separating the edge of the source from the edge of the gate by a distance of about 1.0 $\mu$m.

The lateral area of the output FET gate 80 is also preferably selected to increase the responsivity of the circuit. Additionally, it was found experimentally that the noise generated by the output circuit continually decreases as the gate length is decreased from about 4 $\mu$m to about 2 $\mu$m for a given gate width. Although the circuit responsivity continues to increase as the gate length is further decreased, the noise level does not at that point further improve. Thus, an output FET gate length of about 2 $\mu$m is preferred. In terms of output FET gate area, it was found experimentally that for high frequency low-light-level imaging, e.g., at frequencies greater than around a megahertz, a 10/2 ratio is preferred. For lower frequencies, no particular gate area ratio is preferred.

Figure 8:
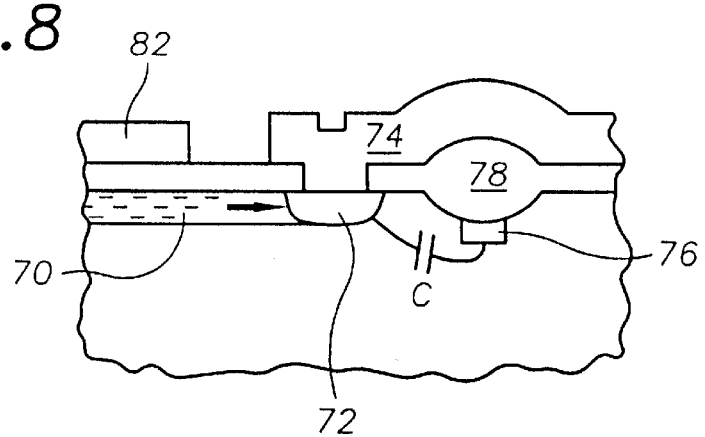
FIG. 8 is a cross-sectional view illustrating a parasitic capacitance due to CCD pixel channel stop regions.

Referring again to FIG. 5, the sense capacitor 54 employed by the output circuit for generating a voltage in response to a charge packet is preferably designed to minimize the area and corresponding parasitic capacitance of the capacitor. Such capacitance is in general inherent to the monolithic diffusion configuration of the capacitor. In a first of two primary techniques for reducing the parasitic capacitance, the contact to the p/n junction at the output of each CCD register is preferably a buried, rather than conventional butt, contact. As shown in FIG. 8, which is a slightly different rendering of the view of FIG. 3C, showing the output connection between a CCD register and an output circuit, the buried contact configuration enables a compact and correspondingly low capacitance connection between the p/n junction charge collection port 72 and the interconnection 74 that leads over the field oxide region 78 to the sense node and gate of the output FET, as shown in FIG. 5.

In an example configuration in which the buried channel 70 of the register is n-type and the substrate is p-type, the diode collection port is preferably an $n^+$-type region, which forms an $n^+$/p junction with the substrate. In a preferable technique for forming the buried contact, the $n^+$ region and its connection to the interconnection 74, e.g., a polysilicon interconnection that is also the output FET gate, are formed simultaneously and in a self-aligned manner. The resulting structure occupies less area than a conventional butt contact and significantly reduces the capacitance associated with the contact.

The buried contact configuration is fabricated with an elegantly simple process sequence that is integrated into the overall CCD process discussed below, but is pointed out here for clarity. Considering formation of the p/n junction interconnect with the first polysilicon layer of the three layers employed in the three-phase CCD design, the contact is formed after silicon dioxide and silicon nitride layers have been formed on the front side of the CCD substrate to act as a gate insulator. First, the silicon dioxide and silicon nitride layers are patterned and etched to expose the substrate in an area corresponding to the lateral geometry of the charge-collection junction. Then a polysilicon layer is deposited to form the interconnection. It is preferable that any native oxide on the substrate be removed prior to the polysilicon deposition. The polysilicon can be deposited in a polycrystalline state and then doped to render it highly conducting, or alternatively, can be deposited in a quasi-amorphous state and doped in situ during the deposition.

Due to its morphology, the polysilicon layer enables the dopant atoms to diffuse quickly through the layer and then to diffuse into the silicon substrate in the area of the contact opening in the gate insulator layer. Because the silicon dioxide-silicon nitride insulating layer is relatively resistant to dopant diffusion, substantially no dopant diffuses through the insulator, resulting in a relatively anisotropic diffusion into the substrate. In a final step, the polysilicon layer is patterned and etched to define the gate area of the output FET. This simple process results in an effective charge-collection junction and very compact interconnection that minimizes capacitance associated with the interconnection.

The parasitic capacitance of the charge-collection junction is also a function of the distance from the buried channel to the channel stop implant 76, as shown in FIG. 8. As shown in the figure, it is preferable that the buried channel 70 not extend beyond the location of the charge-collection junction 72 such that the parasitic capacitance C between the channel stop layer 76 and the region around the junction is minimized. In conventional CCD designs, as shown in FIG. 3C, the buried channel 70 is produced by a blanket ion implantation step into all channel regions, including the areas 89 between the charge-collection junction and the field oxide 78 overlying the channel stop 76. In this configuration, a significant parasitic capacitance is developed between the channel and the channel stop regions.

Figure 9:
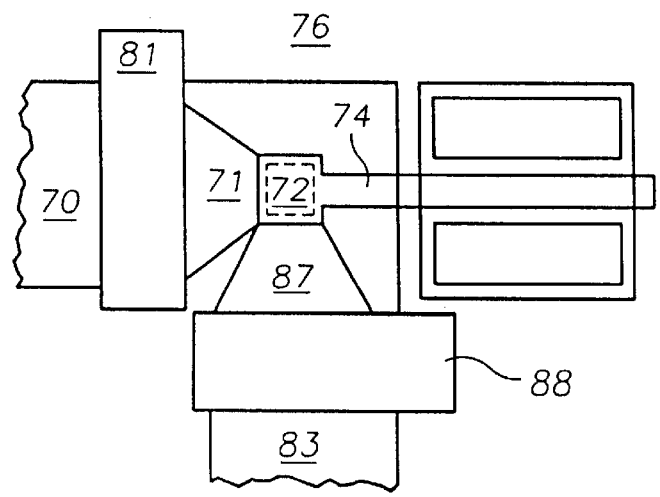
FIG. 9 is a top plan view of a CCD buried channel charge funnel and output circuit FET charge funnel provided in accordance with the invention.

In the invention, this parasitic capacitance is reduced by restricting the location of the buried channel to a limited region within the channel area such that charge is effectively funneled to the charge-collection junction but the distance of the buried channel to the channel stop regions is maximized wherever possible. One example of this configuration is shown in FIG. 9. Here the buried channel 70, extending under the gate 81 of the last stage of an output register, is funnel-shaped in the region 71 between the edge of the gate and the charge-collection junction 72 underlying the polysilicon interconnection 74. The distance from the buried channel to the channel stop region 76 surrounding the channel region is thereby maximized, while at the same time charge is efficiently "funneled" to the charge-collection junction. Similarly, the buried channel 83 of the output circuit reset FET (64 in FIG. 5) is limited to a funnel-shape region 87 between the edge of the reset FET gate 88 and the charge-collection node 72 such that the parasitic capacitance associated with the channel stop in the area of the reset channel is minimized.

As a result of the various noise reduction features provided by the CCD imager of the invention, a dramatically high signal-to-noise ratio is attained for the overall low-light-level imaging system. For example, the techniques described here for minimizing capacitance lead to values as low as about 10 femtoFarads and preferably as low as about 5 femtoFarads for the capacitor 54 (FIG. 5) of the output circuit; this in turn leads to large values of charge-to-voltage conversion, i.e., the voltage produced at the output 60 of the output circuit per electron transferred from the output register to the output node, of about 20 microvolts per electron. At operational frequencies of about 50 kHz, the CCD imager introduces noise at a level of only about 1–1.5 electrons and at high operational frequencies, e.g., at about 4 MHz, the noise level is only about 4–7 electrons.

Turning now to fabrication of a three-phase CCD imager for the low-light-level imaging system of the invention, one example fabrication sequence is described below. As will be recognized by those skilled in the art, many variations of the process parameters can be employed; the invention is not limited to a specific fabrication sequence or specific conditions for the sequence.

In one example fabrication process in accordance with the invention, $p^+$-type silicon substrates, of about 0.01–0.02 $\Omega$-cm, and having a p-type epitaxial layer of about 30–50 $\Omega$-cm, are employed as a starting material. This p epitaxial layer ultimately forms the back-illuminated CCD substrate after the CCD MOS and FET structures are formed. The substrates are cleaned at the start of the process and throughout the process in the conventional manner.

The gate insulator is first formed by growing a silicon dioxide layer (46 in FIG. 3B) in a dry growth process at about 1000° C. to produce an oxide thickness of about 600 Å. Then a layer of silicon nitride 48 is deposited by, e.g., chemical vapor deposition at a temperature of about 788° C. to produce a nitride thickness of about 400 Å. The channel stop regions are then photolithographically defined and the exposed silicon nitride is etched using a conventional plasma etch employing, e.g., an $SF_6/O_2$ chemistry.

At this point, a boron field implant of about 100 keV a dose of about $7 \times 10^{12}/cm^2$ is undertaken to define a channel stop field surrounding the channel area of the MOS structures and output circuit FETs. After the boron implant, the channels are isolated by a conventional local oxidation process in which wet oxidation at about 1000° C. is carried out to produce a 5000 Å-thick oxide layer over the channel stop regions, while the existing oxide/nitride in the channel regions remains largely unchanged.

A scupper for removing perimeter dark current generation is then produced. A channel region in the form of a narrow stripe running around the perimeter of the imager is reserved for the scupper. The scupper is photolithographically defined; and then a phosphorus implant at about 150 keV and a dose of about $1 \times 10^{14}/cm^2$ is carried out to form an n-type region that in operation is biased to a positive potential to intercept and collect dark current and photogenerated charge from the periphery of the device before such charge can contaminate the edges of the image.

At this point, the buried channel is formed by first depositing and patterning a layer of photoresist in areas around the buried channel location. Phosphorous is then ion-implanted at about 190 keV and a dose of about $1\times10^{12}/cm^2$; the resist is then removed. Photoresist is next deposited and patterned to define the buried channel trough, and phosphorus implanted at these regions at about 190 keV and a dose of about $3\times10^{11}/cm^2$.

Three layers of polysilicon are next deposited and patterned to produce the three-phase pixel gate configuration. Each polysilicon deposition is conducted by chemical vapor deposition at about 580° C., the first deposition carried out to produce a layer of about 4200 Å in thickness, the second carried out to produce a layer of about 4000 Å in thickness, and the third carried out to produce a layer of about 3300 Å in thickness. In all three deposition processes, the film is doped with phosphorus in situ during the deposition. After each deposition process, the films are annealed in nitrogen at a temperature of about 800° C. for about 30 minutes. Then the upper layer of phosphosilicate glass that forms during the anneal is removed with a buffered oxide etch.

Each polysilicon layer is photolithographically patterned and then etched in the corresponding gate geometry in a plasma etch using a $Cl_2$/He chemistry at about 200 W. Any polysilicon stringers, i.e., slender fingers of polysilicon along the bottom edges of the gate formed during the etch on the substrate are removed by a post wet etch in a conventional etch, e.g., a 5-2-0.15 etch solution.

After the first and second polysilicon deposition and patterning sequences, first and second gate electrode isolation oxide layers, respectively, each of about 2000 Å in thickness, are grown over the polysilicon at about 900° C.

The buried contact structure is defined after the second polysilicon deposition, patterning, and oxide growth. In this step, as explained previously, the location of the substrate charge-collection junction is first defined photolithographically, and then the silicon nitride and silicon dioxide layers overlaying the substrate are removed by a first $SF_6$ plasma etch and then a buffered oxide etch, respectively. Then the third polysilicon layer is deposited and patterned in the manner described above to form the third MOS gate structures, and the FET gates. As previously explained, the dopant introduced during the polysilicon deposition diffuses through the polysilicon layer to form a p/n junction in the underlying substrate.

In the next step, the source and drain regions of the FET structures are formed. Here, the location of the sources and drains is first defined photolithographically, and then, as in the previous step, the silicon nitride and silicon dioxide layers overlaying the substrate are removed by a first $SF_6$ plasma etch and then a buffered oxide etch, respectively. A phosphorus implant is then carried out in the source and drain regions at about 80 keV and a dose of about $5\times10^{15}/cm^2$.

At this point, the electrical grounding connection substrate contacts are formed. The contacts are first photolithographically defined, and then the field oxide in the area of the contact is etched by a buffered oxide wet etch. The contacts are implanted with boron at about 100 keV and a dose of about $1\times10^{14}$. Then the polysilicon layers that accumulated on the substrate backside during the deposition processes are etched, and an oxide layer of about 600 Å in thickness is grown with a wet process at about 900° C. The substrates are then annealed in hydrogen at a temperature of about 900° C. for about 15 minutes to reduce surface states and traps.

Metallization contacts to the CCD circuitry are then formed by first photolithographically defining the contacts, then etching the oxide in a buffered oxide etch, and etching the silicon nitride and silicon dioxide off of the back side of the wafers with plasma, and buffered oxide etches like those previously described. The substrates are then cleaned, and aluminum is sputter-deposited to form a metal layer of about 1.1 μm in thickness. The aluminum is then photolithographically patterned and etched to form the metal connections to the CCD imager.

At this point, the processed substrate is optionally and preferably annealed at about 400° C. to reduce the contact resistance between the aluminum and the underlying polysilicon or silicon. Then a layer of silicon dioxide, doped with about 5–6% phosphorus, or silicon nitride, is deposited to a thickness of about 0.7–1.0 μm to provide a scratch and ambient contamination protection layer. A final anneal in hydrogen or forming gas is then performed at about 400° C. for at least about 1 hour, followed by a slow ramp-down in temperature in the anneal gas.

An optional process enhancement can be added to the above fabrication sequence to produce a pixel configuration that limits the generation of dark current charge generation in the buried channels of the pixels. This process enhancement lowers the dark current by suppressing the surface state trap current generation that can occur at the silicon-silicon dioxide interface at the surface of the CCD buried channel. This trap-based activity can be reduced by doping the surface with the opposite type impurity from that of the buried channel. The surface dopant "pins" the fermi potential at the band edge, thereby lowering the probability of the capture and emission of electrons into the charge collection well of the buried channel. This surface doping can be performed at the time of the buried channel implant.

At the end of the fabrication process, functional CCD pixel and register MOS structures and output circuit FETs exist on the front surface, i.e., the p-type epitaxial layer, of the starting substrates. A final processing sequence is undertaken at this point to produce a rugged back-side illuminated CCD imager. Referring to FIGS. 10A–10D, the processed substrate 150, including output metal interconnection 152 and MOS and FET gates, is first coated with a layer of epoxy 156 on the front side of the substrate, over the gates and interconnections, by, e.g., spinning epoxy on the substrate. The coated front side is then attached to a supporting silicon wafer, glass substrate 158, or other suitable support substrate. The choice of epoxy preferably provides a sufficiently hard adhesive binder that can sustain forces of ultrasonic wedge bonding or gold ball bonding later in the sequence. EPO-TEK 377 epoxy is an example epoxy that performs adequately.

Figure 10A:
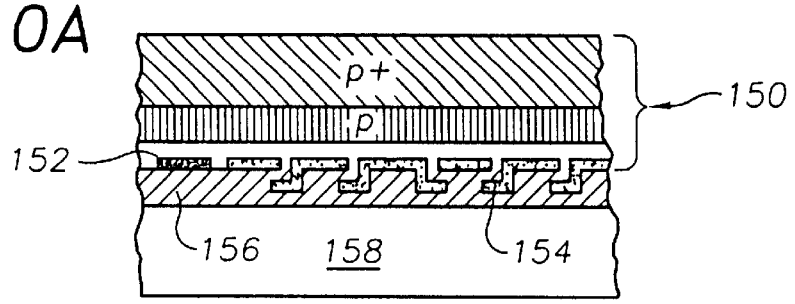
FIGS. 10A–10D show cross-sectional views of process steps for producing a back-illuminated CCD imager in accordance with the invention.
Figure 10B:
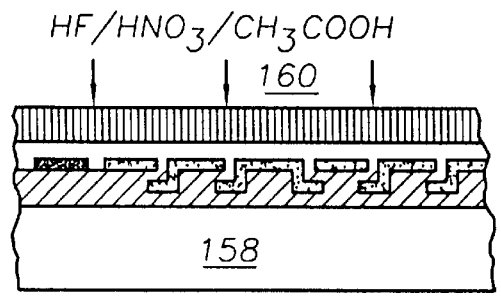

Then, as shown in FIG. 10B, a two-step thinning process is carried out to thin the substrate. Preferably, the thinning process minimizes pits on the etched back surface and provides control of etch uniformity to within about 1 μm or less. In one example etch process, the substrates are etched in a bath 160 of $HF/HNO_3/CH_3COOH$ while being rotated at several rpm. Other suitable etch techniques can also be employed. The etch is preferably carried out until the entire $p^+$-type substrate is removed and, depending on the imager application, some portion of the p-type epitaxial layer removed. The thickness of the remaining silicon substrate can range between a few microns and tens of microns. To enable high quantum efficiency of the imager in the red to near-infrared regions of the spectrum, where a substantial portion of the light in the night-time spectrum resides, a thinned-substrate thickness of about 20 μm or more is preferred, as discussed below.

The thinned substrate is at this point a viable back-side illumination surface for operating the CCD imager.

However, it is preferred that the back side be passivated to limit dark current generation and to stabilize the spectral response of the imager. In one example, this is accomplished by implanting a shallow p+ accumulation layer on the back surface of the substrate; e.g., $BF_2$ can be ion-implanted at a low energy of about 5 keV to a dose of about $2 \times 10^{14}/cm^2$. The metal interconnections and epoxy layer existing on the composite substrate structure prohibit a conventional high-temperature dopant activation anneal. Instead, irradiation with, e.g., a pulsed KrF excimer laser can be undertaken; such laser irradiation causes superficial melting of the exposed back surface and results in effective activation of the dopant without damage to the front surface or electronics. Preferably, the laser energy density is at least about 0.3 J/cm$^2$ and most preferably, overlapping pulses, e.g., four overlapping pulses, at about 0.56 J/cm$^2$, are employed; this has been found experimentally to fully activate the dopant.

Figure 10C:
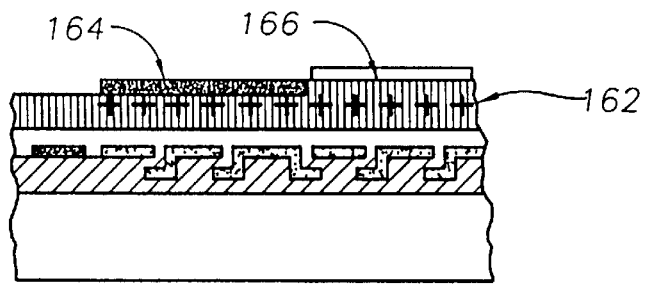

At this point, as shown in FIG. 10C, a layer of aluminum 164 is sputter-deposited and patterned to produce an opaque light shield over the frame storage pixel array. Then an antireflection layer 166 is coated over the image pixel array. One suitable antireflection coating consists of a layer of silicon monoxide, SiO. Over the wavelength range of visible and near infrared wavelengths, SiO is characterized as being close to the geometrical mean of air and silicon, making SiO a fairly good match to the substrate-air interface. SiO is not a good choice, however, for visible and ultraviolet wavelengths because at these wavelengths, SiO becomes absorbing. There are a variety of other suitable antireflection layer materials, e.g., beryllium oxide, aluminum oxide, or hafnium oxide.

Figure 10D:
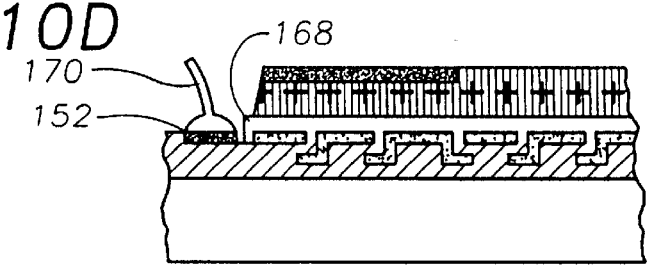
Figure 11:
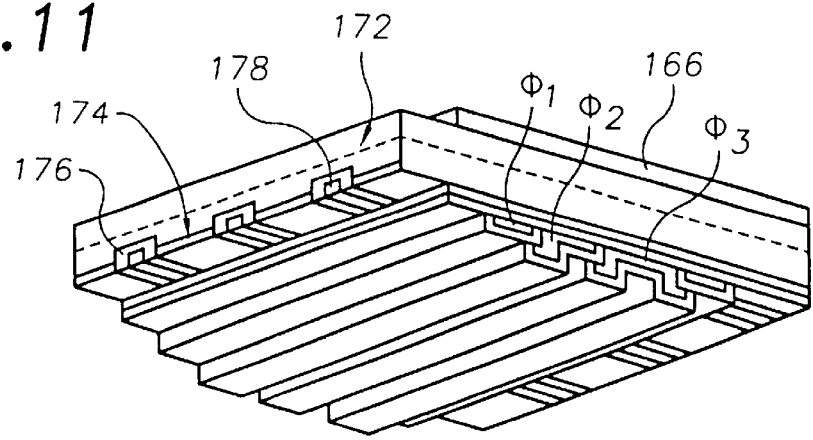
FIG. 11 shows a diagrammatic perspective view of a CCD imager in accordance with the invention.

Finally, as shown in FIG. 10D, the silicon epitaxial layer is etched using a standard silicon etch and the insulator 168 is etched with a plasma and buffered oxide etch sequence to remove those layers in the area of the aluminum metallization contacts 152 on the front surface of substrate. Then conventional wire bonding 170 is undertaken to make electrical connection to the CCD imager. At this point, a fully functional back-side illuminated CCD imager in accordance with the invention is achieved as shown schematically in FIG. 11. Highlighted in the figure are the three phase pixel gating structure, $\phi_1$, $\phi_2$, and $\phi_3$, the implant layer 172 for enabling electronic shutters, the buried channels 174, channel stop implants 176, and blooming drains 178 in the channel stops. Also shown is the anti-reflection coating 166 covering the imaging pixel array.

In another fabrication process in accordance with the invention, the CCD imager is fabricated on a high-resistivity silicon substrate having a resistivity of between about 1000 Ω-cm and 12,000 Ω-cm and the substrate is etched back, in the back-side illumination configuration, to a relatively thick layer, e.g., about 20–100 μm. Use of a thick, high-resistivity substrate is motivated by low-light-level performance goals for the CCD imager, as mentioned above. A large fraction of the optical wavelength spectrum of the night sky is in the red and near infrared spectrum regions. Light in these wavelength regions is characterized by a relatively long absorption length in silicon, meaning that a thick substrate is preferred to achieve a high quantum efficiency at those wavelengths. High-resistivity substrates, formed by, e.g., a conventional float zone process, enable a thick substrate to perform comparably with a relatively thinner substrate; i.e., the modulation transfer function of the thicker substrate is not significantly degraded and the inter-pixel response characteristic of the thinner substrate is maintained.

Silicon substrates fabricated by the float zone process characteristically lack oxygen and are prone to slip dislocation formation during high temperature processing due to induced stress resulting from, e.g., temperature gradients across the substrate, high doping concentration of atoms mismatched to the silicon lattice size, or differing thermal expansion coefficients between the substrate and a film grown or deposited on the substrate.

It is therefore preferable that specific precautions be taken during CCD imager fabrication on a high-resistivity substrate to minimize such slip dislocations. For example, all films grown or deposited on the substrate should preferably be as thin as possible, taking into account their specific function, to minimize film-induced substrate stress. Thermal processing should also preferably be tailored to minimize temperature-induced slip formation. For example, substrate boats used to support the substrates during a processing step should preferably be polysilicon to lower the stress at the points where the substrates are in contact with the boats. The substrates should be separated from each other in the boats by a distance sufficient for the entire span of each substrate to be more evenly exposed to the thermal environment during the thermal processing. At the start and end of each thermal process, the temperature should preferably be slowly ramped such that the thermal gradient across the substrates is maintained relatively low. These various precautions provide the ability to produce a high-resistivity, relatively thick CCD imager substrate that provides high quantum efficiency at the spectrum regions characteristic of low-light-level scenes such as the night sky.

Figure 12A:
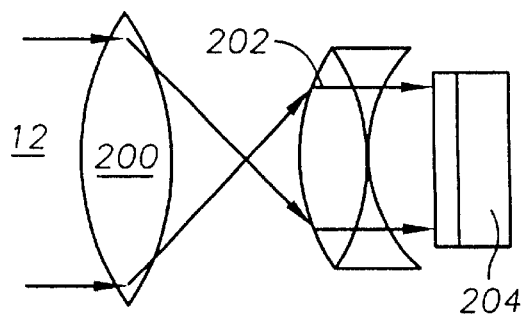
FIG. 12A shows a diagrammatic representation of a multi-element wide-field-of-view lens system employed with a planar CCD imager in accordance with the invention.

An alternative embodiment of a back-side illuminated CCD imager is provided in the invention to accommodate a wide field-of-view optical input coupling lens. A limitation of conventional low-light-level imaging systems is their very limited field of view, e.g., typically about 40 degrees or less, at unity magnification. The field of view of an imager is in general widened through the use of a wide field of view lens, e.g., a lens designed to couple input light from some specified angle of view, e.g., 100 degrees. Use of such a lens typically has several practical limitations, including the requirement of a multi-element lens system for correcting for any field distortions that are incurred by a single element lens. For example, as shown in FIG. 12A, input light 12 coupled through a wide field of view lens 200 to the low-light-level imaging system of the invention is preferably further focused by a correctional multi-element lens system 202 before being directed to the back-side illuminated CCD imager 204. The additional lens system 202 adds unwanted weight to the imaging system, requires additional housing space, and adds to the overall system cost.

In addition, for a fixed pixel-resolution CCD imager, the angle of view subtended by any one pixel is increased as the field of view is widened, resulting in reduction of the angular resolution of the imager. Furthermore, in cases where the imaged field of view exceeds the field of view that can viably be displayed on a given display apparatus, there results a net minification of the imaged scene, i.e., magnification less than unity, which is undesirable for mobility and navigation tasks where judgments of spatial relations are critical.

Figure 12B:
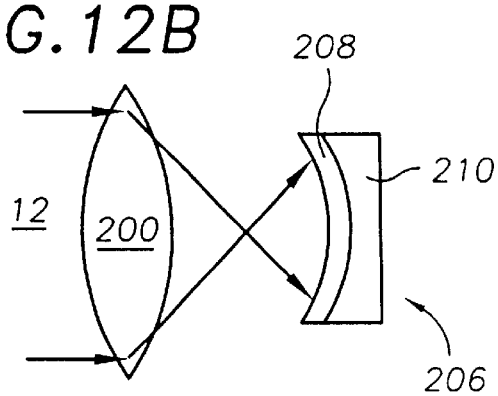
FIG. 12B shows a diagrammatic representation of a wide-field-of-view single-lens employed with a nonplanar CCD imager in accordance with the invention.

In one embodiment of the invention, the thinned, back-side illuminated CCD imager is spherically curved with an appropriate radius of curvature and located at a position with respect to a single-element simple lens such that the image plane at the CCD imager location is in focus over a wide field of view. As shown in FIG. 12B, the input light 12 is here directed through the simple single lens, and then directed immediately to a curved CCD imager 206 in which the CCD imager substrate 208 is positioned on an appropriately curved support substrate 210. This enables imaging of a large field of view by the imaging system of the invention using only lightweight and simple optical input elements. The field of view dictated by the input lens 200 need not be equal in all directions, and it may be in some conditions preferable to enable an extensive field of view in one direction, e.g., horizontal, through use of a lens having a component of cylindrical curvature. Correspondingly, the CCD imager can here also be curved to conform to the focal plane. If necessary for a given curvature, multiple CCD imagers can be mosaiced over a support substrate to cover the desired field of view. In this case, however, reduced scene resolution and image minification can occur as described above.

Figure 12C:
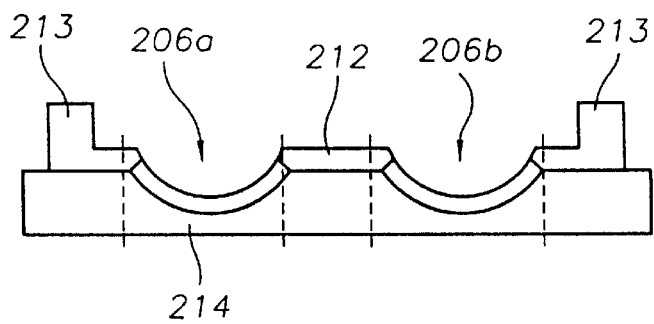
FIG. 12C shows a diagrammatic cross-section of a nonplanar CCD imager substrate mounted on a support substrate in accordance with the invention.

Referring to FIG. 12C, an example process for producing a curved CCD imager 206 in accordance with the invention entails deforming a thinned CCD imager substrate 212, having one or more individual CCD imager chips 206a, 206b on the substrate, and securing the deformed substrate to a support substrate 214 having a desired radius of curvature for a given imaging application. Once the imager substrate 212 is secured to the underlying support substrate 214, the composite structure can be diced to produce individual, curved CCD imager chips 206a, 206b.

At the start of the process, the imager substrate is first thinned by, e.g., exposing the back side of the substrate to an appropriate etch bath while masking the periphery of the substrate to form a rim 213 (FIG. 12C) on the substrate for registration and handling during the following process steps.

Figure 12D:
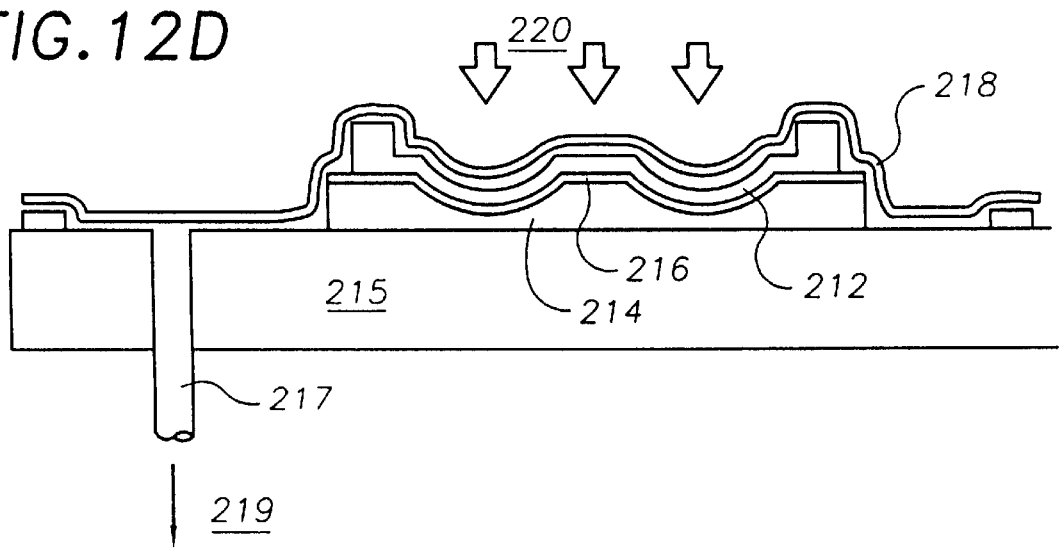
FIG. 12D shows a diagrammatic cross-sectional view of a configuration for producing the nonplanar CCD imager substrate of FIG. 12C.

Deformation and securing of the CCD imager substrate to an underlying support substrate is accomplished in one example process shown in FIG. 12D. Here, the contoured support substrate 214 is positioned on a mounting plate 215 that includes an aperture 217 connected to an exhaust system 219. A layer of epoxy 216, as described previously, is deposited on the support substrate, and the CCD imager substrate 212 is then placed on top of the epoxy-coated support substrate. Alternatively, the lower surface (front side) of the CCD imager substrate can be coated with epoxy.

A flexible plastic sheet 218 is then placed over the upper surface of the CCD imager substrate, and the exhaust system is activated to evacuate the air from beneath the plastic sheet. This produces a pressure 220, of up to, e.g., about 1 atm, that is applied very uniformly over the entire CCD imager substrate, gently forcing the substrate into exact conformity with the underlying contoured support substrate. The pressure condition is maintained preferably until the epoxy has cured, after which the vacuum is relieved. At this point, the composite substrate assembly is diced to produce individual CCD imager chips.

Other curvature-forming processes are contemplated by the invention and the foregoing is but an example of one suitable process. This technique is suitable for both back-side illuminated and front-side illuminated CCD imagers; in the case of a conventional front-side imager, the diameter of the contoured support substrate is preferably not greater than the inside diameter of any support rims on the periphery of the substrate to permit bonding of the backside of the substrate. As will be recognized by those skilled in the art, the curvature-forming process is applicable to any focal surface profile; i.e., the thinned substrate can be deformed to provide multiple radii in any reasonable combination to accommodate a specific lens. The invention is therefore not limited to a specific curvature or profile; the concave profile described above is provided only as an example of the many profiles possible.

In a further alternative CCD imager embodiment in accordance with the invention, a four-phase MOS pixel configuration is provided to enable two dimensional charge packet transfer through the CCD imager. Typically, CCD imager configurations support only one-dimensional transfer of charge packets through the imager; for example, in the back-side illuminated imager described above, charge packets are transferred from an imaging pixel array to a frame storage pixel array in regimented columns, and are transferred out of serial registers out of a single register stage row. Charge packets cannot in this configuration be moved between columns in the pixel arrays. In the alternative CCD imager embodiment, charge packets can be transferred both from one pixel row to another along a given pixel column and from one pixel column to another along a given pixel row. This enables true two dimensional transfer of CCD charge packets, providing the ability to shift charge packets in the CCD imaging pixel array to track a moving image during the image integration time, thereby eliminating so-called blurring of the acquired image.

Figure 13:
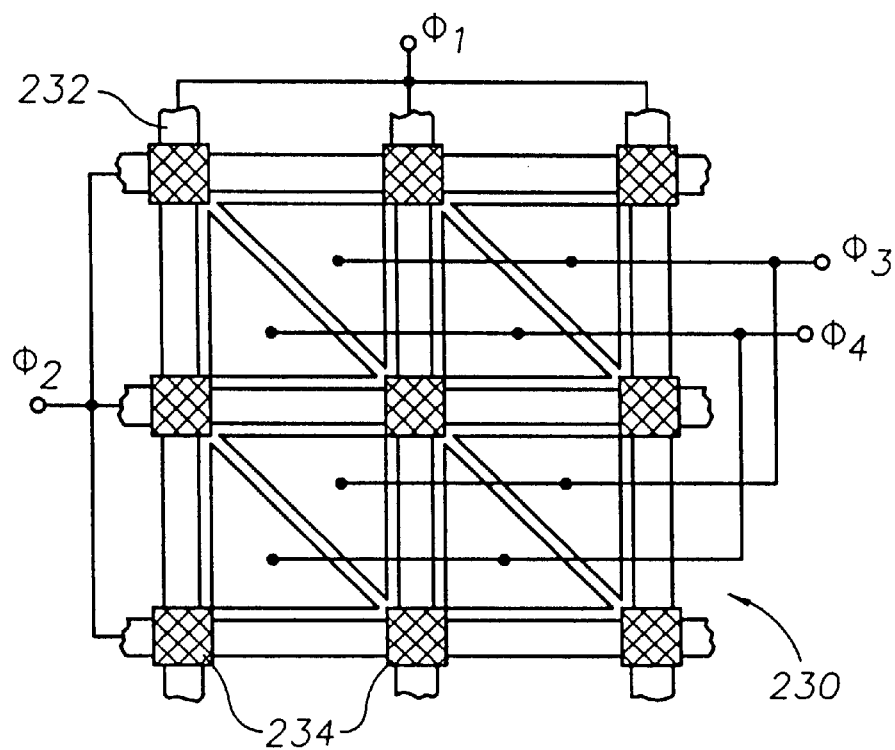
FIG. 13 shows a diagrammatic top plan view of a CCD imager pixel having orthogonal transfer gate interconnections provided in accordance with the invention.

Referring to FIG. 13, a pixel 230 of the two dimensional, or orthogonal-transfer CCD provided by the invention consists of four MOS gate structures per pixel, $\phi_1$, $\phi_2$, $\phi_3$, and $\phi_4$. Preferably, the $\phi_1$ gate is biased low to provide a channel stop mechanism 232 and the $\phi_2$–$\phi_4$ gates are clocked in conventional three-phase manner to transfer charge vertically, i.e., along columns. Likewise, the $\phi_2$ gate can be biased low and the $\phi_1$, $\phi_3$, and $\phi_4$ gates can be clocked to transfer charge horizontally, e.g., along rows. Conventional channel stop implantations 234 are required under the intersection of the $\phi_1$ and $\phi_2$ gates. Other than these modifications, the orthogonal-transfer CCD imager can be fabricated using the process sequence given above, with the fourth gate being provided either by the aluminum interconnect or more preferably, with an additional polysilicon layer.

With this control scheme, charge packets accumulating in the CCD image pixel array can be manipulated to "follow" a moving image during the image integration time. This ability is particularly advantageous for ground-based low-light-level astronomical imaging. Generally, atmospheric turbulence produces random phase distortions in the optical wavefront of an astronomical image. This tends to severely degrade the image resolution to well below the diffraction limit of conventional large telescopes. Much of this distortion manifests itself as a tilt in the wavefront, and thin in turn leads to a translation of the image at the imaging focal plane. Conventional adaptive-optics systems compensate for this lowest-order distortion by using a fast tip-tilt mirror in the optical path. The orthogonal-transfer CCD imager provided by the invention can, however, correct the image electronically by shifting the charge packets in the image pixel array during the integration time to maintain registration with the moving image. Mechanical resonances are typically a challenge for tip-tilt mirrors, but even a large orthogonal-transfer CCD imager with resistive polysilicon gates can easily follow motion, e.g., even at a rate of about 1 kHz. As with conventional systems, the image movement and control information must be independently measured and processed, e.g., with a high-frame-rate imager viewing a bright, nearby star, or possibly using a fraction of the light from the object of interest. Other features and advantages of the orthogonal-transfer CCD configuration are described by Savoye and Burke in U.S. Pat. No. 5,760,431, issued Jun. 2, 1998, the entirety of which is hereby incorporated by reference.

Turning now to other components of the low-light-level imaging system of the invention, the system's CCD imager preferably is provided with means for suppressing any dark current generated in the imager by parasitic effects not related to a scene being imaged. Such dark current, which is primarily thermally generated, is generally somewhat non-uniform from pixel to pixel in a CCD imager, and therefore can add a spatially fixed noise pattern, as well as temporal shot noise, to the image signal produced by the CCD imager. This is particularly important for imaging low-light-level scenes in which the acquired image may be of such low intensity that uncontrolled dark current could swamp the acquired signal. Even aside from low-light-level imaging, however, low overall noise operation of the imaging system of the invention is achieved by reduction of the CCD imager dark current noise contribution.

In one embodiment provided by the invention for suppressing CCD imager dark current, a cooler, e.g., a thermo-electric cooler (TEC), is employed to cool the CCD imager and limit the dark current generated in the imager. Because dark current is exponentially dependent on temperature, modest cooling, which can be effectively provided with a TEC mechanism, can greatly reduce it. The TEC mechanism is preferably placed in direct contact with the CCD imager in a configuration that renders the CCD temperature stable and controllable but that does not introduce turbulence to input light incident on the CCD.

Figure 14:
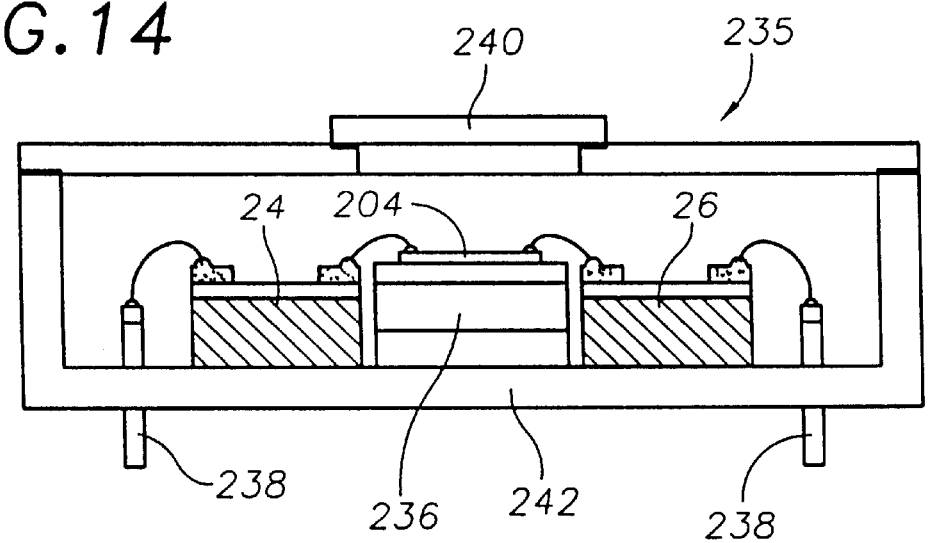
FIG. 14 shows a cross-sectional view of a CCD imager packaging and cooling configuration in accordance with the invention.

Referring to FIG. 14, one example CCD imager package 235 that accommodates a TEC mechanism is configured with a TEC 236 on top of which is mounted the CCD imager 204, shown here as a planar, back-side illuminated imager. The TEC consists of any suitable thermo-electric device, e.g., a thermo-electric cooler from Melcor, of the FC series. This TEC is characterized by an unloaded temperature differential of about 65° C.

Power and control from the imaging system power source 18 and temperature controller 20 are provided to the TEC through the package leads 238. The CCD imager 204 is positioned under a package window 240 such that light input to the imaging system can be directed straight to the CCD image pixel array. Connected to the CCD imager 204 are one or more of the signal processing electronics provided by the imaging system. For example, the analog signal processor 24 (FIG. 1) and A/D converter 26 can be included in the cooled package.

In the CCD mounting configuration shown, only the CCD imager 204 is directly cooled, resulting in minimization of power requirements to effectively cool the structure. The package substrate 242, which acts as the heat sink for the TEC, is heated a few degrees higher than the surrounding ambient, advantageously preventing moisture condensation on the package. During nominal room temperature operation, the TEC can maintain a CCD temperature of about −5° C. and maintain a package temperature of about 25° C.

A thermistor temperature sensor, preferably located in the package adjacent to the CCD imager, can be employed to monitor the CCD and package temperature and deliver temperature readings to the temperature controller 20. One suitable temperature controller is the New England Photoconductor Controller, Model TC1, which can maintain the temperature to within a fraction of a centigrade degree. For a modest size imager operated at frequencies of a few megahertz, the power dissipation of the TEC is about several watts. The temperature controller adjusts the TEC control signal using, e.g., a conventional voltage-controlled feedback loop that maintains temperature stability. With such a control scheme, it was experimentally found that the dark current generated by a CCD imager can be reduced to about 0.05 to 0.1 $nA/cm^2$ at about −5° C.; this is a dark noise reduction by a factor of 5–10 with respect to room-temperature operation. This reduced dark current makes less critical the background image noise subtraction that conventionally must be carried out before viable imaging can begin in a CCD imager.

Figure 15:
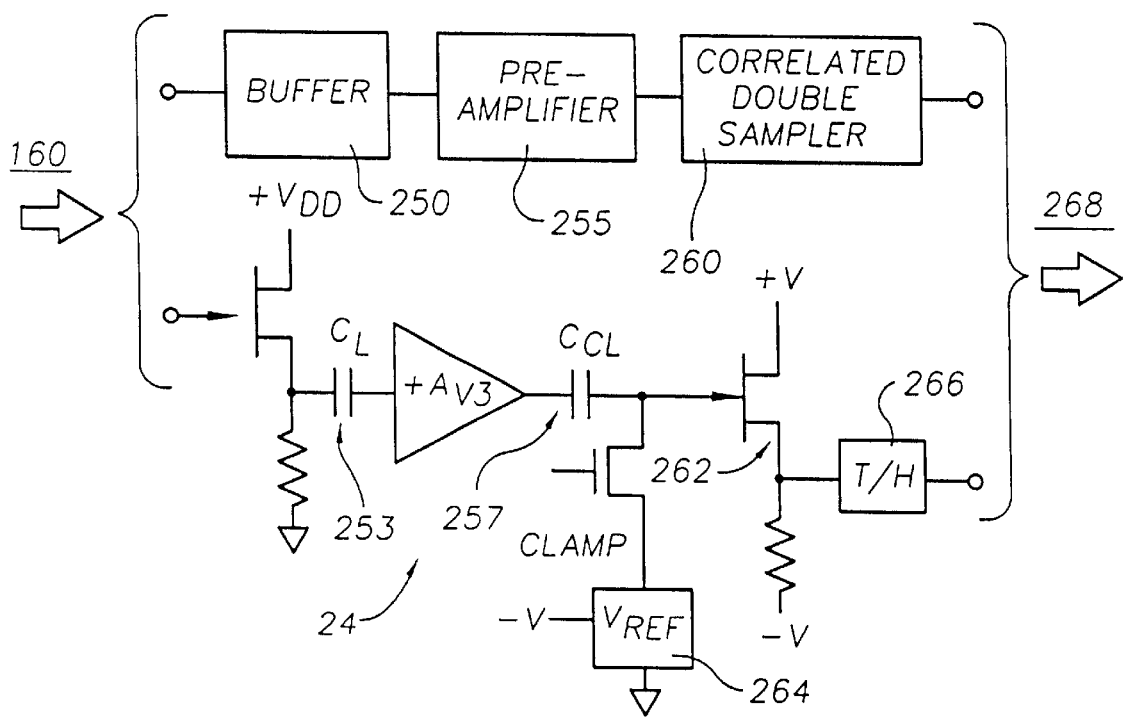
FIG. 15 is a circuit diagram of a signal processing circuit provided in accordance with the invention.

As mentioned above, other imaging system components, e.g., the analog signal processor 24, can be included in the CCD imager package. Turning to FIG. 15, the analog signal processor performs amplification as well as noise reduction functions on the CCD imager output signal 160. One analog signal processor is provided for each CCD output; thus for a four-output CCD four analog processors are employed. Each analog signal processor can preferably include an adjustable gain setting such that during operation of the imaging system, balance can be periodically adjusted to maintain gain and offset balance with respect to all CCD outputs. As will be recognized by those skilled in the art, there are a wide range of balancing techniques, both manual and automatic, that can be employed to maintain this preferred multiple-output balance.

Each imager output signal is first processed by a buffer-amplifier 250, which drives the capacitive load of the wiring and the following preamplifier stage 255, and increases the image signal level above that of the characteristic noise level of the following stages. The buffer amplifier is preferably in a source-follower configuration, and can consist of, e.g., a U309 p-channel JFET with a 2 kΩ active load. The input referred noise of the buffer is below that of the CCD imager output circuit, and has a bandwidth of about 100 MHz when driving a 10 pf load. Preferably, the buffer is housed on a hybrid substrate located inside the CCD package, as described earlier.

Following the buffer is a single-pole low pass filter 253 with a 3 dB bandwidth of about several megahertz. The low pass filter bandwidth limits the high frequency thermal noise that originates at the CCD output circuit and the buffer stage and is passed to the preamplifier stage 255. The preamplifier 255 provides a gain of about six to ten and consists of, e.g., two AD 829 op-amps. The first op-amp performs impedance transformation and provides most of the gain. The second op-amp has modest gain and provides signal inversion and matching to the following correlated double sampler stage 260. The AD 829 has a very wide dynamic range that is large enough to accommodate the dynamic range produced by the CCD imager of the invention and the AC coupled drift. The input referred noise of the AD 829 is low and the settling time on the order of a few nanoseconds, making them a good choice for real time video imaging applications.

The preamplifier stage is followed by a second single-pole low pass filter 257. The amplified and filtered signal is passed to a correlated double sampler (CDS) stage 260, which removes reset and low frequency noise due to the CCD imager source-follower output circuit, using a FET circuit 262 and temperature-insensitive voltage reference 264. This stage also eliminates any slow drift component, either thermal or ac-couple related, of the amplifier 255. The CDS also establishes a black level reference for absolute zero. The CDS consists of, e.g., an SD 210 clamp MOSFET transistor followed by an AD9100 track-and-hold 266. The track-and-hold 266 is linear over a range of about −1 V–+1 V, and accommodates at least about 11–12 bits of resolution. A 75 Ω buffer (not shown) receives the signal from the track-and-hold. This buffer can transmit the signal with minimal degradation over a 75 Ω cable of about 25 feet or shorter.

The buffered signal is then passed to the A/D converter and formater 26 (FIG. 1) for digitization and for formatting the pixels into a sequence of configured image frames of pixels. The dynamic range of the pixel values presented to the A/D converter is preferably larger than 8 bits and can be 12 bits, or larger, e.g., 16 bits, depending on the application. Thus, an appropriate digital bit-sized converter is selected for a given application. Suitable A/D converters include the 12-bit Comlinear CLC 925 hybrid A/D circuit. The 12-bit dynamic range of this converter matches fairly well with that needed for digital image processing, as discussed below. The Analog Device AD9220 monolithic A/D converter, A/D converters from Burr Brown and other Comlinear converters are also suitable.

Referring back to FIG. 1, the timing controller 22 provides overall timing control of the A/D, the analog signal processor, and the CCD imager to synchronize image acquisition and signal processing. One example timing controller in accordance with the invention consists of a programmable logic device that embodies a control state machine for synchronizing image integration, image signal readout, analog processing, A/D conversion, image frame sequence formatting, and digital image processing.

The timing controller 22 operates based on control signals provided by the user controller 32, which can consist of a personal computer, customized hardware, or other suitable configuration. The user controller preferably includes input/output capabilities, e.g., a display and keyboard or control switches, for enabling user selection of imaging system operating parameters by, e.g., a pull-down menu configuration or other control switching configuration for enabling user selection. In one user control configuration, the user controller 32 monitors the activity of all processors and the A/D and formater and is the controlling mechanism for changing the status of the processors and A/D and formater.

In one example timing control configuration, the user can select between three operational modes, namely free run mode, frame control mode, and full control mode. In free run mode the CCD imager runs at its maximum operable speed; in frame control mode, the CCD imaging pixel array integration time is user-controlled; in full control mode, both the integration as well as extinction of charge packets acquired in the CCD imaging pixel array is controllable.

FIG. 16A is a timing diagram for each of the three example user-selectable modes. In all three cases, the user controller produces two pulses, READ and RAB signals, for controlling the CCD imager. In all three diagrams, each READ pulse width is preferably about 2 $\mu$sec and the RAB pulse width is preferably at least about 3 $\mu$sec. In free run mode, both the RAB and READ signals are maintained low. This causes the CCD imager to acquire charge packets and output corresponding signals at the maximum operable frame rate; the Frame Sync signal therefore sets the frame rate.

Frame control mode is enabled by pulsing the READ signal. In this mode, the integration time for a given frame is set by the time that elapses between READ pulses, as shown in the diagram; the READ pulse triggers the Frame Sync pulse. Full control mode is enabled by pulsing both the READ and RAB signals. In this case, if the RAB pulse is high, the CCD imager clock phases run backward, thereby extinguishing a charge packet signal out of a drain. The time elapsed between the falling edge of the RAB signal pulse and the rising edge of the READ signal pulse sets the integration time for a given frame, with the rising edge of the READ signal causing a frame to be output.

Figure 16B:
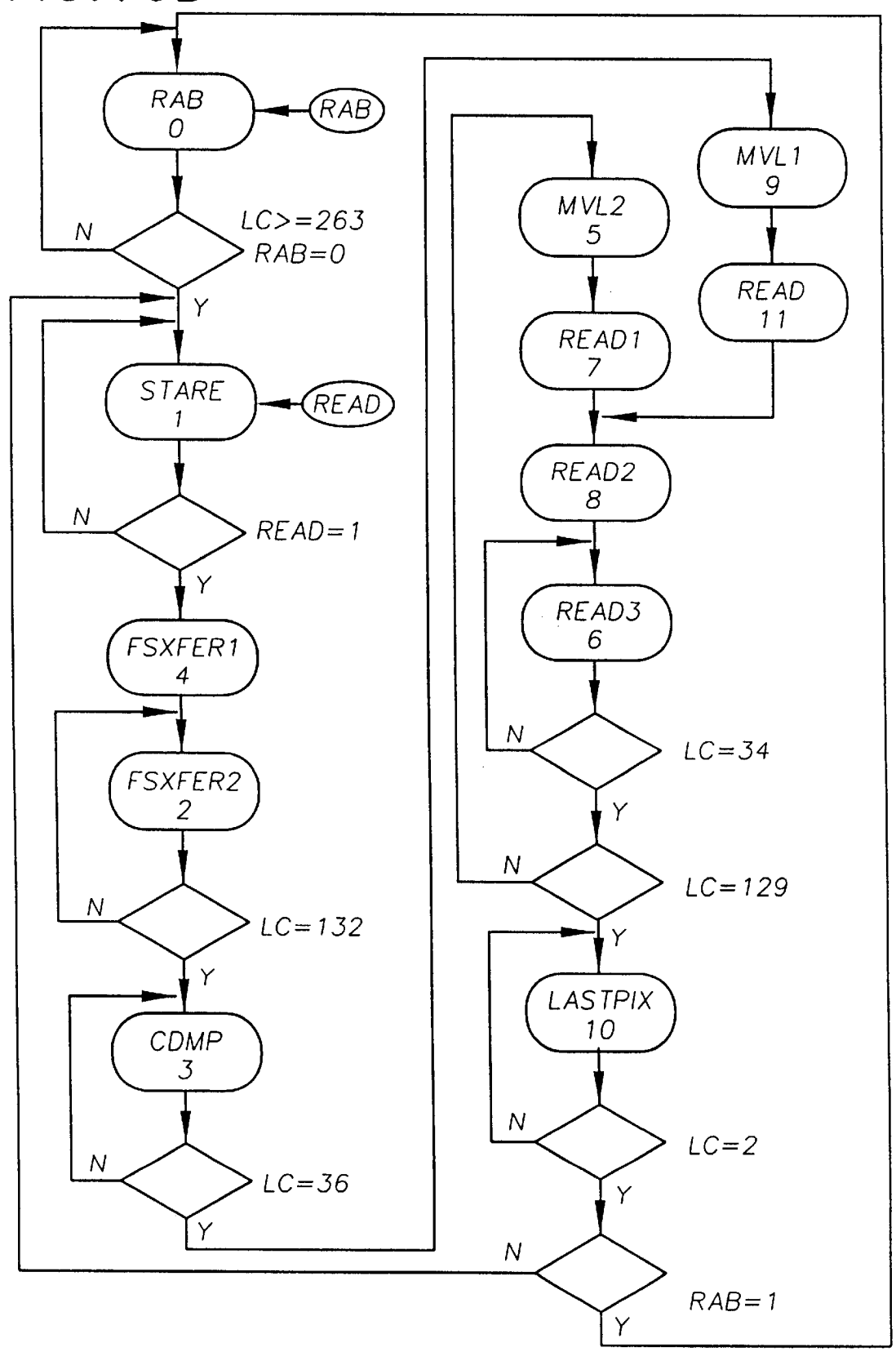
FIG. 16B shows a state machine diagram for controlling the CCD imager of the invention.

FIG. 16B is a state machine diagram illustrating the sequence of states controlled by the READ and RAB signals for an example 128×128 CCD imager employed in the imaging system of the invention. Beginning with the state at the top of the diagram, if the RAB signal is low, the CCD imager enters the frame integration mode, stare, and remains at that state until a READ pulse is received. Receipt of the READ pulses causes a transition to the frame transfer state. The imager continues in this state until all charge packets in the imaging pixel array have been transferred to the frame storage pixel array. In the case of the example 128×128 imager, 132 cycles are required to completely transfer the imaging pixel charge packet array.

The imager then enters the charge dump state, remaining in that state until the output register has been cleared. Upon completion of the register clearing, the row of pixels values is output as electronic pixel signals to the analog signal processor. This is continued until all rows of charge packets of the imaging pixel array have been output. At the end of the output, the timing controller awaits control from the user by way of the RAB and READ lines to determine the next state, either RAB or STARE. The imaging cycle is then begun once again.

Figure 16C:
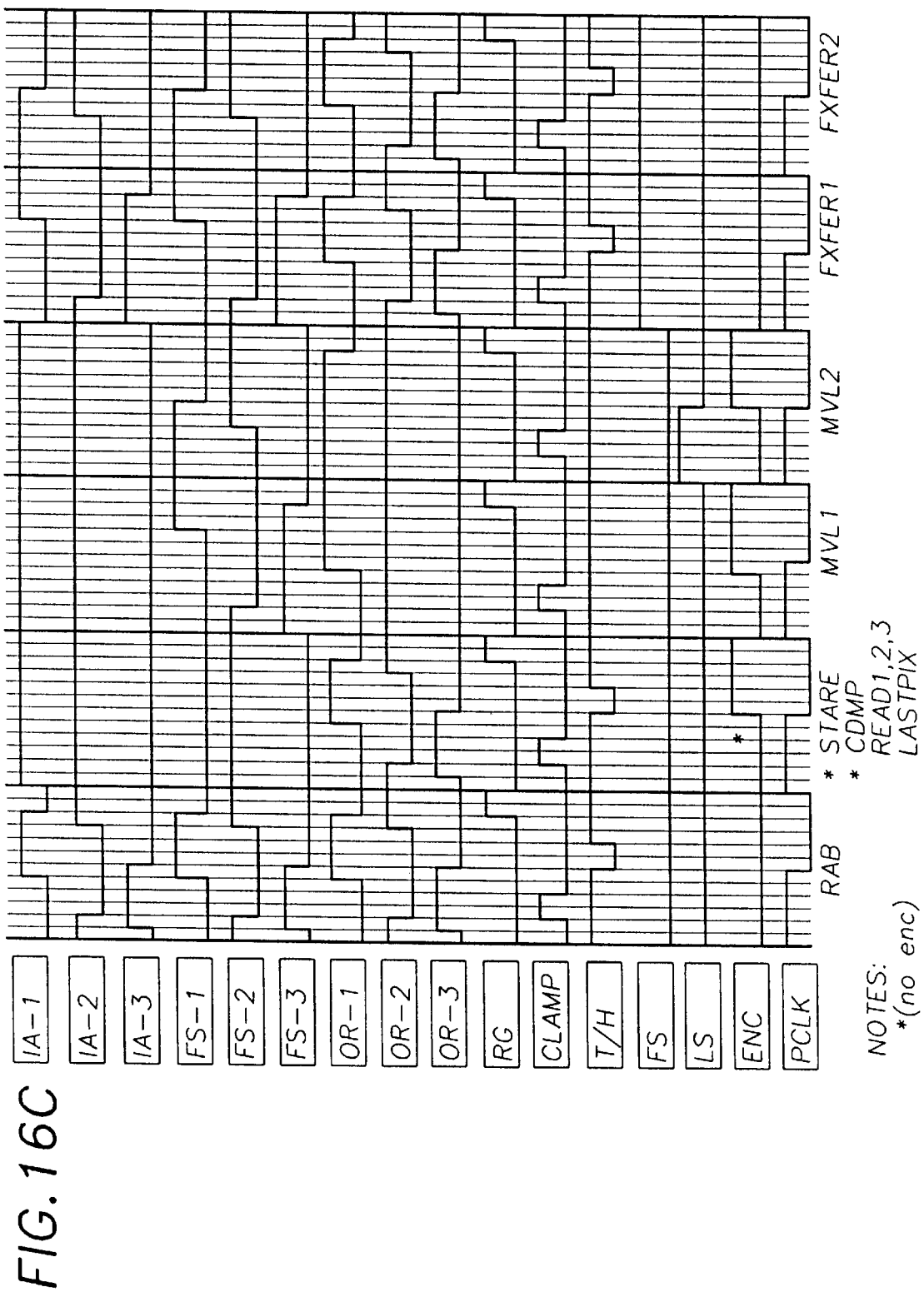
FIGS. 16C–16D show timing diagrams for controlling the operation of the imaging system of the invention.

FIG. 16C is an example timing diagram for controlling the imaging system. The first 9 signals control a three-phase clocking operation for an example three-phase CCD imager. The Line Sync (LS), Frame Sync (FS), A/D Encode (ENC), and pixel clock (PCLK) signals are provided to the A/D converter and formater for configuring the pixels, once they are digitized, into a sequence of image frames. The formater then passes the LS, FS, and PCLK signals to the digital image processor 28 (FIG. 1) for synchronization. The digital image processor runs asynchronously with respect to the imager, but preferably maintains real time throughput of the image pixel data with a latency time of no more than about one frame time.

Figure 16D:
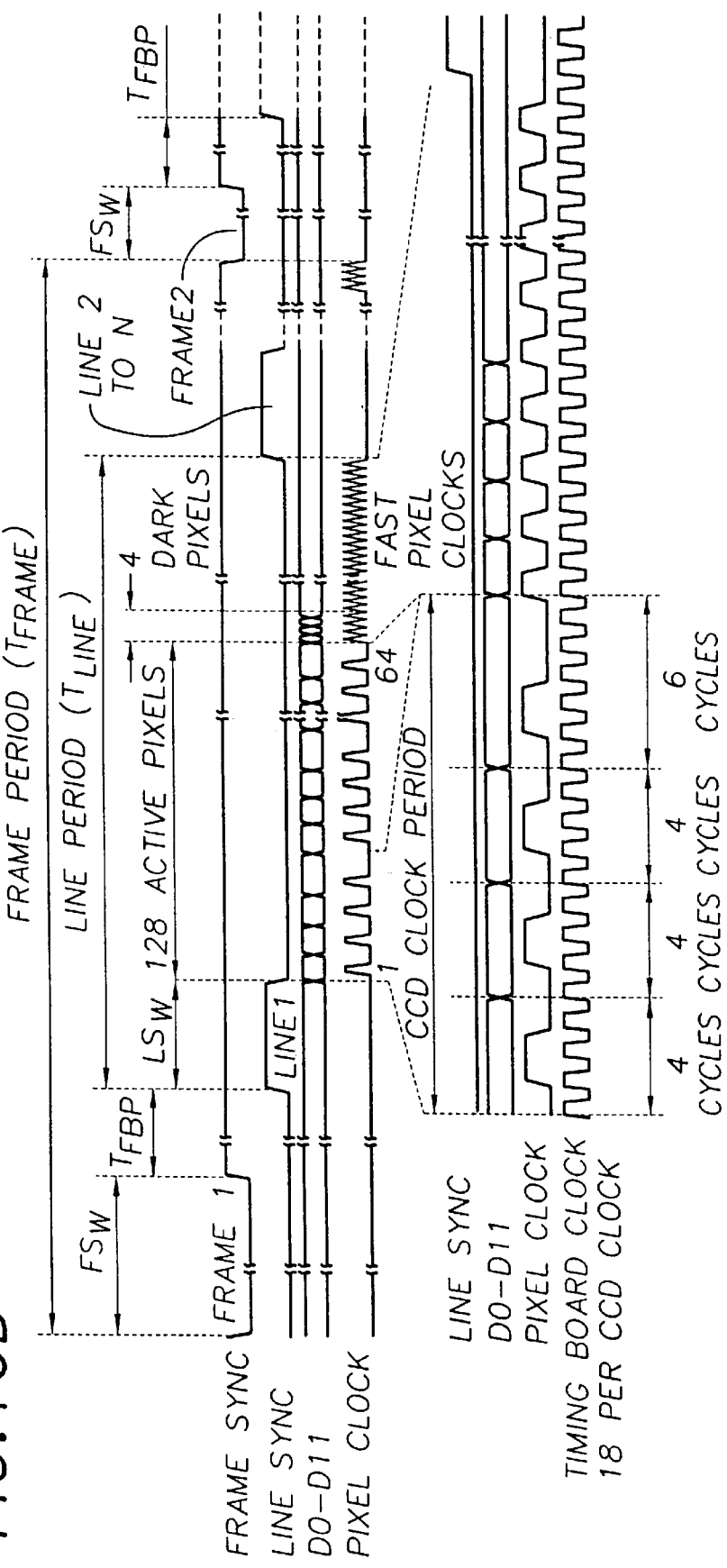

FIG. 16D is an example timing diagram for formatting the digitized pixels into a sequence of image frames. The formater, consisting of a general processor, customized hardware, or other configuration, applies the timing control to the sequence of digitized pixel values produced by the A/D. In the case of an example CCD imager having four output ports, there are four corresponding sets of analog signal processors and A/Ds; at the formater, the four streams of digital pixel values are multiplexed down to one pixel stream running four times faster than the individual streams. This multiplexing is preferably performed in the digital domain to maintain low noise in the signals. In the diagram, D0–D11 are the 12 digital pixel bit lines output from the formater, and the four parallel CCD imager output port clocking phases are illustrated.

The digital output of the A/D converter and formater, as explained above, is a sequence of digital pixel frames representative of the image acquired by the CCD imager 16. As a consequence of the extreme light sensitivity and low noise characteristics of the CCD imager, a very large dynamic range of digital imagery is supported by the low-light-level imaging system of the invention. Indeed, digital images of low-light-level scenes at video frame rates with image pixels of, e.g., 4096 useful gray levels or more are supported by the system; an output bit stream of, e.g., 12-bits or more, is provided to represent the full scale of gray levels. This very wide dynamic range has many advantages for observing a low-light-level scene such as a night scene, that has both bright and dark regions in it, or a scene of low contrast, e.g., caused by fog or haze.

The wide dynamic range presents a challenge, however, for display of the imagery on a grayscale or color monitor or other display, like those discussed earlier, because most displays are designed for display of only 256 levels or less of monochrome digital imagery on 8 digital bits or less. 8-bit digital imagery is often preferable because it conforms to the general sensitivity of the human eye. With this display constraint, it is necessary to compress the dynamic range of the imaging system to support a given display range capability. Importantly, this compression is preferably achieved while at the same time preserving the important image data acquired from a scene. Moreover, this dynamic range compression is preferably achieved in real time, i.e., at video rates with minimal latency, e.g., one frame delay or less, to support the real time video capability of the other imaging system components.

In the invention, the digital image processor (28 in FIG. 1) provides low-light-level adaptive dynamic range compression, enabling both local contrast enhancement and local automatic gain control within the acquired image. Local here refers to individual pixels in an image and adaptive here refers to each pixel in the context of its neighboring pixels in the surrounding image area. This localized adaptive processing generates, at video rates, output images in which useful contrast information in both the light and dark regions of the image is preserved, and conforms the digital signal to the dynamic range constraints of a selected display.

Figure 17:
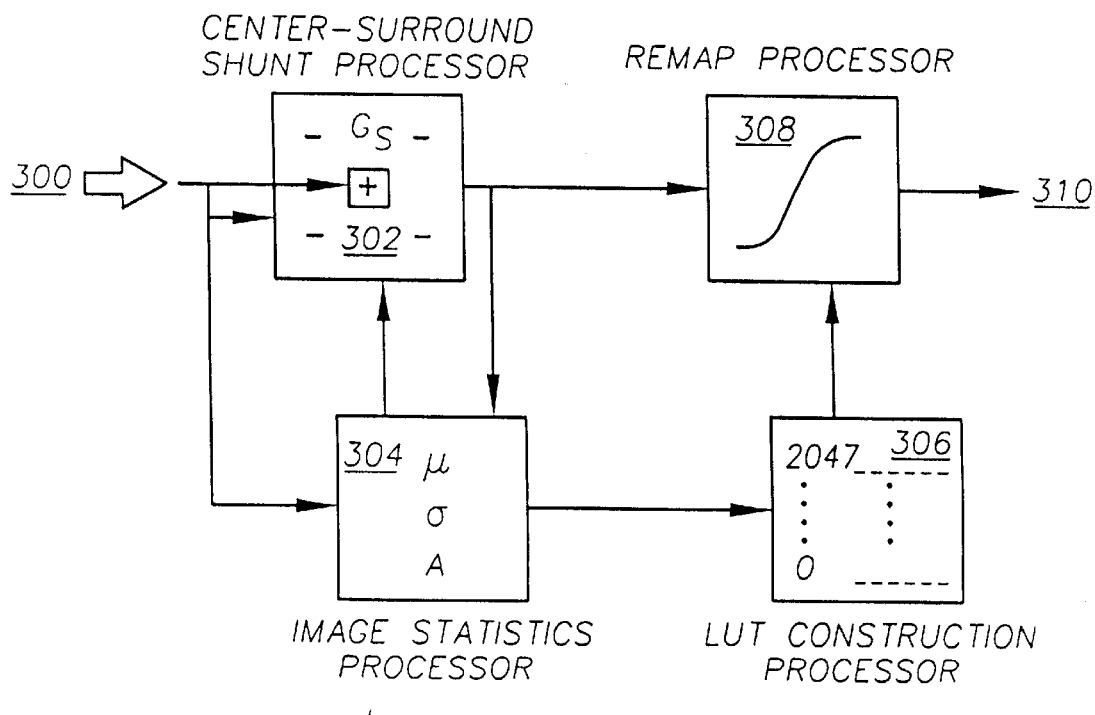
FIG. 17 is an operational block diagram of a digital image processor in accordance with the invention.

Referring to FIG. 17, the digital image processor 28 accepts from the A/D converter and image frame formater a digital image signal 300, which comprises, e.g., a 12-bit digital signal. Four sub processors provide the digital processing capability, namely, a center-surround shunt neural network processor 302, an image statistics processor 304, a look-up table processor 306, and a remap processor 308.

The center-surround shunt processing performed by the shunt processor 302 is characterized by a central excitatory region, preferably a single pixel, and a surrounding inhibitory region, preferably a 5×5 pixel neighborhood, or other neighborhood size, e.g., a 9×9 neighborhood created by a separable 9×1 convolution. This type of computation is suggestive of contrast processing performed at the retinal stage of the human visual system, and is described in detail by, e.g., Ellias and Grossberg, in "Pattern Formation, Contrast Control, and Oscillations in the Short Term Memory of Shunting On-Center Off-Surround Networks, *Biological Cybernetics*, 20, 69–98, 1975.

The shunt processor 302 accepts input imagery of arbitrary dynamic range, enhances the contrast of the image based on data local to each pixel in the image, adaptively normalizes the enhanced result for each pixel, based on data local to each pixel, and then guarantees the resulting image to lie in a prescribed dynamic range, preferably, e.g., in the range of −1 to +1.

The resulting image is then globally rescaled on a pixel-by-pixel basis by way of a look up table (LUT), constructed by the LUT processor 306, to the dynamic range suitable for a given display, e.g., a range of 256 gray levels. The remap processor 308 provides the actual rescaling of the shunted image dynamic range. This remap processor can adapt to temporal changes in the dynamic range of the input image scene as a result of the real time functionality of the LUT construction processor stage 306; the remapping table can thereby be recomputed for nearly every digital video frame, based on the shunted image statistics gathered from earlier frames by the image statistics processor 304. This enables temporally-adaptive nonlinear remapping of the shunted output dynamic range to the fixed dynamic range of the selected display hardware.

Considering the first processing stage, the center-surround shunt processor 302, this shunt processing functionality can be implemented in a variety of suitable embodiments, as will be understood by those skilled in the art. Preferably, the neurodynamics and equilibrium of the so-called center-surround shunt receptive field is described at each pixel location by the relations:

$$\frac{dE_{ij}}{dt} = -AE_{ij} + (1-E_{ij})[CI^C]_{ij} - (1-E_{ij})[G_s * I^s]_{ij};$$

where $$E_{ij} = \frac{[CI^C - G_s * I^s]_{ij}}{A + [CI^C + G_s * I^s]_{ij}} \text{ or} \quad (1)$$

$$E_{ij} = \frac{[(C-1)I^C + (I^C - G_s * I^s)]_{ij}}{A + [CI^C + G_s * I^s]_{ij}},$$

where ij are the row and column coordinates of a given pixel, E is the opponent processed enhanced image, $I^C$ is the digital input image, from the A/D converter, that excites the single pixel center of the receptive field, and $I^s$ is the digital input image, also from the A/D converter, that inhibits the surround $G_s$ of the receptive field, which is convolved against $I^s$.

Figures 18A, 18B, 23:
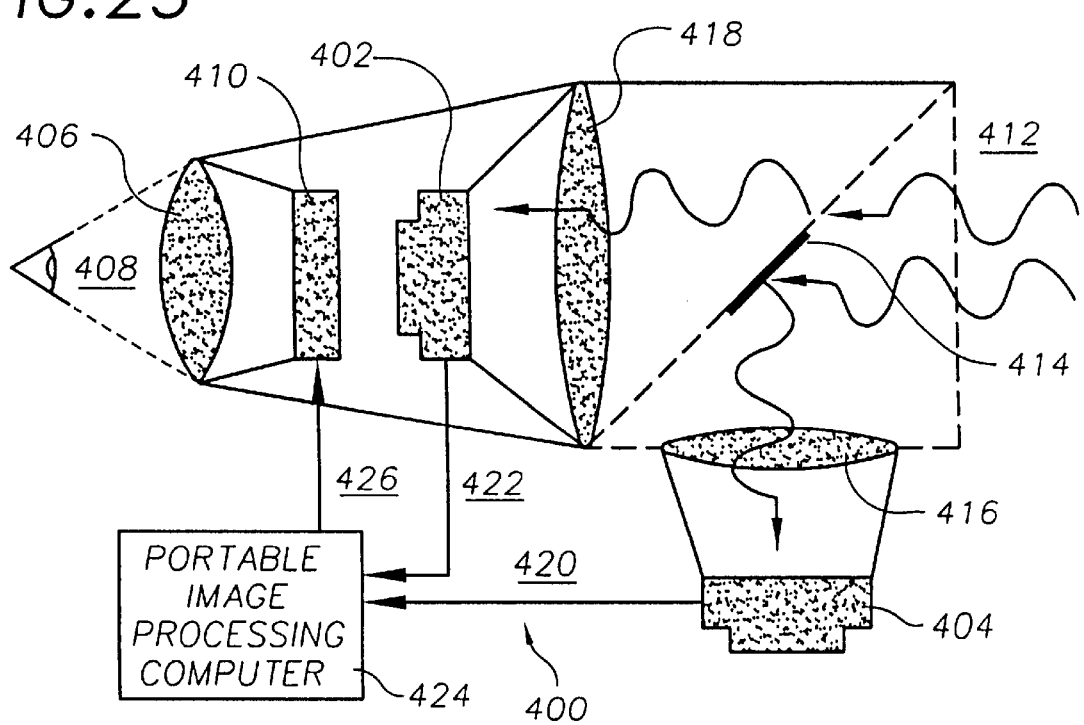
FIGS. 18A–18B are example matrices to be employed by the digital image processor of FIG. 17 for compressing the dynamic range of a digital image.
FIG. 23 shows a diagrammatic illustration of a multi field-of-view imaging system in accordance with the invention.

The surround is modeled as a Gaussian weighted local neighborhood. Referring to FIG. 18A, a preferable 5×5 pixel neighborhood of weights is provided; in FIG. 18B, a preferable one-dimensional 9×1 pixel neighborhood of weights is provided, for enabling an efficient implementation of a two-dimensional 9×9 pixel neighborhood by means of a separable convolution using only the one-dimensional weight neighborhood.

The first relation in equation 1 above models the temporal dynamics of a charging neural membrane leaking charge at a rate A, and has excitatory and inhibitory input ion currents determined by Ohm's law; with the shunting coefficients I±E acting as potential differences across the membrane, and the input image signals modulating the ion-selective membrane conductances. The second relation in equation 1 above describes the equilibrium that is rapidly established at each pixel, i.e., at the frame rate, and defines a type of nonlinear image processing with parameters A, C, and the size of the Gaussian surround. The third relation above is an alternative expression of this equilibrium, explicitly accounting for the spatial contrast term. Preferably, C is set equal to 2, and A is set equal to 10<I>, where <I> is a measure of the mean brightness of the input digital image or that of a previous image, although other values of C and A are also suitable. Indeed, the exact choice of the parameter A can be selected by the user at any moment of the imaging system processing, input by the user controller (32 in FIG. 1).

As stated previously, the input to the first processing stage 302 is typically 12 bits or more, derived from the analog CCD imager output signal. The output of the first processing stage should be computed to an integer precision of at least 10 bits, and preferably 11 bits. The precision should in any case exceed that of the intended display hardware. With the output of the second relation of equation 1 known to be bounded such that −1<E<1, the result of the computation is transformed to the desired interval corresponding to 11 bits via an additional computation such as 1024(E+1). This insures that the output will be in a form suitable for the remap processor 308.

Preferably, the third relation in equation 1 is employed rather than the second relation. In the third relation, the second term of the numerator represents the local spatial contrast. This spatial contrast can be either positive or negative, or zero. While the inclusion of this term acts to enhance the contrast of the output image, it is often desirable to only enhance positive contrast, i.e., local brightening, and not to enhance negative contrast, i.e., local darkening, in an image. This can be appreciated particularly in images of night scenes in which stars against a dark sky are locally brightened by their positive contrast with respect to the sky, but dark rings will be formed around stars due to the negative contrast of the sky with respect to a nearby star in this enhancement mode. In order to remove such visually distracting artifacts, it is preferred to enhance only positive spatial contrast. Thus, when computing the numerator in the third relationship, the second term is reset to zero if it would otherwise be negative. The resulting output dynamic range is then bounded according to 0<E<1, and this is transformed to the desired 11 bit interval via the factor 2047E.

The output of the center-surround shunt processor 302 feeds both the statistics processor 304 and the remap processor 308. The image statistics processor 302 gathers several statistics from this output, as well from the input imagery 300. In particular, the statistics processor 304 computes the mean, $\mu$, and standard deviation, $\blacklozenge$, of the output shunted imagery; or alternatively, computes two other parameters that capture the same qualitative information. This processor also computes the value of the parameter A to be used in computation by the shunt processor 302 for the next following frame. Parameter A is selected to be proportional to the mean <I> of the input image brightness, as reflected in the data-dependent term in the denominator of the second and third relations of equation 1, and preferably is selected as A=10<I>.

The statistical parameters generated by the statistics processor 304 are fed to the LUT construction processor 306 in order to construct a LUT that will be used by the remap processor 308 to transform the value of each pixel output from the shunt processor 302. The LUT consists of a set of values equal to the number of possible input values derived from the shunt processor. Preferably, the shunt processor computation is performed with an integer precision of 11 bits; and in this case, the LUT contains 2048 values. In general, the LUT should be preferably constructed to admit input values of 10 bits or more, corresponding to 1024 or more table entries. The LUT values constitute a nonlinear mapping so as to remap the pixel values provided by the shunt processor to the dynamic range of the intended display hardware, e.g., 0–255 gray scale levels or less, depending on the quality of the intended display hardware. The LUT values are computed by the LUT construction processor 306 according to a relation that provides qualitative results resembling the following sigmoid:

$$E_{out} = 127.5 + 127.5 \tanh\left[\frac{1}{2\sigma}(E_{in} - \mu)\right], \quad (2)$$

where tanh corresponds to the hyperbolic tangent function. For each possible input value $E_{in}$, which is between 0–2047 preferably, equation 2 yields a corresponding output value $E_{out}$ in the range of 0–255, computed to 8-bit integer precision. Thus, the LUT provided by the LUT construction processor 306 is, in the preferred implementation, an 11 bit-in, 8 bit-out remapping function.

The remap processor 308 applies the LUT remapping function to each pixel of the image processed by the shunt processor 302. Thus, each output value from the shunt processor, which preferably is an integer in the range of 0–2047, serves as an address into the LUT. The output of the LUT for a given address is then an 8-bit number in the range of 0–255, meant to drive an intended display. In order to maintain real time flow of image data through the processor with minimum latency, the LUT applied by the remap processor is preferably constructed previous to the time when the pixel data is output from the shunt processor 302. The remap processor 308 thereby produces a remapped digital output signal 310 that is delivered to, e.g., dynamic random access memory, for storage, or directly to the display driver 31 (FIG. 1), e.g., a video-random access memory, for conversion to analog signals which drive a display monitor 33 (FIG. 1) in real time.

The adaptive dynamic range compression provided by the digital processor can be iterated to provide further enhanced contrast of an image. That is, the resulting processed imagery can be reprocessed by the same algorithm. Due to the nonlinear nature of the algorithm, two iterations cannot be simply related to a single iteration, however. In some implementations of the low-light-level imaging system of the invention, it may be preferable to iterate the digital processing multiple times to enhance certain subtle contrasts in the original imagery.

An imaging system in accordance with the invention was configured with the dynamic range compression functionality of the digital signal processor to experimentally observe the results of that compression functionality. The imaging system was configured with a back side illuminated, frame transfer CCD imager having 128×128 pixels, and four output ports each operated at about 2.75 MHz; a TEC was employed to reduce the CCD imager dark current. The A/D and formater of the imaging system were configured to produce a digital video image sequence having a dynamic range of 12 bits and a frame rate of about 30 frames per second. The imaging system was oriented to image various scenes under starlight conditions, corresponding to a scene illuminance of about 1.86 mLUX.

Figure 19A:
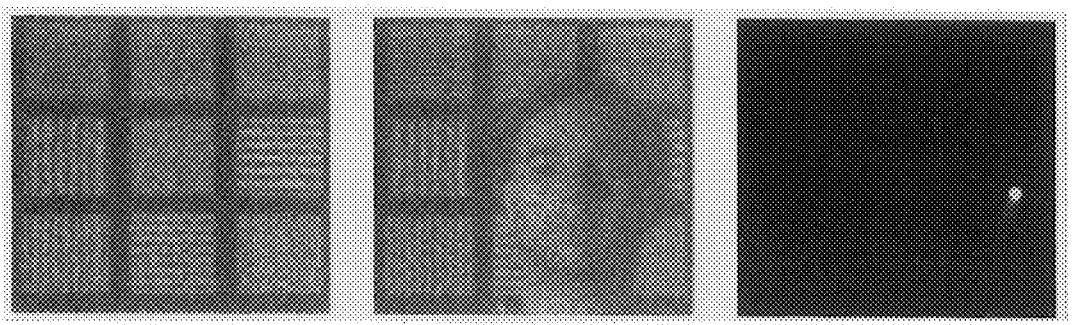
FIG. 19A shows three starlit scenes each having 8 bits of dynamic range selected from original 12-bit imagery.
Figure 19B:
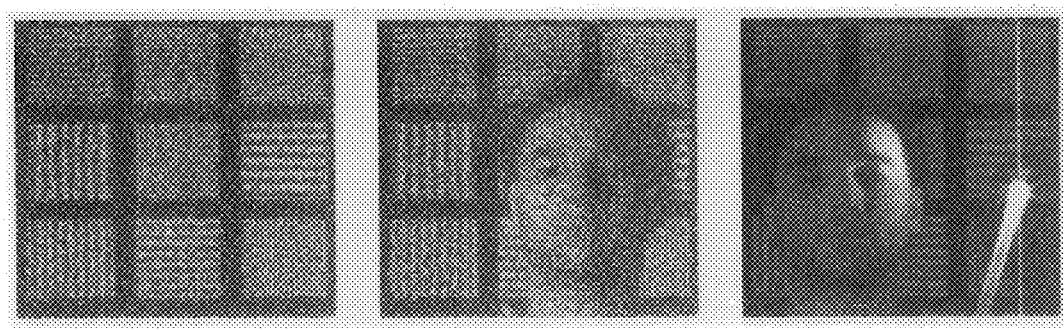
FIG. 19B shows the original 12-bit imagery that produced the 8-bit scenes of FIG. 19A, in this case after being processed by the digital image processor of FIG. 17 to produce adaptively processed 8-bit imagery.

Referring to FIGS. 19A and 19B, three different scenes were presented for imaging; the first being a resolution chart, the second being the resolution chart with a human face in front of the chart, and the third being the resolution chart with a human face and a light emitting diode (LED) in front of the chart. First, each of the three scenes was imaged to produce a corresponding 12 bit digital video image output after the imaging system A/D and formater, i.e., output without dynamic range compression applied to the image, and then for each scene, a dynamic range of only 8 bits out of the produced 12 bit image was selected for display; in each case the 8 bit dynamic range particularly chosen with respect to the original 12 bit dynamic range was based on the particular intra-scene light levels of the given scene. Then the same three 12-bit images were processed with the dynamic range compression functionality in place. In this case, the digital image processor compressed the 12 bit digital video sequence output by the A/D and formater to produce a corresponding 8 bit digital video sequence.

FIG. 19A is a photograph of each of the three imaged scenes produced without dynamic range compression processing; FIG. 19B is a photograph of the same three images processed with the dynamic range compression. In all three cases, the processed images provide a higher degree of contrast and therefore better define the various features in the image. This is most dramatically illustrated in the last image in which an LED is included; the adaptive processing capabilities of the digital image processor enable viable imaging of the contrast defining the man's face while also imaging the bright LED close to the face as well as the resolution chart in the background. These examples clearly illustrate the powerful imaging capability enabled by the dynamic range compression functionality of the invention. This functionality enables display of objects in a scene across the entire original dynamic range of the scene while enhancing contrast in the scene such that features not normally resolvable are distinguishable.

Considering various embodiments of the digital image processor for providing the dynamic range compression functionality, the various processing stages of the digital image processor form a computational pipeline. If T is the number of the image frame processed by the shunt processor, then the image statistics gathered by the statistics processor correspond to frame T. Once the statistics processor has gathered its data from frame T, the LUT construction processor constructs a LUT to be used on a later frame, e.g., frame number T+1 or T+2. Meanwhile, the remap processor 308 applies to frame T, as it is output from the shunt processor, a LUT constructed during frame T−1 using statistics derived from frame T−2. It is also possible to use a LUT based on statistics from frame T−1 by including a delay buffer between the shunt processor and the remap processor, as long as the delay is of sufficient length to hold the output pixel values from the shunt processor while the LUT is constructed. In general, this buffering is not necessary because the remapping LUT does not change much from one frame to the next.

There are many suitable hardware implementations of the digital image processor computational pipeline, including programmable integer processors (PIPs) that support 16 bit arithmetic working in conjunction with random access memory (RAM) for image storage, PIPs working in conjunction with dedicated LUT hardware, e.g., RAM, for the LUT, as well as RAM for image storage, and entirely dedicated hardware, e.g., custom processors consisting of LUTs and adders realized by, e.g., a set of field programmable gate arrays (FPGAs) or application specific integrated circuits (ASICs) with RAM, working in conjunction with additional RAM for image storage.

From the standpoint of flexibility, a system built around PIPs is preferred. From the standpoint of portability of the system, including considerations of size, power, weight, etc., the dedicated hardware configuration is preferable.

In the case of a PIP and RAM system, a powerful integer processor such as the recently available Texas Instruments TMS320C80, running at 50 MHz or faster can process 12 bit low-light CCD imagery with TV resolution (roughly 640× 480 pixels) at video rates. By bringing image data stored off-chip in dynamic random access memory (DRAM) into one of the processor's static random access memory (SRAM) banks, the processor can compute the numerator and denominator of the second or third relations of equation 1, and can approximate the required divide operation in either of two ways; via a "shift right" of the numerator based on at least the two most significant bits (MSBs) of the denominator, the second MSB determining the "rounding up" to the next higher power of 2, or in the preferred implementation, by storing in on-chip SRAM a look-up table that accommodates at least 9 bits in and 16 bits out, which provides the inverse of an input such as the computed denominator and then multiplies this against the computed numerator to form the required quotient.

Alternatively, a processor with a sufficiently fast integer or floating point divide operation can carry out the required division of numerator by denominator directly. In either case, the resulting shunt computation should provide an output with at least 10 bits of integer precision, and preferably 11 bits. The same integer processor can keep track of the required statistics, construct the remap LUT of 2048 values and store it in on-chip SRAM, and apply the remap LUT to the shunt output imagery. For larger image frames, or faster frame rates, multiple integer processors can be used in parallel on sub-images. In the case of the TMS320C80, there are actually four integer processors on-chip which each process one-fourth of the image pixels, as well as a master processor which can be used to construct the remap LUT.

In the case of the second hardware option described above, i.e., use of an integer processor such as the TMS320C80 supplemented with dedicated LUT hardware, the integer processor is responsible for computing the numerator and denominator of the second or third relations in equation 1, preferably to 10 bits and 6 bits of accuracy, respectively, as well as keeping track of image statistics and computing the remap LUT. The resulting numerator and denominator are concatenated to form a 16 bit word that is output from the integer processor directly to a dedicated "divide" LUT, preferably of 64K words, K=1024. This "divide" LUT treats the 16 bit input word as an address into its 64K entries, and outputs a result corresponding to a preprogrammed "divide operation" that is preferably at least 10 bits of integer precision, and more preferably 11 or 12 bits long. This output is recirculated to the integer processor in order to gather shunt image statistics, and also forms the input to the dedicated "remap" LUT. This "remap" LUT is not preprogrammed, but rather is periodically rewritten by the integer processor, which recomputes the "remap" LUT based on the most recent shunt image statistics. The dedicated "remap" LUT then outputs the final 8 bit integer pixel value to storage or to the display drivers.

In the case of entirely dedicated hardware, all required multiply and divide operations can be carried out by, e.g., preprogrammed LUTs, none of which exceed 16 bits input with 16 bits output, plus a "remap" LUT as described above. All data flow, additions, subtractions, and shift operations can be achieved through the use of FPGAs or ASICs. Stored 12 bit image pixels from DRAM can be pipelined through the dedicated hardware, and output as 8 bit processed pixels back to DRAM for storage or directly to the display driver.

As will be recognized by those skilled in the art, other hardware configurations can be employed to embody the digital image processor of the invention. Furthermore, the adaptive and real time dynamic range compression provided by the digital image processor can be applied to a wide range of imaging applications beyond the low-light-level imaging enabled by the imaging system of the invention. For example, the dynamic range compression is applicable to digital imaging such as X-ray, magnetic resonance imaging, tomography, and other imaging applications in which a wide dynamic range of rich image information may need to be compressed to accommodate display hardware of a lower dynamic range; with use of the digital image processor, such information can be compressed for display in real time as it is produced. Forward-looking-infrared imagers (FLIRs), e.g., scanning type FLIRs, focal plane arrays, and other similar imagers also can benefit from the dynamic range compression functionality. In a given application, the dynamic range compression functionality is preferably run at a rate commensurate with the digital data rate provided by the imager and system components which precede it.

There is no specific field of image processing applications to which the dynamic range compression functionality of the invention is limited. Indeed, any two- or more dimensional digital imagery of a dynamic range that is wider than an available display or even follow-up processing hardware can be processed by the digital image processor of the invention to produce a real time, adaptive compression of the imagery to a desired dynamic range. In general, all that is required of the digital imagery is that its digital representation be characterized by signal integrity that supports the needed number of bits, e.g., greater than 8 bits, to fully represent the imagery as that imagery is input to the digital image processor. Thus, the digital image processor and its adaptive, real time dynamic range compression functionality can be employed with any real time video stream processing of adequate signal integrity. Thus, as will be recognized by those skilled in the art, many imaging applications can benefit from the dynamic range compression provided by the processor.

Other digital processing functions beyond adaptive dynamic range compression are contemplated for use with the low-light-level imaging system of the invention. For example, imager non-uniformity and defect compensation, user-specified custom image enhancement, background cancellation, image motion compensation, motion detection enhancement, feature extraction, and other image processing can be undertaken to produce a displayable image in any of a wide range of formats. This is enabled in the invention by the production of image information in the form of an electronic signal, unlike conventional vacuum tube-based imagers, in which image information is directly converted from photoelectrons to a phosphor display.

Turning to the display configuration of the imaging system of the invention, the display driver 31 (FIG. 1) accepts the digital image frame sequence from the digital image processor and produces corresponding signals appropriate for the intended display hardware. Suitable display drivers include conventional display drivers as provided for use with commercially available displays. As discussed earlier, the display can consist of any suitable hardware that can display a sequence of image frames at a desired frame rate. For example, monitors, cathode ray tubes, semiconductor displays, and other such displays are acceptable.

Finally, the communications link 35 (FIG. 1) of the imaging system can consist of any conventional transceiver system that can support a video signal of a selected bandwidth over a distance set by a given application for display at the remote location at an intended frame rate. For example, a conventional wireless transceiver can be employed to transmit signals from and receive signals at the imaging system of the invention. The communications link can transmit and receive the video imagery in the digital or analog domain, but the digital domain is preferred for limiting noise generation in the signal.

The various components and features of the low-light-level imaging system of the invention described above work together synergistically to produce a system with superior imaging performance over that of conventional low-light level imagers, and to enable many low-light-level imaging capabilities that were heretofore unrealizable or impractical. In particular, the imaging system of the invention provides substantial advantages over conventional intensifier tube-based imaging systems, including improved optical sensitivity, improved noise characteristics, improved noise-limited resolution at low light levels, much greater intra-scene dynamic range, and reduced blooming effects, as well as the capability for electronic image enhancement and for communication of electronic images to locations remote from the imaging system.

Figure 20:
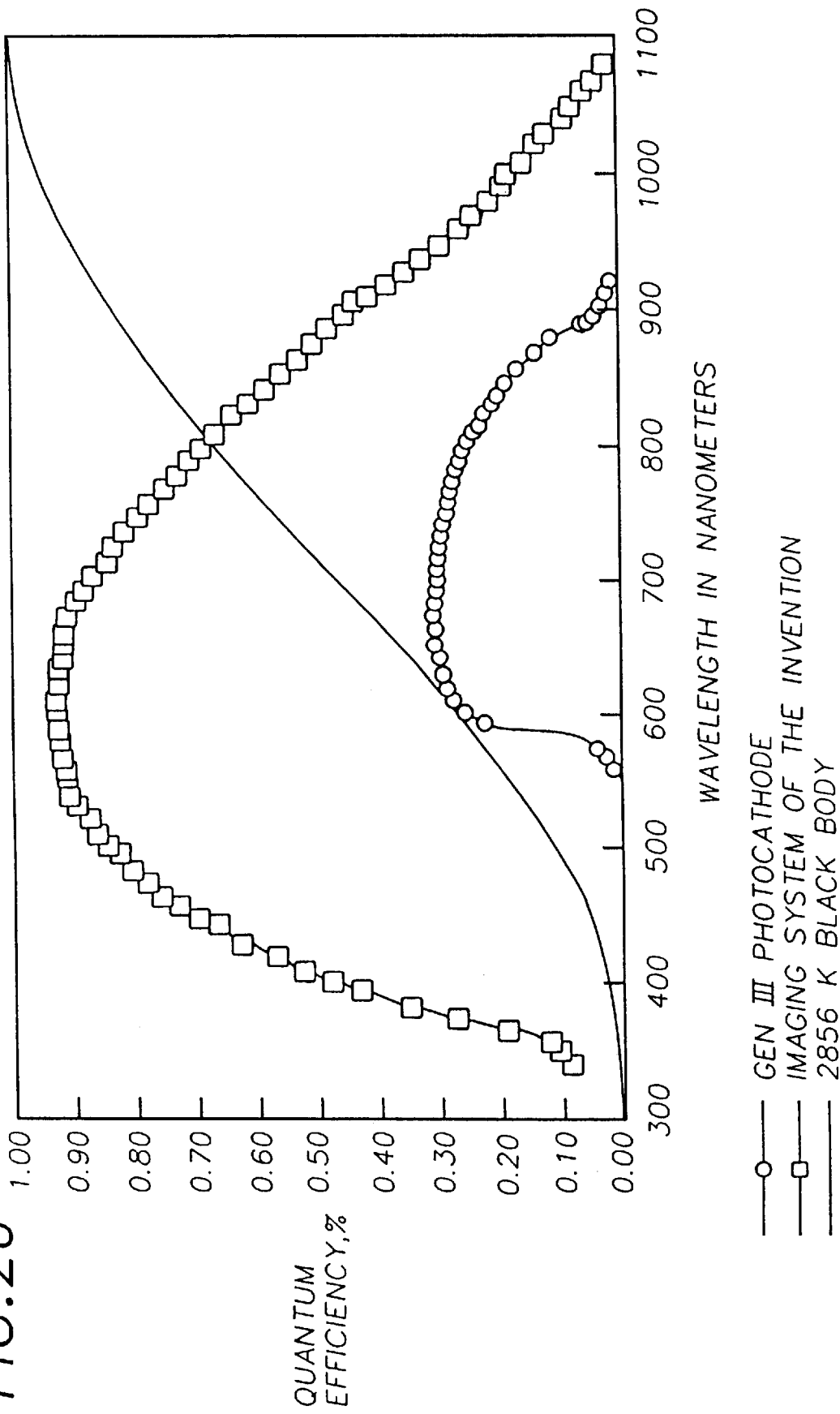
FIG. 20 shows a plot of quantum efficiency of the imaging system of the invention and a conventional low-light-level imager, as a function of wavelength.

Referring to FIG. 20 there is shown a plot of the quantum efficiency, in percent, as a function of the wavelength of light input to an imaging system in accordance with the invention and one conventional vacuum tube-based intensifier system, known as the Gen III system, i.e., the third generation U.S. military technology for image intensifier tubes, which employ a gallium arsenide photocathode. Quantum efficiency is here defined for the imagers as the ratio of the number of photoelectrons produced in an imager to the number of incident photons, for a given photon wavelength. The data was obtained using an imaging system configured in accordance with the invention employing a back-illuminated CCD imager formed on a silicon substrate of about 10 $\mu$m in thickness and of relatively low resistivity.

Also shown for reference is the spectral distribution of photon flux for a 2856 degrees Kelvin black body, normalized to unity at a wavelength of 1000 nm; this black body flux is a good approximation to the spectral distribution of the night sky illuminance under moonless conditions. As is apparent from the plot, the low-light-level imaging system of the invention provides a much higher quantum efficiency than the Gen III system at any given wavelength along the spectrum, and provides a peak quantum efficiency of greater than about 90% at a wavelength of about 600 nm. In dramatic comparison, the Gen III system achieves a peak quantum efficiency of no more than about 30% at about 600 nm. The plot further illustrates the resulting much broader overall spectral response of the imaging system of the invention compared with that of the Gen III system.

Integration of the respective Gen III quantum efficiency spectrum and that of the imaging system of the invention each against the night sky illumination yields a sensitivity value about 6111 $\mu$A/lumen for the imaging system of the invention and about 1300 $\mu$A/lumen for the Gen III system. This large sensitivity advantage of the imaging system of the invention is an important factor in obtaining high resolution of low-light-level scenes, as explained in detail below. Use of a high-resistivity silicon substrate in the CCD imager fabrication process, as described above, instead of a relatively lower-resistivity silicon substrate, results in a CCD imager and imaging system that provides even higher quantum efficiency in the red and near infrared regions of the spectrum than that of the lower-resistivity CCD imager process; this results in a sensitivity against the night sky illumination of as much as about 8076 $\mu$A/lumen, which is an even larger sensitivity advantage over the Gen III system.

The noise characteristics of the low-light-level imaging system of the invention, being very different from that of the Gen III imaging system, results in significant improvement in overall imaging system noise. The Gen III system, which as explained earlier achieves low-light-level performance by means of gain in a micro-channel plate, suffers from the high noise associated with that gain, although the dark current associated with the system is very low and does not contribute significantly to the total noise of the system. The cascading gain mechanism of the micro-channel plate is inherently noisy; not only is the gain per cascading photo-electron "stage" low, but also, the equivalent number of stages is itself a statistical variable, resulting in a significant addition to the noise level.

In consequence, the Gen III tube has a high noise figure that is on the order of about 2. Noise figure is here meant as the ratio of the signal-to-noise level at the input of the system to the signal-to-noise level at the output of the system. This high noise figure imposes a severe noise penalty and significantly degrades the low-light-level capability of the Gen III system. In addition, the character of this channel plate noise has been found to be very objectionable; indeed, it has been found necessary to intentionally reduce the temporal response of the system to avoid motion sickness in the user. This reduced temporal response in turn produces a lag effect that degrades the dynamic resolution of the Gen III system.

In dramatic contrast, the low-light-level imaging system of the invention provides real time low-light-level imaging without the use of a gain mechanism—the very high quantum efficiency and sensitivity of the CCD imager employed in the imaging system enables this. As a result, noise and other unwanted characteristics of a gain mechanism are entirely eliminated in the imaging system of the invention. Additionally, the low dark current of the CCD imager enabled by the dark current perimeter drain, and the further suppression of dark current using means such as a TEC result in a corresponding CCD imager dark current noise on the order of only about 5 e$^-$ RMS/pixel or less, where RMS refers to a root-mean-square measurement. The very low noise CCD imager output circuits employed in the invention then further limit noise generation as the low-noise signal is output. Accordingly, as explained earlier, the CCD imager produces an output signal that is characterized by a very low noise level of less than about 5 e$^-$ RMS/pixel at a data rate per output port of about 2.75 MHz.

The analog signal processing circuitry provided in the imaging system at the output of the CCD imager further reduces the noise level, as explained previously, by filtering out noise associated with the reset operation of the CCD imager output circuit. Taken together, these various noise suppression and noise reduction mechanisms enable a very low overall imaging system noise, e.g., on the order of only a few electrons RMS/pixel. This low noise level provides a superior low-light-level imaging capability that heretofore was unattainable at real time speeds.

In particular, the image resolution capability of the imaging system of the invention is superior to conventional imagers at low light levels because image resolution at low light levels is a direct function of an imaging system signal-to-noise ratio. Specifically, the very low noise levels of the imaging system of the invention, taken together with the large CCD imager signal, enabled by its very high quantum efficiency, provides a dramatic advantage in signal-to-noise ratio over the Gen III system; this results in a concomitant advantage in noise-limited resolution at low light levels.

An operational comparison was performed to compare the low-light-level imaging capability of the imaging system of the invention with that of the Gen III system. The system built in accordance with the invention employed a 128×128 pixel, back-illuminated, frame transfer CCD imager operated with four output ports in accordance with the invention, mounted on a TEC within the CCD package, together with an analog signal processor, A/D converter, and image frame formater. A second TEC external to the CCD imager package was employed to further reduce dark current charge packet generation of the CCD imager. The imaging system was operated at 30 frames/second, with individual output ports each running at about 2.75 MHz, selected to correspond to the data rate required for a practical, large-format 640×480 pixel imager operating at 30 frames per second.

The imaging system of the invention was set up for operation side-by-side with the Gen III system for comparing the performance of the two systems. The Gen III system was configured with a conventional Gen III, circa-1994 intensifier tube, the output of the tube being optically coupled to a commercial CCD camera to provide an electronic image. With this configuration, both the Gen III system and the imaging system of the invention provided electronic output images.

The two systems were each provided with similar 25 mm focal-length lenses, set at F/1.4, and the systems were oriented such that they both viewed the same input scene. The input scene was a resolution test pattern characterized by 50% contrast, illuminated at a light level corresponding to a starlit scene, i.e., a scene illuminance of about 1.86 mLUX. The light source was calibrated for the spectral response of the Gen III image intensifier tube. The light source included a filter to block out blue light from the scene, to which the CCD imager of the invention, but not the intensifier tube, would be sensitive; the comparison was thus somewhat biased in favor of the Gen III system.

Figure 21A:
FIGS. 21A and 21B show photographs of starlit images produced by the imaging system of the invention and a conventional low-light-level imager, respectively.
Figure 21B:

The images produced by the two systems, both operating at 30 frames/second, were displayed side-by-side on the same monitor, with the image from the Gen III system electronically cropped to match the field of display of the small-format CCD imager. Neither image employed any digital processing to enhance contrast or compress dynamic range. FIG. 21A is a photograph of the monitor image produced by the imaging system of the invention, and FIG. 21B is a photograph of the monitor image produced by the Gen III imaging system. Comparison of the two images shows clearly the superior performance of the imaging system of the invention under the starlight conditions of the experiment. The dramatically improved low-light-level resolution provided by the invention enables a wide range of low-light-level applications and human activities that are only marginally possible, if at all possible, with conventional low-light-level imaging systems.

Figure 22:
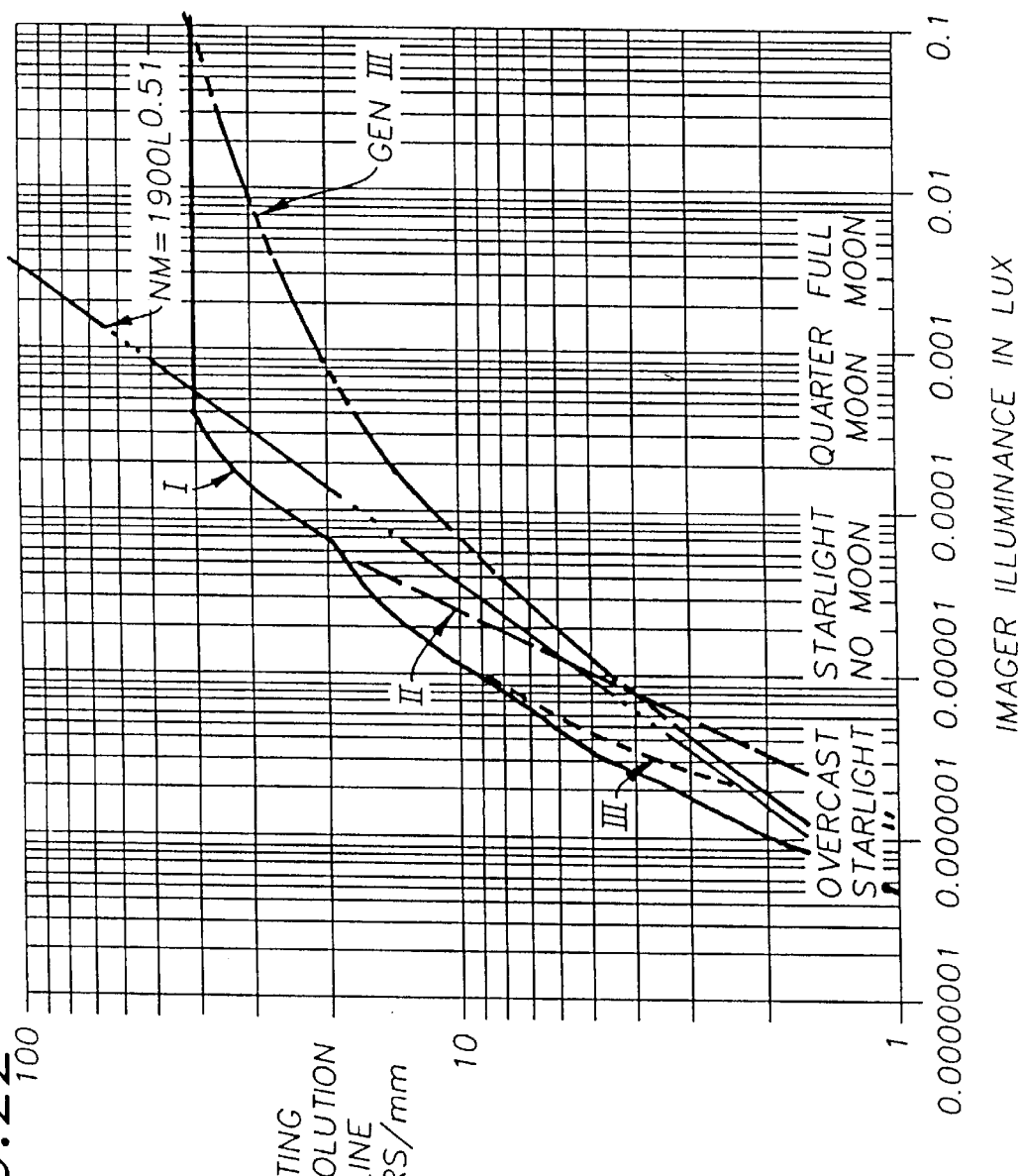
FIG. 22 shows a plot of calculated limited resolution in line-pairs/mm as a function of imager illuminance in LUX for the imaging system of the invention and a conventional low-light-level imager.

Referring to FIG. 22, there is shown a plot of the limit of image resolution as a function of imager illuminance, i.e., illuminance on the imager, for the imaging system of the invention and the Gen III system, based on respective theoretical models for the operational and performance characteristics of the systems. The image resolution limit is quantified as line-pairs/mm (LP/mm); i.e., the maximum number of line pairs that can be resolved in a span of one millimeter, referred back to the imager, at a given illuminance. The Gen III system characterized in the plot has a noise figure of about 2, a fill factor of about 1, and a sensitivity of about 1300 $\mu$A/lumen. The imaging system of the invention is characterized by a sensitivity of about 6111 $\mu$A/lumen and a noise level of about 5e$^-$ at a readout rate of about 2 MHz and a controlled temperature of about $-20°$ C. The imaging system parameters assume 2×2 binning operation of the CCD imager below about 20 LP/mm and 4×4 binning operation of the CCD imager below about 10 LP/mm.

The resolution curves shown in this plot were calculated using a conventional model, given in, e.g., the RCA Electro-Optics Handbook, 1974, p. 196, for low-light-level imaging, the model being modified to include the case of electronic imaging with finite signal output noise and dark current noise as well as the inherent photoelectron noise. In order to provide a direct comparison of performance capability of the imaging system of the invention with the Gen III system, the plot provides noise-limited resolution as a function of illuminance of light impinging the imagers.

In the calculation, it is assumed that the resolution pattern consists of the standard U.S. Air Force three-bar resolution test pattern, having a contrast of about 0.3, and an observation time of about 0.05 seconds, corresponding to that observation time used in similar calculations by the U.S. Army Night Vision Laboratories. The calculation was made for an imaging system in accordance with the invention employing a CCD imager having pixel dimensions of about 12.7 $\mu$m×12.7 $\mu$m, operating at about 30 frames per second.

The range of scene illuminances given in the plot, referenced to the imager illuminances, as explained below, corresponds to the spectrum of conditions typical of low-light-level imaging applications. Full moon conditions provide a scene illuminance of between about $4\times10^{-2}$–$3\times10^{-1}$ LUX, quarter moon conditions provide a scene illuminance of between about $1\times10^{-2}$–$4\times10^{-2}$ LUX, starlight conditions provide a scene illuminance of between about $6\times10^{-4}$–$2\times10^{-3}$ LUX, and overcast starlight conditions provide a scene illuminance of between about $3\times10^{-5}$–$3\times10^{-4}$ LUX.

The imager illuminance scale of the plot can be referenced to these natural scenes by specification of a particular lens T-number and a particular scene reflectance. For the plot calculations, a lens T-number of 1.35 was employed; this is the T-number typically used in typical night vision systems. For convenience, a lens Modulation Transfer Function (MTF) of unity was assumed, and the value for the scene reflectance was taken as 30%. These choices are exemplary and somewhat arbitrary; however, it is clear that different choices have the effect merely of shifting the scene illuminance scale with respect to the imager illuminance scale. Such a shift in no way affects the relative advantage of the imaging system of the invention indicated by the calculation.

As shown in the plot, the imaging system of the invention provides superior resolution over the Gen III system at any imager illuminance condition, referenced to the scene illumination as discussed above. Under full moon illuminance conditions and even down to quarter moon illuminance conditions, the limit to resolution of the imaging system of the invention is set not by the system noise but by the CCD imager pixel geometry, at about 40 LP/mm; the Gen III system is already noise-limited in resolution at this imager illumination and achieves only about 24 LP/mm at full moon and about 14 LP/mm at quarter moon illuminance. As the illuminance is further reduced, the imaging system of the invention becomes noise-limited in resolution and achieves a resolution of about 20 LP/mm under starlight conditions, while the Gen III system achieves only half that, i.e., about 10 LP/mm. In overcast starlight, the imaging system of the invention achieves a resolution of about 3.5 LP/mm, while the Gen III system achieves only about 1.1 LP/mm.

Also shown in the plot of FIG. 22 is a straight line approximation to the bounding envelope of noise-limited-resolution performance of the imaging system of the invention, taking into account various possible binning modes. This straight line approximation is given by:

$$N_M = 1900\, L^{0.51}, \tag{3}$$

where $N_M$ is the noise-limited-resolution in LP/mm referred back to the imager, and L is the imager illuminance in LUX. Comparing the straight line approximation with the calculated curves, it is seen that for every illuminance value in the plotted range, this line defines a minimum noise-limited-resolution that is provided by the imaging system of the invention and that is not achievable with the conventional Gen III system configuration given.

As indicated in the plot, binning of the charge packets in the pixels can be employed to increase the noise-limited-resolution capability at the lower light levels. In this example with 12.7 $\mu$m×12.7 $\mu$m pixels, as the light level is decreased, and correspondingly, the noise-limited resolution decreases, below about 20 LP/mm there is no advantage in resolution to be gained from a pixel size smaller than about 25 $\mu$m×25 $\mu$m; and below about 10 LP/mm there is no advantage from a pixel size smaller than about 50 $\mu$m×50 $\mu$m. In consequence, the CCD imager of the invention can be binned in a 2×2 mode below about 20 LP/mm and binned in a 4×4 mode below about 10 LP/mm before readout of the pixel signal from the CCD imager, with a net improvement in noise-limited resolution, as indicated in the plot.

This resolution comparison clearly illustrates the improved low-light-level imaging that is enabled by the image system of the invention. It must be emphasized that this superior low-light-level resolution performance is provided at real time speeds. Thus, the imaging system overcomes the limitations of slow-scan and other similar CCD-based imaging systems that can resolve images at low levels of light but that rely on relatively long CCD integration times to produce a viable low-light-level image; real time video sequences of a low-light-level image are not possible, as a practical matter, with such systems.

Turning to other advantages of the imaging system of the invention, the imaging system is characterized by a very large intra-scene dynamic range, as explained above, due to the very high quantum efficiency of the CCD imager in conjunction with its very low noise characteristic. The maximum image signal level for any given scene is set by the full-well capacity of the CCD imager of the invention, which is about 300,000 $e^-$, and the minimum distinguishable image signal level is set by the CCD imager readout noise, which as stated above, is about 5 $e^-$; as a result, the imaging system of the invention is characterized by a dynamic range of about 60,000 levels, giving a digital image dynamic range representation of about 16 digital bits.

This is a dramatically increased dynamic range over that of conventional tube-based imagers, e.g., the Gen III system, which is characterized by a dynamic range of at most about 200 levels, and which is severely limited by the characteristics of the micro-channel plate, as discussed above. The imaging system of the invention thus provides an intra-scene dynamic range of more than about 200 times greater than that of conventional systems. This very large intra-scene dynamic range enables imaging of objects both in very dark portions of a scene and in bright portions of the same scene simultaneously. Recall that the digital image processor provided by the invention enables real time compression of the very large dynamic range of the image signal to a desired subrange, while preserving the object contrast information, so that the resulting processed image can be displayed on conventional display hardware.

In addition, the anti-blooming drains in the CCD imager of the invention, as described earlier, provide control of an image overload up to a factor of about $10^6$, thereby providing damage-protection for image overloading such as direct imaging of the sun, an intense flare, TV floodlights, or other similar overloading conditions. Vacuum tube-based image systems suffer from electron redistribution under high illumination conditions, and are inherently susceptible to damage through the high light exposure of the photocathode. The imaging system of the invention, being based on silicon, is inherently rugged and not easily damaged by high light overloading.

The many performance advantages outlined in this discussion, in combination with the portability, flexibility, and customization provided by the imaging system of the invention, result in a low-light-level imaging system that heretofore has been unattainable.

In an alternative embodiment of the low-light-level imaging system of the invention, two or more CCD imagers, in conjunction with real time computer processing, are configured in a low-light-level imaging system that simultaneously images multiple fields of view at different resolutions and presents them to the user as a single blended image. This configuration is motivated by the nonuniform sampling characteristics of retinal photoreceptors; indeed, the eye samples a scene at much higher resolution in the central part of the field of view, and sampling resolution degrades into the peripheral field of view. The central field of view is thus used for tasks requiring high visual acuity, like reading and shape recognition, whereas the peripheral field of view is important for detecting fast moving objects and capturing the user's attention, but is not useful for shape recognition.

This suggests a strategy whereby a low-light-level imaging system can be endowed with a central field of view, at high resolution, that is presented at unity magnification on an output display, as well as a wide peripheral field of view that is presented at reduced resolution on the display, with the two fields of view blended together. The central imaged field would subtend an angle typical of conventional low-light-level imagers, i.e., approximately 40 degrees or more. The peripheral field of view can extend quite a bit further, e.g., to 100 degrees, but would appear minified on the display; yet it would provide greater visual context than the central field alone, and a moving object in the periphery could capture a user's attention, who could then turn the low-light-level imaging system towards the object of interest so as to image that object with the high resolution part of the field of view.

Referring to FIG. 23, this is achieved in the invention, in one example, to provide a wide field of view-multiresolution imaging system 400 that includes two CCD imagers each conforming to the performance standards described earlier; the imagers can be of a planar or curved profile, but a preferable combination is described below. The example system shown is portable and provides an eyepiece 406 for a user to focus his gaze 408 directly on a display 410 in the system in alignment with one of the CCD imagers 402.

In the system operation, the axes of the two imagers are aligned on a scene to be imaged. Incident light 412 is split by a beam splitter 414. In a preferable configuration, one of the imagers 404 is mounted on a planar substrate and uses a longer focal length lens 416 to image a central field of view, typically 40 degrees or more; while the second imager 402 is mounted on a curved substrate and uses a short focal length lens 418 to image a wide field of view, possibly 100 degrees. Both imagers can have similar or equal numbers of pixels, but the field of view per pixel is very different for the two imagers.

The beam splitter can embody, e.g., a typical 50/50 beam splitter, but this is not the most efficient. Instead, it is preferred that, as shown, the beam splitter 414 is apertured and angled at 45 degrees to the lines of sight to the two imagers, which are preferably angled at 90 degrees to one another, with a central area of high reflectivity so as to image that portion of the field of view onto the narrow field high resolution imager, and a clear outer area so as to transmit the peripheral field of view to the wide field low resolution imager.

The two CCD imagers produce analog image signals 420, 422, that in one example configuration are input to a portable image processing computer 424 for digitization and digital image processing; the digitization and digital image processing can alternatively be provided by separate components. The resulting two digital images are manipulated by the computer 424 so as to blend the two together, with the narrow field high resolution image in the center of the composite image, and the wide field low resolution image surrounding the central image area so as to form a peripheral part of the composite image. The resulting composite image 426 is output to the display 410, on which it is displayed to the user with unity magnification at the central high resolution area, and with less than unity magnification for the peripheral low resolution area. With this operation, the display must subtend a field of view, with respect to the user viewing it, that exceeds the central narrow field but that may be less than the peripheral wide field.

The wide field peripheral image can be minified uniformly, or it can be compressed in spatial extent nonuniformly, say with increasing minification towards the extreme edges of the wide field of view. The central and peripheral fields will be smoothly blended together in the preferred implementation. Preferably, this combining of central and peripheral fields of view occurs at about real time speeds with a latency time that does not exceed one frame time. Any one of a wide range of conventional image blending algorithms can be employed in the invention to achieve the desired field of view blending in real time.

In one embodiment of this system, two CCD imagers, each of 512×512 pixels, are aligned so as to image a scene with a central field of 40 degrees and a peripheral field of 100 degrees. The two fields produced by the imagers are combined as described above, with increasing minification of the peripheral field towards the outer edge of the field. The composite image is presented on a display supporting 768×768 pixels, subtending a user's field of view of 60 degrees, say. In this case, the central 512×512 pixels of the display present the central field of 40 degrees, i.e., 20 degrees around the axis, at unity magnification, with resolution of 0.078 degrees/pixel, and the outer "ring" of 128 pixels presents the 30 degree peripheral annular field which extends from 20 degrees to 50 degrees from the axis, with average resolution of 0.234 degrees/pixel, or one-third the average resolution of the central field.

As will be recognized by those skilled in the art, the analog, digital, timing, and other processing and control components described earlier can be applied to the wide field of view-multiresolution imager to produce a very high performance low-light-level imaging system.

Beyond imaging multiple fields of view, the imaging system of the invention provides the ability to image multiple spectral ranges, over a registered field of view, to produce a color image of the scene to user. For example, two CCD imagers can be employed in the imaging system, with each CCD imager imaging a distinct spectral range, e.g., visible and near-infrared ranges, respectively. The two images produced by the CCD imagers are here fused by the digital image processor to produce a full color display image. A suitable example of this fusion functionality is described by Waxman et al. in U.S. Pat. No. 5,555,324, issued Sep. 10, 1996, the entirety of which is hereby incorporated by reference.

As will be recognized by those skilled in the art, three CCD imagers could alternatively be employed to produce a full color image. In this case, each of the three CCD imagers is designated as either the red, green, or blue color channel of the display. Preferably, each of the three channels is controlled to independently accommodate scaling, as is conventionally performed for so-called white balancing of an image. In the invention, selected spectral ranges are directed to the multiple CCD imagers by suitable means such as dichroic beam splitters.

In an alternative scenario, the imaging system employs only one CCD imager that itself images multiple spectral ranges. This is accomplished with any of several configurations provided by the invention. In a first example configuration, the imaging pixel array of the CCD imager is divided into clusters of pixels, with each pixel in a given cluster designated for a given spectral range. This can be accomplished, as is common in the art, using a corresponding spectral filter layered over each pixel. In an example of this configuration, pixels designated for the red spectral range are layered with a filter through which only light of the red spectral range substantially passes; similarly for green- and blue-designated pixels, appropriate filters can be layered over corresponding pixels.

The spectral range of light that is not passed through a given spectral filter is lost to the imager, resulting in lower performance of the imager. An imager configuration provided by the invention that circumvents this limitation employs diffractive elements above each cluster of pixels to direct light of the appropriate spectral range towards corresponding individual pixels in the cluster. Diffractive elements such as those commonly used in the field of binary optics can be employed here to achieve the spectral range directionality.

The foregoing description has been set forth to illustrate the many features and advantages of the invention and is not intended to be limiting. Since modifications of the described embodiments incorporating the spirit and substance of the invention may occur to persons skilled in the art, the scope of the invention should be limited solely with reference to the appended claims and equivalents thereof.

I claim:

1. A charge-coupled imaging device for imaging a wide field-of-view scene to produce a sequence of image frames of the scene at an image frame rate, R, of at least about 25 frames per second, the charge-coupled imaging device comprising:

a short focal length lens for accepting light from the scene to be imaged;

a charge storage medium comprising a charge storage substrate having a front side and a back side, back side having no substantial topology, the charge storage substrate being curved in a selected nonplanar focal surface profile that is concave with respect to the back side of the substrate such that the back side is exposed to light from the scene through the lens, and located a selected distance from the lens with the focal surface facing the lens, the focal surface profile and lens-to-substrate distance selected such that the light accepted by the lens is in focus at the position of the substrate;

a support substrate on which the nonplanar charge storage substrate is supported to maintain the selected surface profile of the charge storage substrate;

an array of pixels defined in the charge storage substrate by pixel interconnections supported on the front side of the substrate, exposure of the substrate to light from the scene through the lens producing charge packets in the pixels, the pixel interconnections providing selective electronic temporal control of transfer of charge packets from one pixel to another in the substrate;

means for suppressing generation of dark current charge packet generation in the substrate pixels; and an output circuit for converting the charge packets in the pixels to an electrical pixel signal of output pixel values based on the light from the scene, a plurality of pixel values together forming an image frame, the output pixel values being produced at a rate corresponding to the image frame rate, R, and being characterized by noise-limited resolution of at least a minimum number, $N_M$, of line pairs per millimeter, referred to the charge-coupled imaging device pixel array, in an image frame configured of the output pixel values, as a function of illuminance of the light from the scene impinging the charge-coupled imaging device pixels, wherein for a scene characterized by a contrast of about 0.3, for a human observation time of about 0.05 seconds, and for an image scene frame rate of about 30 frames per second, $N_M$ is given as $N_M = 1900 L^{0.51}$, where L is the value of illuminance of the input light impinging the charge-coupled imaging device pixels, for at least one illuminance value between a range of illuminance values of about $1 \times 10^{-2}$ LUX and $1 \times 10^{-7}$ LUX.

2. The charge-coupled imaging device of claim 1 wherein the charge storage substrate is concave with respect to the front side of the substrate such that the front side is exposed to light from the scene through the lens.

3. The charge-coupled imaging device of claim 1 wherein the means for suppressing dark current charge packet generation comprises a cooling device in contact with the charge storage substrate.

* * * * *